US012706596B2

(12) United States Patent
Kitamura

(10) Patent No.: US 12,706,596 B2
(45) Date of Patent: Aug. 11, 2026

(54) DATA PROCESSING DEVICE AND DATA PROCESSING METHOD

(71) Applicant: SONY SEMICONDUCTOR SOLUTIONS CORPORATION, Kanagawa (JP)

(72) Inventor: Yasuhiro Kitamura, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 18/877,844

(22) PCT Filed: Jun. 12, 2023

(86) PCT No.: PCT/JP2023/021693

§ 371 (c)(1),
(2) Date: Dec. 20, 2024

(87) PCT Pub. No.: WO2024/004607

PCT Pub. Date: Jan. 4, 2024

(65) Prior Publication Data

US 2025/0392292 A1 Dec. 25, 2025

(30) Foreign Application Priority Data

Jun. 28, 2022 (JP) ................................ 2022-103304

(51) Int. Cl.
*H03K 5/003* (2006.01)
*H03K 17/687* (2006.01)
(Continued)

(52) U.S. Cl.
CPC ......... *H03K 5/003* (2013.01); *H03K 17/6871* (2013.01); *H03K 19/0175* (2013.01); *H04L 25/4917* (2013.01)

(58) Field of Classification Search
CPC ........... H03K 19/017509; H03K 5/003; H03K 17/6871; H03K 19/0175; H04L 25/4917; H04L 25/0264; H03M 1/66; G06F 13/40
See application file for complete search history.

(56) References Cited

U.S. PATENT DOCUMENTS 9,112,550 B1 * 8/2015 Ulrich ............... H04L 25/03343
2011/0156942 A1 * 6/2011 Li ......................... H03M 1/785
341/145
2017/0317675 A1 * 11/2017 Amiri ...................... H04B 3/04

FOREIGN PATENT DOCUMENTS

JP 10-303994 A 11/1998

OTHER PUBLICATIONS

International Search Report and Written Opinion of PCT Application No. PCT/JP2023/021693, issued on Aug. 22, 2023, 10 pages of ISRWO.

* cited by examiner

*Primary Examiner* — Daniel D Chang
(74) *Attorney, Agent, or Firm* — CHIP LAW GROUP

(57) ABSTRACT

The present technology relates to a data processing device and a data processing method capable of outputting appropriate multi-level signals at desired multiple levels in data transmission based on multi-level signals with a simple configuration. A first to M-th drivers to which control signals are input and that output voltages corresponding to the control signals are provided for a transmission line through which a multi-level signal representing transmission data with voltage levels as many as the number of states N is transmitted, in which an integer larger than or equal to 3 and different from a power of 2 is set as the number of states N and a power of a smallest integer that is a power of 2 larger than or equal to N is set as a control value M. The first to M-th drivers include first to M-th output resistors, respec- (Continued)

tively, and in a case where any integer larger than or equal to 1 and smaller than or equal to M is denoted by m, a resistance value of an m-th output resistor in which m is smaller than or equal to M−1 is a value obtained by dividing a predetermined resistance value by 2 raised to a power of (m−1), and a resistance value of an M-th output resistor in which m is M is a value obtained by dividing the predetermined resistance value by a value obtained by subtracting 2 raised to a power of (M−1) from N.

15 Claims, 47 Drawing Sheets

(51) Int. Cl.

| | |
|---|---|
| ***H03K 19/0175*** | (2006.01) |
| ***H04L 25/49*** | (2006.01) |

11-1

$V_H$ $D_{M-1}$ $R_{M-1}$ cont(M-1) $V_{OUT}$ $D_{M-2}$ $R_{M-2}$ cont(M-2)

| NUMBER OF STATES N | $R_4/R_{term}$ | $R_3/R_{term}$ | $R_2/R_{term}$ | $R_1/R_{term}$ | $R_0/R_{term}$ |
|---|---|---|---|---|---|
| 2 | | | | | 1 |
| 3 | | | | 2 | 2 |
| 4 | | | | 1.5 | 3 |
| 5 | | | 4 | 2 | 4 |
| 6 | | | 2.5 | 2.5 | 5 |
| 7 | | | 2 | 3 | 6 |
| 8 | | | 1.75 | 3.5 | 7 |
| 9 | | 8 | 2 | 4 | 8 |
| 10 | | 4.5 | 2.25 | 4.5 | 9 |
| 11 | | 3.33 | 2.5 | 5 | 10 |
| 12 | | 2.75 | 2.75 | 5.5 | 11 |
| 13 | | 2.4 | 3 | 6 | 12 |
| 14 | | 2.167 | 3.25 | 6.5 | 13 |
| 15 | | 2 | 3.5 | 7 | 14 |
| 16 | | 1.875 | 3.75 | 7.5 | 15 |
| 17 | 16 | 2 | 4 | 8 | 16 |
| 18 | 8.5 | 2.125 | 4.25 | 8.5 | 17 |
| 19 | 6 | 2.25 | 4.5 | 9 | 18 |
| 20 | 4.75 | 2.375 | 4.75 | 9.5 | 19 |
| 21 | 4 | 2.5 | 5 | 10 | 20 |
| 22 | 3.5 | 2.625 | 5.25 | 10.5 | 21 |
| 23 | 3.143 | 2.75 | 5.5 | 11 | 22 |
| 24 | 2.875 | 2.875 | 5.75 | 11.5 | 23 |
| 25 | 2.667 | 3 | 6 | 12 | 24 |
| 26 | 2.5 | 3.125 | 6.25 | 12.5 | 25 |
| 27 | 2.364 | 3.25 | 6.5 | 13 | 26 |
| 28 | 2.25 | 3.375 | 6.75 | 13.5 | 27 |
| 29 | 2.154 | 3.5 | 7 | 14 | 28 |
| 30 | 2.071 | 3.625 | 7.25 | 14.5 | 29 |
| 31 | 2 | 3.75 | 7.5 | 15 | 30 |
| 32 | 1.9375 | 3.875 | 7.75 | 15.5 | 31 |

| | $R_2/R_{term}$ | $R_1/R_{term}$ | $R_0/R_{term}$ | | |
|---|---|---|---|---|---|
| | 2 | 3 | 6 | | |
| # | cont (2) | cont (1) | cont (0) | (Vn−VL) /(VH−VL) | REMARKS |
| 0 | 0 | 0 | 0 | 0.000 | V0=VL |
| 1 | 0 | 0 | 1 | 0.167 | V1 |
| 2 | 0 | 1 | 0 | 0.333 | V2 |
| 3 | 0 | 1 | 1 | 0.500 | V3 |
| 4 | 1 | 0 | 0 | 0.500 | V3 (OVERLAP) |
| 5 | 1 | 0 | 1 | 0.667 | V4 |
| 6 | 1 | 1 | 0 | 0.833 | V5 |
| 7 | 1 | 1 | 1 | 1.000 | V6=VH |

FIG. 8

| | $R_4/R_{term}$ | $R_3/R_{term}$ | $R_2/R_{term}$ | $R_1/R_{term}$ | $R_0/R_{term}$ | | |
|---|---|---|---|---|---|---|---|
| | 2.364(=26/11) | 3.25 | 6.5 | 13 | 26 | | |
| # | cont(4) | cont(3) | cont(2) | cont(1) | cont(0) | (Vn−VL)/(VH−VL) | REMARKS |
| 0 | 0 | 0 | 0 | 0 | 0 | 0.000 | V0=VL |
| 1 | 0 | 0 | 0 | 0 | 1 | 0.038 | V1 |
| 2 | 0 | 0 | 0 | 1 | 0 | 0.077 | V2 |
| 3 | 0 | 0 | 0 | 1 | 1 | 0.115 | V3 |
| 4 | 0 | 0 | 1 | 0 | 0 | 0.154 | V4 |
| 5 | 0 | 0 | 1 | 0 | 1 | 0.192 | V5 |
| 6 | 0 | 0 | 1 | 1 | 0 | 0.231 | V6 |
| 7 | 0 | 0 | 1 | 1 | 1 | 0.269 | V7 |
| 8 | 0 | 1 | 0 | 0 | 0 | 0.308 | V8 |
| 9 | 0 | 1 | 0 | 0 | 1 | 0.346 | V9 |
| 10 | 0 | 1 | 0 | 1 | 0 | 0.385 | V10 |
| 11 | 0 | 1 | 0 | 1 | 1 | 0.423 | V11 |
| 12 | 0 | 1 | 1 | 0 | 0 | 0.462 | V12 |
| 13 | 0 | 1 | 1 | 0 | 1 | 0.500 | V13 |
| 14 | 0 | 1 | 1 | 1 | 0 | 0.538 | V14 |
| 15 | 0 | 1 | 1 | 1 | 1 | 0.577 | V15 |
| 16 | 1 | 0 | 0 | 0 | 0 | 0.423 | V11 (OVERLAP) |
| 17 | 1 | 0 | 0 | 0 | 1 | 0.462 | V12 (OVERLAP) |
| 18 | 1 | 0 | 0 | 1 | 0 | 0.500 | V13 (OVERLAP) |
| 19 | 1 | 0 | 0 | 1 | 1 | 0.538 | V14 (OVERLAP) |
| 20 | 1 | 0 | 1 | 0 | 0 | 0.577 | V15 (OVERLAP) |
| 21 | 1 | 0 | 1 | 0 | 1 | 0.615 | V16 |
| 22 | 1 | 0 | 1 | 1 | 0 | 0.654 | V17 |
| 23 | 1 | 0 | 1 | 1 | 1 | 0.692 | V18 |
| 24 | 1 | 1 | 0 | 0 | 0 | 0.731 | V19 |
| 25 | 1 | 1 | 0 | 0 | 1 | 0.769 | V20 |
| 26 | 1 | 1 | 0 | 1 | 0 | 0.808 | V21 |
| 27 | 1 | 1 | 0 | 1 | 1 | 0.846 | V22 |
| 28 | 1 | 1 | 1 | 0 | 0 | 0.885 | V23 |
| 29 | 1 | 1 | 1 | 0 | 1 | 0.923 | V24 |
| 30 | 1 | 1 | 1 | 1 | 0 | 0.962 | V25 |
| 31 | 1 | 1 | 1 | 1 | 1 | 1.000 | V26=VH |

11-1
CONSTANT VOLTAGE GENERATION CIRCUIT
33
$V_H$
31-2
cont(2)
$2R_{term}$
$V_{OUT}$
HIGH-SPEED SIGNAL OUTPUT TERMINAL P
41
31-1
High Speed Control Logic
32
cont(1)
$3R_{term}$
41
31-0
cont(0)
$6R_{term}$
41
$V_L$
GND TERMINAL
51-2
$\overline{cont(2)}$
$2R_{term}$
$\overline{V_{OUT}}$
HIGH-SPEED SIGNAL OUTPUT TERMINAL N
41
51-1
$\overline{cont(1)}$
$3R_{term}$
41
51-0
$\overline{cont(0)}$
$6R_{term}$
41
$V_L$
GND TERMINAL RX
(RECEIVER SIDE)
TX
(TRANSMITTER SIDE)
TRANSMISSION PATH
Decoder
92
12A
12B
12C
12
DIFFERENTIAL
MULTI-LEVEL Sampler
DIFFERENTIAL
MULTI-LEVEL Sampler
DIFFERENTIAL
MULTI-LEVEL Sampler
13
13A
13B
13C
11
11A
11B
11C
MULTI-LEVEL TRANSMITTER
MULTI-LEVEL TRANSMITTER
MULTI-LEVEL TRANSMITTER
Encoder
91

FIG. 22

| Item | COMPARATIVE TECHNOLOGY 1 | COMPARATIVE TECHNOLOGY 2 (CASE WHERE ANY MULTIPLE LEVELS ARE OUTPUT) | PRESENT TECHNOLOGY |
|---|---|---|---|
| METHOD FOR ACHIEVING MULTI-LEVEL OUTPUT | ACHIEVEMENT OF MULTI-LEVEL OUTPUT BASED ON SELECTION OF N POWER SUPPLIES | ACHIEVES "N≤2^M" VOLTAGE LEVELS THROUGH TWO-POWER-SUPPLY M CONTROL | ACHIEVES "N≤2^M" VOLTAGE LEVELS THROUGH TWO-POWER-SUPPLY M CONTROL |
| REPRESENTABLE NUMBER OF LEVELS | N | N | N |
| NUMBER OF REFERENCE VOLTAGE SOURCES | N | 2 (ONLY VH AND VL) | 2 (ONLY VH AND VL) |
| NUMBER OF HIGH-SPEED CONTROL SIGNALS | N | M = ROUNDING UP (log2 N) | M = ROUNDING UP (log2 N) |
| MACRO AREA | × PLURALITY OF VOLTAGE GENERATORS (IDO) IS REQUIRED | ○ | ○ |
| OUTPUT VOLTAGE RANGE (Max - min) | ○ (VN-V0) | × (VH-VL)*(N/2^M) | ○ (VH-VL) |
| DC POWER | ○ | × WITH DC POWER Loss | ○ |
| AC POWER | × MANY CONTROL SIGNALS | ○ | ○ |
| HIGH-SPEED SIGNAL PROPERTY | × MANY CONTROL SIGNALS | ○ | ○ |
| COMBINABILITY (AREA) | ○ | × | ○ |

| # | cont (2) | cont (1) | cont (0) | (Vn−VL) /(VH−VL) | REMARKS |
|---|---|---|---|---|---|
| 0 | 0 | 0 | 0 | 0.000 | V0 |
| 1 | 0 | 0 | 1 | 0.143 | V1 |
| 2 | 0 | 1 | 0 | 0.286 | V2 |
| 3 | 0 | 1 | 1 | 0.429 | V3 |
| 4 | 1 | 0 | 0 | 0.571 | V4 |
| 5 | 1 | 0 | 1 | 0.714 | V5 |
| 6 | 1 | 1 | 0 | 0.857 | V6 |
| 7 | 1 | 1 | 1 | 1.000 | NOT USED |

FIG. 29

| Mode <1:0> | cont (2) | cont (1) | cont (0) | VOUT | |
|---|---|---|---|---|---|
| 3 | 0 | 0 | 0 | 0 | |
| | 0 | 0 | 1 | 1/6*VREG | |
| | 0 | 1 | 0 | 2/6*VREG | |
| | 0 | 1 | 1 | 3/6*VREG | OVERLAP |
| | 1 | 0 | 0 | 3/6*VREG | OVERLAP |
| | 1 | 0 | 1 | 4/6*VREG | |
| | 1 | 1 | 0 | 5/6*VREG | |
| | 1 | 1 | 1 | VREG | |

FIG. 30

| Mode <1:0> | cont (2) | cont (1) | cont (0) | VOUT | |
|---|---|---|---|---|---|
| 1 | 0 | 0 | any | 0 | |
| | 0 | 1 | | 1/2*VREG | OVERLAP |
| | 1 | 0 | | 1/2*VREG | OVERLAP |
| | 1 | 1 | | VREG | |

FIG. 31

| Mode <1:0> | cont (2) | cont (1) | cont (0) | VOUT |
|---|---|---|---|---|
| 0 | 0 | any | any | 0 |
| | 1 | | | VREG |

| | MODE<1> | MODE<0> | L0,L1,L2 | L3,L4 | L5 | NUMBER OF OUTPUT LEVELS | REMARKS |
|---|---|---|---|---|---|---|---|
| CASE1 | 0 | 0 | cont(2) | cont(1) | cont(0) | 7 level | |
| CASE2 | 0 | 1 | cont(2) | cont(1) | cont(2) | 4 level | cont(0) NOT USED |
| CASE3 | 1 | 0 | cont(2) | cont(0) | cont(0) | 3 level | cont(1) NOT USED |
| CASE4 | 1 | 1 | cont(2) | cont(2) | cont(2) | 2 level | cont(1) AND cont(0) NOT USED |

FIG. 36

| MODE<1> | MODE<0> | L0,L1,L2 | L3,L4 | L5 | NUMBER OF OUTPUT LEVELS | REMARKS |
|---|---|---|---|---|---|---|
| 0 | 0 | cont(2) | cont(1) | cont(0) | 7 level | |

| # | cont (2) | cont (1) | cont (0) | (Vn−VL) /(VH−VL) | REMARKS |
|---|---|---|---|---|---|
| 0 | 0 | 0 | 0 | 0.000 | V0=VL |
| 1 | 0 | 0 | 1 | 0.167 | V1 |
| 2 | 0 | 1 | 0 | 0.333 | V2 |
| 3 | 0 | 1 | 1 | 0.500 | V3 |
| 4 | 1 | 0 | 0 | 0.500 | V3 (OVERLAP) |
| 5 | 1 | 0 | 1 | 0.667 | V4 |
| 6 | 1 | 1 | 0 | 0.833 | V5 |
| 7 | 1 | 1 | 1 | 1.000 | V6=VH |

FIG. 40

| MODE<1> | MODE<0> | L0,L1,L2 | L3,L4 | L5 | NUMBER OF OUTPUT LEVELS | REMARKS |
|---|---|---|---|---|---|---|
| 0 | 1 | cont(2) | cont(1) | cont(2) | 4 level | cont(0) NOT USED |

| # | cont (2) | cont (1) | cont (0) | (Vn−VL) /(VH−VL) | REMARKS |
|---|---|---|---|---|---|
| 0 | 0 | 0 | unuse | 0.000 | V0=VL |
| 1 | 0 | 1 | | 0.333 | V2 |
| 2 | 1 | 0 | | 0.667 | V4 |
| 3 | 1 | 1 | | 1.000 | V6=VH |

FIG. 44

| MODE<1> | MODE<0> | L0,L1,L2 | L3,L4 | L5 | NUMBER OF OUTPUT LEVELS | REMARKS |
|---|---|---|---|---|---|---|
| 1 | 0 | cont(2) | cont(0) | cont(0) | 3 level | cont(1) NOT USED |

| # | cont (2) | cont (1) | cont (0) | (Vn−VL) /(VH−VL) | REMARKS |
|---|---|---|---|---|---|
| 0 | 0 | unuse | 0 | 0.000 | V0=VL |
| 1 | 0 | | 1 | 0.500 | V3 |
| 2 | 1 | | 0 | 0.500 | V3 (OVERLAP) |
| 3 | 1 | | 1 | 1.000 | V6=VH |

FIG. 48

| MODE<1> | MODE<0> | L0,L1,L2 | L3,L4 | L5 | NUMBER OF OUTPUT LEVELS | REMARKS |
|---|---|---|---|---|---|---|
| 1 | 1 | cont(2) | cont(2) | cont(2) | 2 level | cont(1) AND cont(0) NOT USED |

| # | cont (2) | cont (1) | cont (0) | (Vn-VL) /(VH-VL) | REMARKS |
|---|---|---|---|---|---|
| 0 | 0 | unuse | unuse | 0.000 | V0=VL |
| 1 | 1 | | | 1.000 | V6=VH |

| # | cont (1) | cont (2) | cont (0) | (Vn−VL) /(VH−VL) | REMARKS |
|---|---|---|---|---|---|
| 0 | 0 | 0 | 0 | 0.000 | V0 |
| 1 | 0 | 0 | 1 | 0.250 | V1 |
| 2 | 0 | 1 | 0 | 0.500 | V2 |
| 3 | 0 | 1 | 1 | 0.750 | V3 |
| 4 | 1 | 0 | 0 | 0.250 | V1 OVERLAP |
| 5 | 1 | 0 | 1 | 0.500 | V2 OVERLAP |
| 6 | 1 | 1 | 0 | 0.750 | V3 OVERLAP |
| 7 | 1 | 1 | 1 | 1.000 | V4 |

| # | cont (2) | cont (1) | cont (0) | (Vn-VL) /(VH-VL) | REMARKS |
|---|---|---|---|---|---|
| 0 | 0 | 0 | 0 | 0.000 | V0 |
| 1 | 0 | 0 | 1 | 0.143 | V1 |
| 2 | 0 | 1 | 0 | 0.286 | V2 |
| 3 | 0 | 1 | 1 | 0.429 | V3 |
| 4 | 1 | 0 | 0 | 0.571 | V4 |
| 5 | 1 | 0 | 1 | 0.714 | NOT USED |
| 6 | 1 | 1 | 0 | 0.857 | NOT USED |
| 7 | 1 | 1 | 1 | 1.000 | NOT USED |

Figure 56:
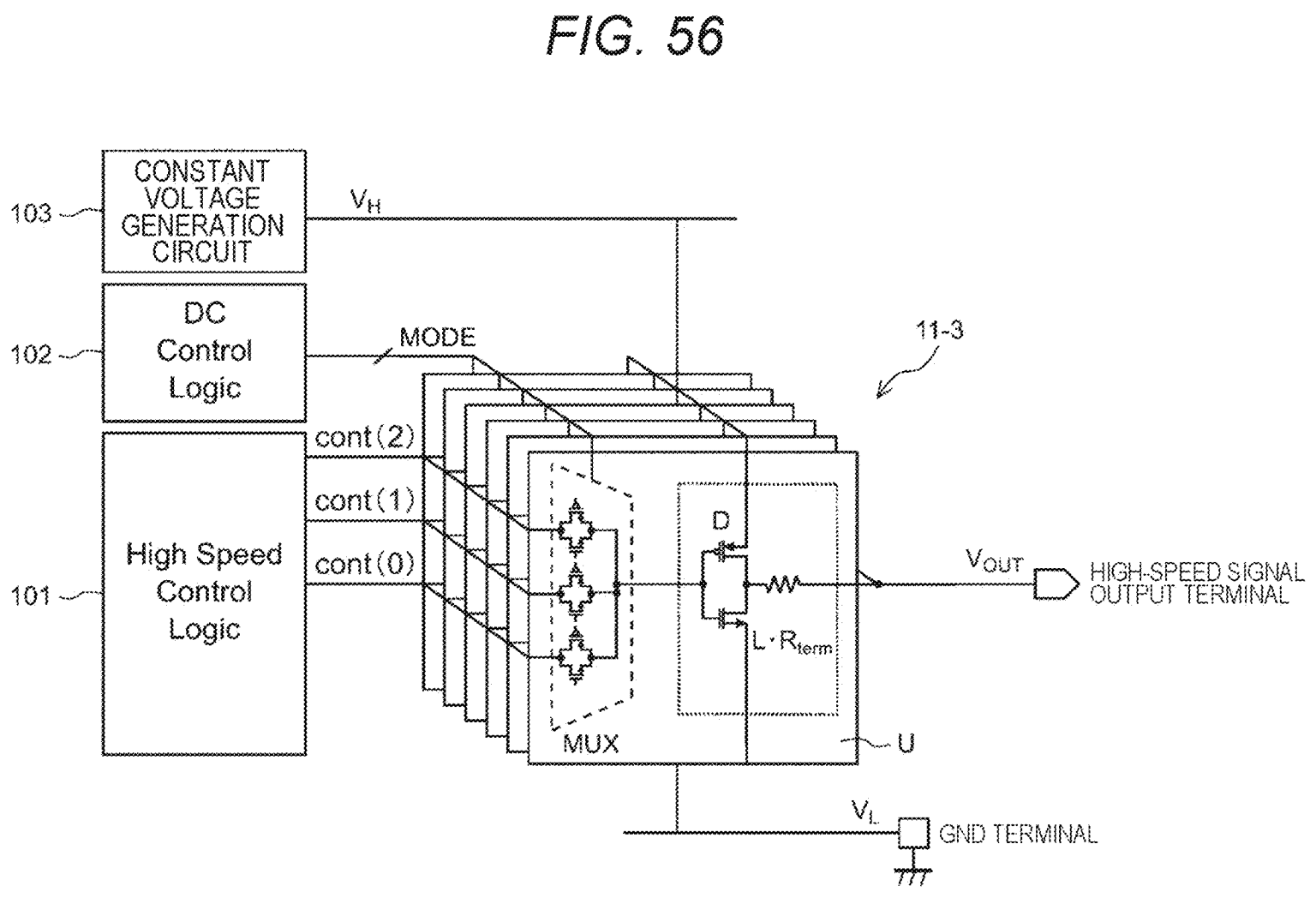

CONSTANT VOLTAGE GENERATION CIRCUIT

DC Control Logic

High Speed Control Logic

103

102

101

$V_H$

MODE cont (2)

cont (1)

cont (0)

MUX

D $L \cdot R_{term}$

U $V_{OUT}$

HIGH-SPEED SIGNAL OUTPUT TERMINAL $V_L$

GND TERMINAL

Figure 57:
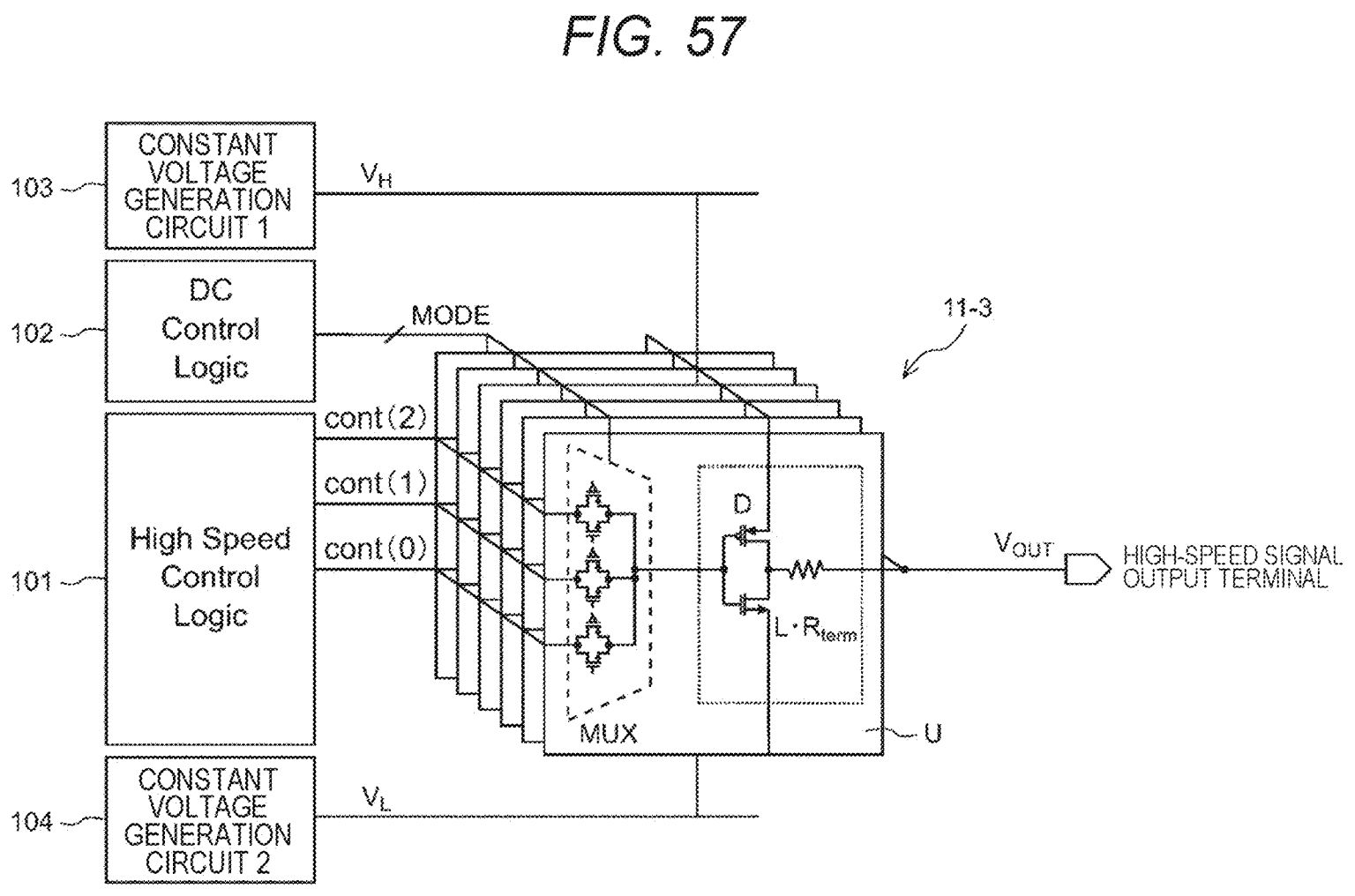

CONSTANT VOLTAGE GENERATION CIRCUIT 1 — 103

DC Control Logic — 102

High Speed Control Logic — 101

CONSTANT VOLTAGE GENERATION CIRCUIT 2 — 104

$V_H$

MODE cont (2)

cont (1)

cont (0)

$V_L$

MUX

D $L \cdot R_{term}$

U $V_{OUT}$

HIGH-SPEED SIGNAL OUTPUT TERMINAL

FIG. 58

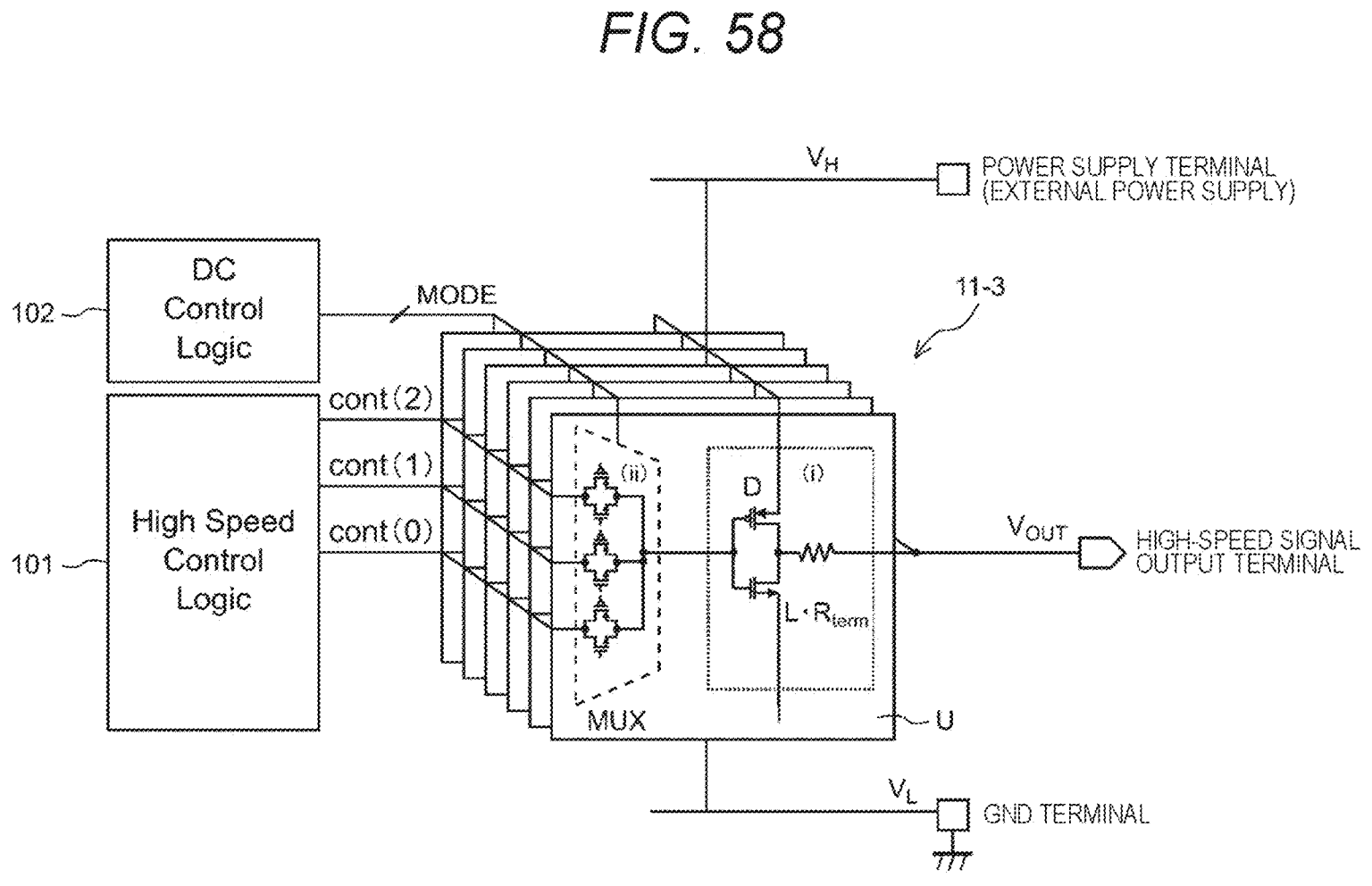

POWER SUPPLY TERMINAL (EXTERNAL POWER SUPPLY)

HIGH-SPEED SIGNAL OUTPUT TERMINAL $V_{OUT}$ 11-3

GND TERMINAL $V_H$

U $V_L$ (i)

$L \cdot R_{term}$

D (ii)

MUX

MODE cont (2)

cont (1)

cont (0)

DC Control Logic

High Speed Control Logic

102

101

DATA PROCESSING DEVICE AND DATA PROCESSING METHOD

CROSS REFERENCE TO RELATED APPLICATIONS

This application is a U.S. National Phase of International Patent Application No. PCT/JP2023/021693 filed on Jun. 12, 2023, which claims priority benefit of Japanese Patent Application No. JP 2022-103304 filed in the Japan Patent Office on Jun. 28, 2022. Each of the above-referenced applications is hereby incorporated herein by reference in its entirety.

TECHNICAL FIELD

The present technology relates to a data processing device and a data processing method, and more particularly, to a data processing device and a data processing method capable of outputting appropriate multi-level signals at desired multiple levels in data transmission based on multi-level signals with a simple configuration.

BACKGROUND ART

Patent Documents 1 to 4 disclose techniques for achieving single-phase N-level output drivers.

CITATION LIST

Patent Document

Patent Document 1: JP 05-336174 A
Patent Document 2: WO 2011/045830 A
Patent Document 3: JP 10-303994 A
Patent Document 4: JP 11-154859 A

SUMMARY OF THE INVENTION

Problems to be Solved by the Invention

Improvement of transmission speed based on multi-leveling has been proposed, and it is desired to output appropriate multi-level signals at desired multiple levels with a simple configuration.

The present technology has been made in view of such circumstances, and enables appropriate multi-level signals at desired multiple levels to be output with a simple configuration.

Solutions to Problems

A data processing device according to a first aspect of the present technology includes a plurality of drivers that each includes a driver input terminal to which a control signal is input and a driver output terminal which outputs a voltage corresponding to the control signal input from the driver input terminal and that each outputs a high voltage or a low voltage in correspondence with the control signal in a case where the corresponding driver output terminal is in an open state, the plurality of drivers being first to M-th drivers, in which an integer larger than or equal to 3 and different from a power of 2 is a number of states N, a power of a smallest integer that is a power of 2 larger than or equal to N is a control value M, and the driver output terminals are connected in parallel to a transmission line through which a multi-level signal representing transmission data with voltage levels as many as the number of states N is transmitted as a signal to be transmitted. The first to M-th drivers include first to M-th output resistors, respectively, and in a case where any integer larger than or equal to 1 and smaller than or equal to M is denoted by m, a resistance value of an m-th output resistor in which m is smaller than or equal to M−1 is a value obtained by dividing a predetermined resistance value by 2 raised to a power of (m−1), and a resistance value of an M-th output resistor in which m is M is a value obtained by dividing the predetermined resistance value by a value obtained by subtracting 2 raised to a power of (M−1) from N.

In the data processing device according to the first aspect of the present technology, there is provided a plurality of drivers that each includes a driver input terminal to which a control signal is input and a driver output terminal which outputs a voltage corresponding to the control signal input from the driver input terminal and that each outputs a high voltage or a low voltage in correspondence with the control signal in a case where the corresponding driver output terminal is in an open state, the plurality of drivers being first to M-th drivers, in which an integer larger than or equal to 3 and different from a power of 2 is a number of states N, a power of a smallest integer that is a power of 2 larger than or equal to N is a control value M, and the driver output terminals are connected in parallel to a transmission line through which a multi-level signal representing transmission data with voltage levels as many as the number of states N is transmitted as a signal to be transmitted. The first to M-th drivers include first to M-th output resistors, respectively, and in a case where any integer larger than or equal to 1 and smaller than or equal to M is denoted by m, a resistance value of an m-th output resistor in which m is smaller than or equal to M−1 is a value obtained by dividing a predetermined resistance value by 2 raised to a power of (m−1), and a resistance value of an M-th output resistor in which m is M is a value obtained by dividing the predetermined resistance value by a value obtained by subtracting 2 raised to a power of (M−1) from N.

A data processing device according to a second aspect of the present technology includes a plurality of drivers that each includes a driver input terminal to which a control signal is input and a driver output terminal which outputs a voltage corresponding to the control signal input from the driver input terminal and that each outputs a high voltage or a low voltage in correspondence with the control signal in a case where the corresponding driver output terminal is in an open state, the plurality of drivers being first to M-th drivers, in which an integer larger than or equal to 3 is a number of states N, a power of a smallest integer that is a power of 2 larger than or equal to N is a control value M, and the driver output terminals are connected in parallel to a transmission line through which a multi-level signal representing transmission data with voltage levels as many as the number of states N is transmitted as a signal to be transmitted, and a selection circuit that selects, from among a plurality of the control signals, a control signal to be input to the driver input terminal of each of the first to M-th drivers. The selection circuit changes a number of voltage levels of the multi-level signal to a value different from the number of states N by changing the control signal input to each of the first to M-th drivers.

A data processing method according to the second aspect of the present technology is a data processing method used by a data processing device including a plurality of drivers that each includes a driver input terminal to which a control signal is input and a driver output terminal which outputs a voltage corresponding to the control signal input from the driver input terminal and that each outputs a high voltage or a low voltage in correspondence with the control signal in a case where the corresponding driver output terminal is in an open state, the plurality of drivers being first to M-th drivers, in which an integer larger than or equal to 3 is a number of states N, a power of a smallest integer that is a power of 2 larger than or equal to N is a control value M, and the driver output terminals are connected in parallel to a transmission line through which a multi-level signal representing transmission data with voltage levels as many as the number of states N is transmitted as a signal to be transmitted, and a selection circuit that selects, from among a plurality of the control signals, a control signal to be input to the driver input terminal of each of the first to M-th drivers. The data processing method includes changing, using the selection circuit, a number of voltage levels of the multi-level signal to a value different from the number of states N by changing the control signal input to each of the first to M-th drivers.

In the data processing device and the data processing method according to the second aspect of the present technology, there are provided a plurality of drivers that each includes a driver input terminal to which a control signal is input and a driver output terminal which outputs a voltage corresponding to the control signal input from the driver input terminal and that each outputs a high voltage or a low voltage in correspondence with the control signal in a case where the corresponding driver output terminal is in an open state, the plurality of drivers being first to M-th drivers, in which an integer larger than or equal to 3 is a number of states N, a power of a smallest integer that is a power of 2 larger than or equal to N is a control value M, and the driver output terminals are connected in parallel to a transmission line through which a multi-level signal representing transmission data with voltage levels as many as the number of states N is transmitted as a signal to be transmitted, and a selection circuit that selects, from among a plurality of the control signals, a control signal to be input to the driver input terminal of each of the first to M-th drivers. The selection circuit changes a number of voltage levels of the multi-level signal to a value different from the number of states N by changing the control signal input to each of the first to M-th drivers.

BRIEF DESCRIPTION OF DRAWINGS

FIG. 3 is a table illustrating the number of states applied to the transmitter and resistance values of output resistors.

FIG. 8 is a diagram illustrating operation of the transmitter in FIG. 7.

FIG. 22 is a list illustrating a result of comparison between a transmitter to which the present technology is applied and comparative technologies 1 and 2.

FIG. 29 is a diagram illustrating operation of the transmitter in the second mode in FIG. 28.

FIG. 30 is another diagram illustrating the operation of the transmitter in the second mode in FIG. 28.

FIG. 31 is another diagram illustrating the operation of the transmitter in the second mode in FIG. 28.

FIG. 33 is a configuration diagram illustrating a first example of configuration of the transmitter in FIG. 32.

FIG. 34 is a table illustrating relationships between a mode value corresponding to the number of states N and a control signal output from a multiplexer MUX of each unit.

FIG. 36 is a diagram used to describe case 1 in FIG. 34.

FIG. 40 is a diagram used to describe case 2 in FIG. 34.

FIG. 44 is a diagram used to describe case 3 in FIG. 34.

FIG. 48 is a diagram used to describe case 4 in FIG. 34.

FIG. 56 is a configuration diagram illustrating a first example of the transmitter in FIG. 32.

FIG. 57 is a configuration diagram illustrating a second example of the transmitter in FIG. 32.

FIG. 58 is a configuration diagram illustrating a third example of the transmitter in FIG. 32.

MODE FOR CARRYING OUT THE INVENTION

An embodiment (present embodiment) of the present technology will be described hereinafter with reference to the drawings.

<<Data Transmission System 1 According to Present Embodiment>>

Figures 1, 2:
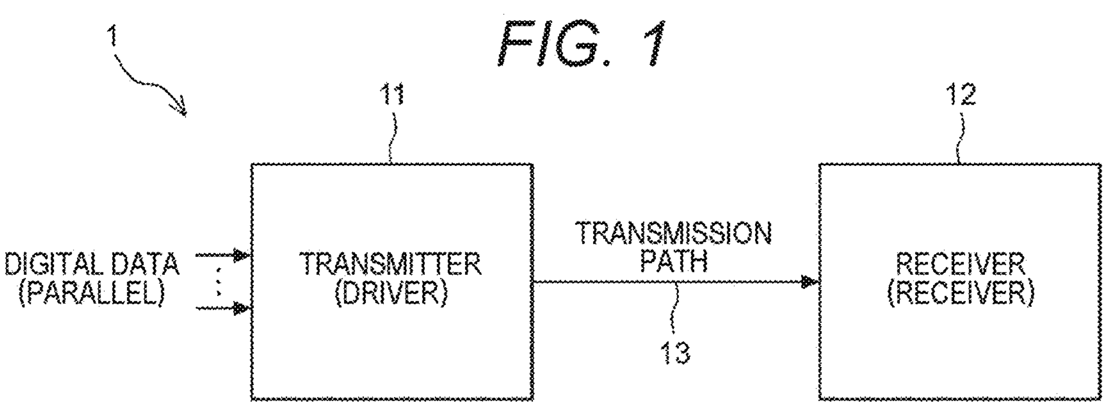
FIG. 1 is a block diagram illustrating an example of configuration of a data transmission system according to an embodiment to which the present technology is applied.
FIG. 2 is a diagram illustrating an example of configuration of a first mode of a transmitter in FIG. 1.

FIG. 1 is a block diagram illustrating an example of configuration of a data transmission system according to an embodiment to which the present technology is applied. In FIG. 1, a data transmission system 1 includes a transmitter 11, a receiver 12, and a transmission path 13. The transmitter 11 generates a transmission signal (also referred to as a multi-level signal or a signal to be transmitted) of voltage levels (multiple levels) corresponding to N (N is a natural number smaller than or equal to 2M) values on the basis of M-bit (M is a natural number) digital data (control signal) input in parallel, and transmits the transmission signal to the receiver 12 via the single-line transmission path 13 (transmission line) connected to an output terminal.

The receiver 12 receives the transmission signal (multi-level signal) transmitted from the transmitter 11 via the transmission path 13, and detects which of the N multiple levels the voltage level of the received multi-level signal is. Note that the number of multiple levels (the number of levels) N of a multi-level signal transmitted by the transmitter 11 will also be referred to as the number of states. Furthermore, the data transmission system 1 to which the present technology is applied is effective in a case where digital data of a plurality of types or digital data having a large number of digits (bit depth) is converted into serial data and transmitted at high speed, a case where the bit depth of transmission data to be simultaneously transmitted is reduced, and the like. The M-bit digital data input to the transmitter 11 may be a combination of a plurality of types of data, or may be partial data obtained by dividing data represented by a plurality of bits. Note that in order to increase communication speed, it is necessary to increase the number of transitions per unit time (bits/sec), but there is a manufacturing limit. By employing multi-leveling of the transmission signal, therefore, the amount of data per transition can be increased, and faster data communication can be achieved. In particular, encoding of the number of multiple levels (the number of states) other than a power of 2 is generally inefficient as bit efficiency in single-phase communication (for example, bit efficiency is higher in a case where eight values are output than in a case where seven values are output using three bits). In a communication standard where special encoding is performed in three-line communication or the like, there is a case where an output of the number of multiple levels different from a power of 2 is required due to a requirement of characteristics related to electrical specifications and high-speed signal quality other than bit efficiency, and the present technology is especially effective in such a case. As the transmission path 13, wiring in a printed circuit board (PCB), a package of each chip, a connector, a cable, or the like can be assumed.

<<First Mode of Transmitter 11>>

FIG. 2 is a diagram illustrating an example of configuration of a first mode of the transmitter 11 in FIG. 1. In FIG. 2, a transmitter 11-1 is the first mode of the transmitter 11 in FIG. 1, and includes drivers $D_0$ to $D_{M-1}$ and output resistors $R_0$ to $R_{M-1}$. Control signals cont(0) to cont(M−1) are input to the drivers $D_0$ to $D_{M-1}$, respectively. Furthermore, a low voltage $V_L$ and a high voltage $V_H$ ($>V_L$) are applied to each of the drivers $D_0$ to $D_{M-1}$. The low voltage $V_L$ is, for example, a ground potential (GND potential), and the high voltage $V_H$ is a constant voltage generated by a constant voltage generation circuit, but the low voltage $V_L$ and the high voltage $V_H$ are not limited to these. The control signals cont(0) to cont(M−1) correspond to data of 0 to M−1 (a first to M-th digits, that is, a units digit to a $2^{M-1}$ digit) bits in the M-bit digital data input to the transmitter 11 in FIG. 1, respectively. For example, each of the control signals cont (0) to cont(M−1) is a binary signal indicating whether a corresponding bit is 0 or 1, and indicates 0 or 1 depending on whether voltage of the control signal is at a high level or a low level. It is assumed in the following description that the control signals cont(0) to cont(M−1) each input a value of 0 or 1 to the drivers $D_0$ to $D_{M-1}$ without specifying whether the control signal indicates 0 or 1 in a case where the voltage of the control signal is at the high level or the low level. Furthermore, the control signals cont(0) to cont(M−1), which are the M-bit digital data, are not necessarily transmission data (data to be transmitted) themselves, and may be signals for controlling outputs of the drivers $D_0$ to $D_{M-1}$ in order to transmit transmission data from the transmitter 11-1 as a multi-level signal. The drivers $D_0$ to $D_{M-1}$ are M ideal voltage drivers. The drivers $D_0$ to $D_{M-1}$ output the low voltage $V_L$ in a case where the values of the control signals cont(0) to cont(M− 1) input thereto are 0, and output the high voltage $V_H$ in a case where the values are 1. The output resistors $R_0$ to $R_{M-1}$ are M resistors connected between output terminals of the drivers $D_0$ to $D_{M-1}$ and an output terminal $V_{OUT}$ (transmission line) as the transmitter 11-1. Note that a sign of the output terminal $V_{OUT}$ is also used as a parameter indicating an output voltage output from the output terminal. Furthermore, the drivers $D_0$ to $D_{M-1}$ and the output resistors $R_0$ to $R_{M-1}$ connected thereto may be regarded as an equivalent circuit in which actual drivers are represented by ideal voltage drivers and output resistors, and configuration of the actual drivers need not be separable into drivers and output resistors. In a case where m is any value among 0 to M−1, therefore, a driver $D_m$ and an output resistor $R_m$ represent one driver, and an output terminal (driver output terminal) of the driver is connected to the output terminal $V_{OUT}$(transmission line). The driver may be regarded as a driver that outputs the low voltage $V_L$ or the high voltage $V_H$ from a driver output terminal in a case where the driver output terminal is open (in a case where it is assumed that no voltage drop has occurred in the output resistor). All of following embodiments will be described while assuming a configuration in which a driver and an output resistor thereof are separably connected to each other as in FIG. 2, the driver and the output resistor thereof need not be separable in any case, and the driver and the output resistor thereof may be regarded as constituting one driver.

Resistance values of the output resistors $R_0$ to $R_{M-1}$ satisfy a condition of the following Expression (1). Signs of the output resistors $R_0$ to $R_{M-1}$ are used as parameters indicating the resistance values, and in the following Expression (1), m of the resistance value $R_m$ is any value among 0 to M−1.

[Math. 1]

$$R_m = \begin{cases} R_{term} \cdot \dfrac{N-1}{N-2^{M-1}} & (m = M-1) \\ R_{term} \cdot \dfrac{N-1}{2^m} & (m = 0, 1, \cdots, M-2) \end{cases} \quad (1)$$

Note that M will also be referred to as a control value, and m will also be referred to as a control number hereinafter. The control value M corresponds to the number of control signals for controlling the driver. The control number m is used as a number for specifying one control signal, a number for specifying a driver to be controlled by the specified control signal, and a number for specifying an output resistor connected to the specified driver. N is the number of multiple levels (voltage levels) of a multi-level signal, which is a transmission signal output by the transmitter 11-1 from the output terminal $V_{OUT}$. N will also be referred to as the number of states hereinafter. The number of states N of the multi-level signal output from the transmitter 11 will also be referred to as the number of states N of the transmitter 11 or simply as the number of states N.

Here, a resistance value $R_{term}$ indicates a resistance value $R_{os}$ in a case where all the output resistors $R_0$ to $R_{M-1}$ are connected in parallel with one another according to the following Expression (2).

[Math. 2]

$$\frac{1}{R_{OS}} = \sum_{m=0}^{M-1} \frac{1}{R_m} = \frac{1}{R_{term}} \cdot \left\{ \left( \sum_{m=0}^{M-1} \frac{1}{R_{term}} \right) + \frac{N-2^{M-1}}{N-1} \right\} \quad (2)$$

-continued $$= \frac{1}{R_{term}} \cdot \left\{ \left( \frac{2^{M-1}-1}{N-1} \right) + \frac{N-2^{M-1}}{N-1} \right\}$$
$$= \frac{1}{R_{term}}$$

Furthermore, an output voltage $V_n$, which is a voltage level output as the multi-level signal by the transmitter 11-1 is expressed by the following Expression (3). Note that n denotes each of numbers 0 to N−1 assigned to voltage levels of the N levels in ascending order. n will also be referred to as a state number hereinafter.

[Math. 3]

$$V_n = \frac{n}{N-1}(V_H - V_L) + V_L \quad (n = 0, 1, \cdots, N-1) \quad (3)$$

According to this, the transmitter 11-1 outputs N (N-level) output voltages $V_n$ corresponding to the control signals cont(0) to cont(M−1) from the output terminal $V_{OUT}$ by employing output resistors $R_0$ to $R_{M-1}$ having the resistance values defined in the above Expression (1) as the output resistors $R_0$ to $R_{M-1}$ of the drivers $D_0$ to $D_{M-1}$ of the control numbers 0 to M−1. The output voltage $V_n$ is a voltage of the state number n in a case where the state number n of the low voltage $V_L$ is set to 0 and then state numbers are given, in ascending order, to N voltage levels (including the voltage $V_L$ and the voltage $V_H$) obtained by equally dividing (dividing into N−1 equal parts) a difference between the low voltage $V_L$ and the high voltage $V_H$ into N−1 pieces.

Incidentally, a value in a case where the M-bit digital data indicated by the control signals cont(0) to cont(M−1) input to the transmitter 11-1 is expressed in decimal numbers will be referred to as a signal number X (0 to $2^M$−1). That is, a value in a case where a binary number in which the control signal cont(0) is a value of a 1 digit (first digit), the control signal cont(1) is a value of a 2 digit (second digit), and the control signal cont(2) is a value of a 4 digit (third digit) is expressed as a decimal number is defined as the signal number X. In a case where the signal number X is 0 to $2^{M-1}$−1, the output voltage of the driver $D_{M-1}$ is the low voltage $V_L$, and the high voltage $V_H$ is output from one of the drivers $D_0$ to $D_{M-2}$. At this time, among the output resistors $R_0$ to $R_{M-2}$, a resistance value in a case where output resistors connected to drivers from which the high voltage $V_H$ is output are connected in parallel with one another is proportional to a reciprocal of the signal number X from the expression of the resistance value $R_m$ shown in a lower part of the above Expression (1). That is, admittance in a case where the output resistors connected to the drivers from which the high voltage $V_H$ is output are connected in parallel with one another is proportional to the signal number X. The admittance at this time is represented by C·X using a proportional constant C (C is $1/\{(N-1)\cdot R_{term}\}$). In a case where the signal number X is 0 to $2^{M-1}$−1, therefore, the output voltage $V_{OUT}$ output from the output terminal $V_{OUT}$ increases as the signal number X increments from 0 by 1. More specifically, in a case where the signal number X is 0 to $2^{M-1}$−1, the output voltage $V_n$ in a case where the state number n in the above Expression (3) is 0 to $2^{M-1}$−1 is output.

In a case where the signal number X is $2^{M-1}$ to $2^M$−1, on the other hand, the output voltage of the driver $D_{M-1}$ is the high voltage $V_H$, and the admittance in a case where the output resistors connected to the drivers from which the high voltage $V_H$ is output are connected in parallel with one another is proportional to the sum $(N+X-2^M)$ of $N-2^{M-1}$ in the resistance value $R_m$ (m=M−1) of the output resistor $R_{M-1}$ shown in an upper expression of the above Expression (1) and $(X-2^{M-1})$, which is a difference between the signal number X and $2^{M-1}$. The admittance at this time is represented by $C\cdot(N+X-2^M)$ using the proportional constant C. In a case where the admittance $C\cdot(N+X-2^M)$ is compared with the maximum admittance $C\cdot(2^{M-1}-1)$ in a case where the signal number X is 0 to $2^{M-1}-1$, admittance with the signal number X with which $C\cdot(N+X-2^M)$ is smaller than or equal to $C\cdot(2^{M-1}-1)$ overlaps the admittance in a case where the signal number X is any of 0 to $2^{M-1}-1$. That is, admittance with the signal number X with which $(N+X-2_M)-(2^{M-1}-1)=(N+X-3\cdot 2^{M-1}+1)$ is smaller than or equal to 0 overlaps the admittance in a case where the signal number X is any of 0 to $2^{M-1}-1$. With the signal number X that satisfies $2^{M-1}\leq X\leq 3\cdot 2^{M-1}-1-N$, the admittance overlaps the admittance in a case where the signal number X is 0 to $2^{M-1}-1$, and the output voltage $V_{OUT}$ overlaps a part of the output voltage $V_n$ (the output voltage $V_n$ in a case where the state number n is 0 to $2^{M-1}-1$) in a case where the signal number X is 0 to $2^{M-1}-1$. Since $2^{M-1}\leq X\leq 3\cdot 2^{M-1}-1-N$ can be transformed as $0\leq X-2^{M-1}\leq 2^M-1-N$, in a case where the signal number X of $2^{M-1}$ to $2^M-1$ is represented by $2^{M-1}+\Delta X$, the output voltage $V_{OUT}$ overlaps a part of the output voltage $V_n$ (the output voltage $V_n$ in a case where the state number n is 0 to $2^{M-1}-1$) in a case where the signal number X is 0 to $2^{M-1}-1$ in a range in which ΔX is an integer from 0 to a value obtained by subtracting the number of states N from the maximum value $(2^M-1)$ of the signal number X.

<Relationship between Number of States N in Transmitter 11-1 and Output Resistors $R_0$ to $R_{M-1}$>

FIG. 3 is a table illustrating the number of states N applied to the transmitter 11-1 and the resistance values $R_0$ to $R_{M-1}$ (ratios to the resistance value $R_{term}$) of the output resistors $R_0$ to $R_{M-1}$ in the case of the number of states N. In a leftmost column, 2 to 32 are described as examples of the number of states N applied to the transmitter 11-1. In each of rows of the number of states, the resistance values $R_0$ to $R_{M-1}$ of the output resistors $R_0$ to $R_{M-1}$ of the control numbers 0 to M−1 calculated in accordance with the above Expression (1) are indicated as the ratios to the resistance value $R_{term}$. Note that a value of the control value M, which is the number of the output resistors $R_0$ to $R_{M-1}$, that is, a value of the control value M, which is the number of the drivers $D_0$ to $D_{M-1}$ and the number of the control signals cont(0) to cont(M−1) for controlling the drivers $D_0$ to $D_{M-1}$, is a maximum value in a case where a condition that $(N-2^{M-1})$, which is a denominator in the upper expression of the above Expression (1), is larger than 0 is satisfied. In other words, the control value M is a value of a minimum power (integer) of 2 that is larger than or equal to N.

In a case where the number of states N is 3 in FIG. 3, for example, the control value M is 2, the resistance value $R_0$/the resistance value $R_{term}$ of the control number 0 is 2, and the resistance value $R_1$/the resistance value $R_{term}$ of the control number 1 is 2. In a case where the number of states N is 5, the control value M is 3, the resistance value $R_0$/the resistance value $R_{term}$ of the control number 0 is 4, the resistance value $R_1$/the resistance value $R_{term}$ of the control number 1 is 2, and the resistance value $R_2$/the resistance value $R_{term}$ of the control number 2 is 4. In a case where the number of states N is 7, the control value M is 3, the resistance value $R_0$/the resistance value $R_{term}$ of the control number 0 is 6, the resistance value $R_1$/the resistance value $R_{term}$ of the control number 1 is 3, and the resistance value $R_2$/the resistance value $R_{term}$ of the control number 2 is 2. In a case where the number of states N is 27, the control value M is 5, the resistance value $R_0$/the resistance value $R_{term}$ of the control number 0 is 26, the resistance value $R_1$/the resistance value $R_{term}$ of the control number 1 is 13, the resistance value $R_2$/the resistance value $R_{term}$ of the control number 2 is 6.5 (26/4), the resistance value $R_3$/the resistance value $R_{term}$ of the control number 3 is 3.25 (26/8), and the resistance value $R_4$/the resistance value $R_{term}$ of the control number 4 is 2.364 (26/11).

Note that, as in the table of FIG. 3, the above Expression (1) limits ratios of the resistance values $R_0$ to $R_{M-1}$ of the output resistors $R_0$ to $R_{M-1}$ of the control numbers 0 to M−1 in a case where the transmitter 11 is set to the number of states N, and the resistance values $R_0$ to $R_{M-1}$ are not limited to specific values.

<Specific Configuration of Transmitter 11-1 in Case Where Number of States N Is 7>

Figures 4, 5:
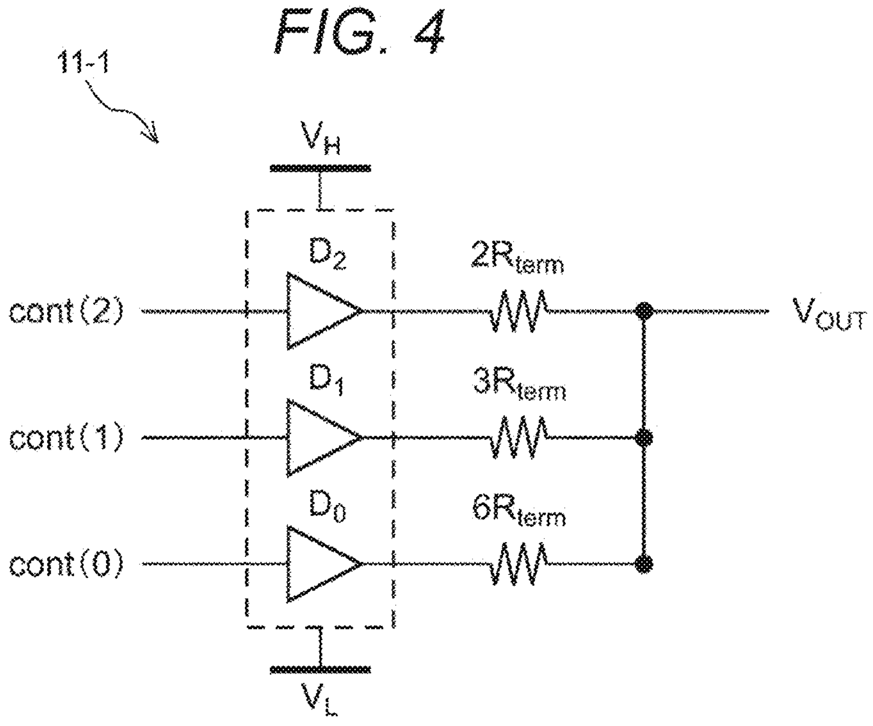
FIG. 4 is a diagram illustrating a specific configuration of the transmitter in FIG. 2 in a case where the number of states is 7.
FIG. 5 is a diagram illustrating operation of the transmitter in FIG. 4.

FIG. 4 is a diagram illustrating a specific configuration of the transmitter 11-1 in FIG. 2 in a case where the number of states N is 7. As illustrated in FIG. 3, in a case where the number of states N is 7, the control value M is 3, the resistance value $R_0$/the resistance value $R_{term}$ of the control number 0 is 6, the resistance value $R_1$/the resistance value $R_{term}$ of the control number 1 is 3, and the resistance value $R_2$/the resistance value $R_{term}$ of the control number 2 is 2. In FIG. 4, since the control value M is 3, the transmitter 11-1 includes three drivers $D_0$ to $D_2$ of the control numbers 0 to 2 and three output resistors $R_0$ to $R_2$ of the control numbers 0 to 2 indicated by a resistance value $6R_{term}$, a resistance value $3R_{term}$, and a resistance value $2R_{term}$, respectively. Control signals cont(0) to cont(2) are input to the drivers $D_0$ to $D_2$, respectively, and a multi-level signal of the output voltage $V_n$ of the state number n corresponding to values of the control signals cont(0) to cont(2) is output from the output terminal $V_{OUT}$.

Figure 6:
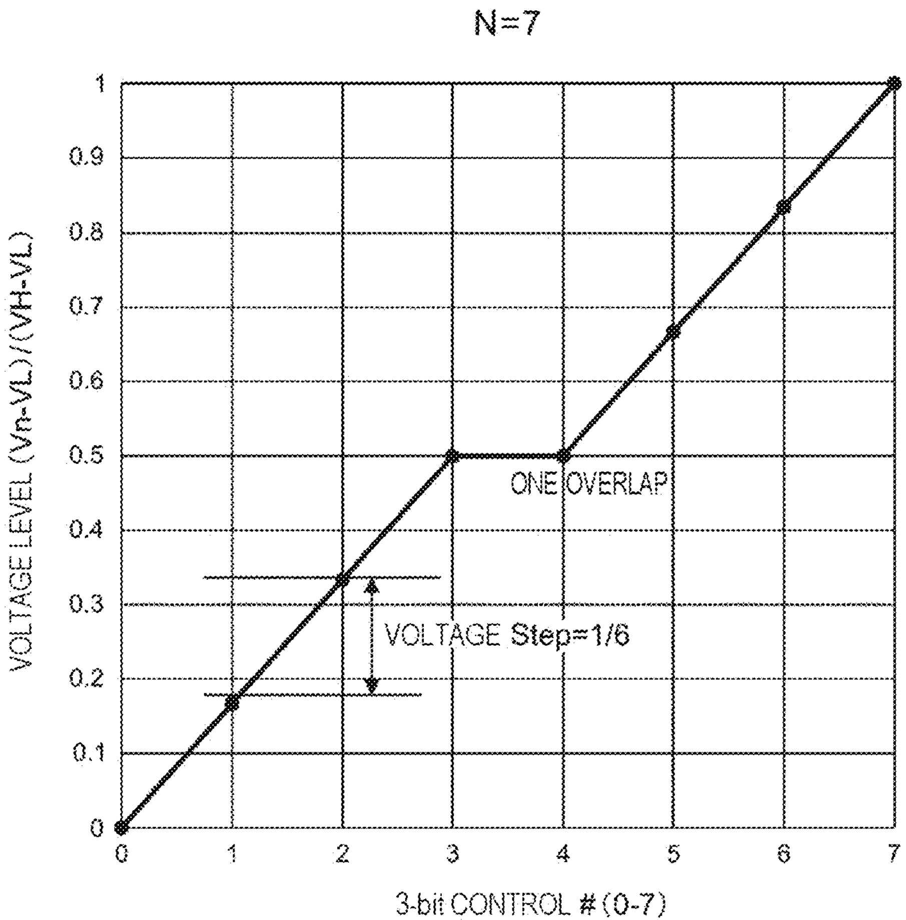
FIG. 6 is a graph illustrating changes in normalized output voltage with respect to a signal number in a case where the number of states is 7.

FIG. 5 is a diagram illustrating operation of the transmitter 11-1 in FIG. 4. In FIG. 5, signal numbers X of 0 to 7 are shown in a leftmost column. The signal number X is a value obtained by representing 3-bit digital data indicated by the control signals cont(0) to cont(2) in a decimal number. In each of rows of the signal numbers X of 0 to 7, values (0 or 1) of the control signals cont(0) to cont(2) and a normalized output voltage $V_n$ of the state number n output from the output terminal $V_{OUT}$ are shown. The normalized output voltage $V_n$ is a value obtained by normalizing the output voltage $V_n$ with a voltage range between the low voltage $V_L$ and the high voltage $V_H$ defined as 0 to 1, and is normalized using an expression of $(V_n-V_L)/(V_H-V_L)$. Note that a value obtained by normalizing the output voltage $V_n$ by $(V_n-V_L)/(V_H-V_L)$ will be referred to as a normalized output voltage $V_n$, and a value obtained by normalizing a value of an arbitrary output voltage by a similar expression will be referred to as a normalized output voltage hereinafter. In FIG. 6, changes in the normalized output voltage $V_n$ with respect to the signal number X are illustrated as a graph, where a horizontal axis represents the signal number X and a vertical axis represents the normalized output voltage.

According to FIGS. 5 and 6, in a case where the signal number X is 0, the output voltage $V_0$ $(=V_L)$ with the state number n of 0 is output, and the normalized output voltage $V_0$ with the state number 0 is the minimum value 0. In a case where the signal number X is 1 to 3, the output voltages $V_1$ to $V_3$ with the state numbers n of 1 to 3 are output, and the normalized output voltages $V_1$ to $V_3$ with the state numbers 1 to 3 are 0.167, 0.333, 0.667, and 0.500, respectively. At this time, the normalized output voltage $V_n$ increments by 1/6 from a value in the case of the previous signal number X. In a case where the signal number X is 4, the output voltage $V_3$ with the state number n of 3 is output as in the case where the signal number X is 3. The normalized output voltage $V_3$ of the state number 3 is 0.500, which overlaps that in the case where the signal number X is 3. In a case where the signal number X is 5 to 7, the output voltages $V_4$ to $V_6$ with the state numbers n of 4 to 6 are output, and the normalized output voltages $V_4$ to $V_6$ with the state numbers 4 to 6 are 0.667, 0.833, and 1.000, respectively. At this time, the normalized output voltage $V_n$ increments by 1/6 from a value in the case of the previous signal number X. Since the output voltage $V_6$ with the state number 6 in the case where the signal number X is 7 is $V_H$, the normalized output voltage $V_6$ has a maximum value of 1.

<Specific Configuration of Transmitter 11-1 in Case Where Number of States N Is 27>

Figure 7:
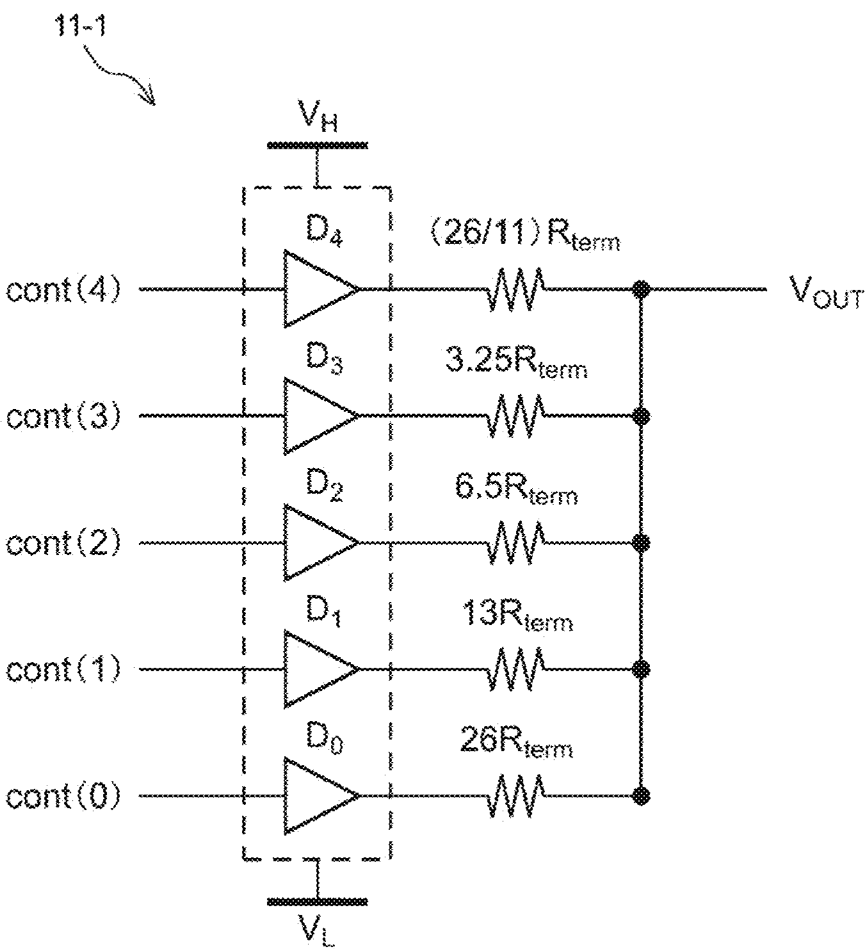
FIG. 7 is a diagram illustrating a specific configuration of the transmitter in FIG. 2 in a case where the number of states is 27.

FIG. 7 is a diagram illustrating a specific configuration of the transmitter 11-1 in FIG. 2 in a case where the number of states N is 27. As illustrated in FIG. 3, in a case where the number of states N is 27, the control value M is 5, the resistance value $R_0$/the resistance value $R_{term}$ of the control number 0 is 26, the resistance value $R_1$/the resistance value $R_{term}$ of the control number 1 is 13, the resistance value $R_2$/the resistance value $R_{term}$ of the control number 2 is 6.5 (26/4), the resistance value $R_3$/the resistance value $R_{term}$ of the control number 3 is 3.25 (26/8), and the resistance value $R_4$/the resistance value $R_{term}$ of the control number 4 is 2.364 (26/11). In FIG. 7, since the control value M is 5, the transmitter 11-1 includes five drivers $D_0$ to $D_4$ of the control numbers 0 to 4, and five output resistors $R_0$ to $R_4$ of the control numbers 0 to 4 indicated by a resistance value $26R_{term}$, a resistance value $3.25R_{term}$, a resistance value $2.364R_{term}$, a resistance value $3.25R_{term}$, and a resistance value (26/11) $R_{term}$. Control signals cont(0) to cont(4) of the control numbers 0 to 4 are input to the drivers $D_0$ to $D_4$, respectively, and a multi-level signal of the output voltage $V_n$ of the state number n corresponding to values of the control signals cont(0) to cont(4) is output from the output terminal $V_{OUT}$.

Figure 9:
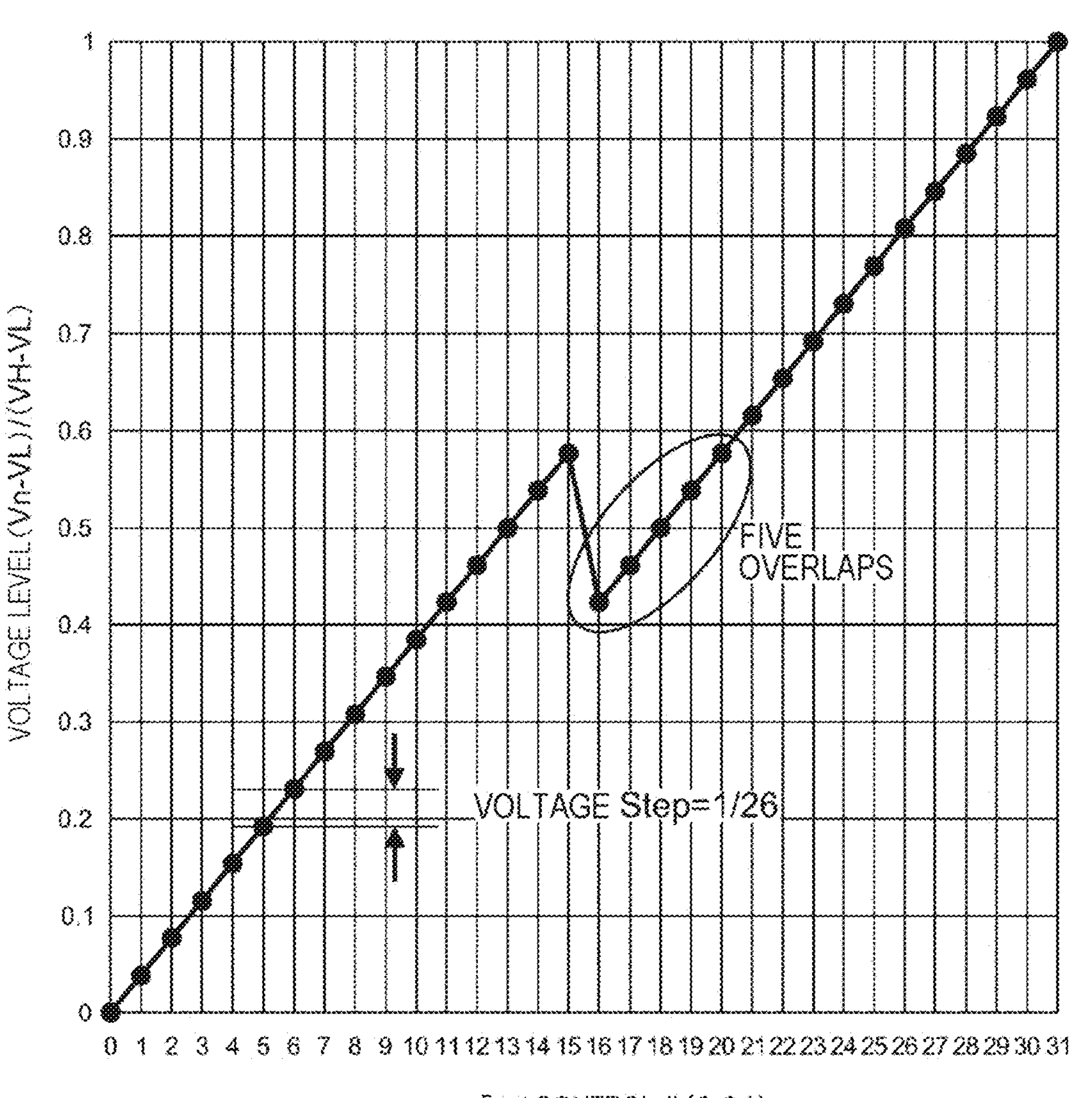
FIG. 9 is a graph illustrating changes in the normalized output voltage with respect to the signal number in a case where the number of states is 27.

FIG. 8 is a diagram illustrating operation of the transmitter 11-1 in FIG. 7. In FIG. 8, signal numbers X of 0 to 31 are shown in a leftmost column. The signal number X is a value obtained by representing 5-bit digital data indicated by the control signals cont(0) to cont(4) in a decimal number. In each of rows of the signal numbers X of 0 to 31, values (0 or 1) of the control signals cont(0) to cont(4) and a normalized output voltage $V_n$ of the state number n output from the output terminal $V_{OUT}$ are shown. In FIG. 9, changes in the normalized output voltage $V_n$ with respect to the signal number X are illustrated as a graph, where a horizontal axis represents the signal number X and a vertical axis represents the normalized output voltage.

According to FIGS. 8 and 9, in a case where the signal number X is 0, the output voltage $V_0$ (=$V_L$) with the state number n of 0 is output, and the normalized output voltage $V_0$ with the state number 0 is the minimum value 0. In a case where the signal number X is 1 to 15, the output voltages $V_1$ to $V_{15}$ with the state numbers n of 1 to 15 are output, and the normalized output voltages $V_1$ to $V_{15}$ with the state numbers 1 to 15 increase from 0.038 to 0.577. At this time, the normalized output voltage $V_n$ increments by 1/26 from a value in the case of the previous signal number X. In a case where the signal number X is 16 to 20, the output voltages $V_{11}$ to $V_{15}$ with the state numbers n of 11 to 15 are output as in the case where the signal numbers X are 11 to 15. The normalized output voltages $V_{11}$ to $V_{15}$ with the state numbers 11 to 15 are values that increment by 1/26 from 0.423 to 0.577, and overlap that in the case where the signal number X is 11 to 15. In a case where the signal number X is 21 to 31, the output voltages $V_{16}$ to $V_{26}$ with the state numbers n of 16 to 26 are output, and the normalized output voltages $V_{16}$ to $V_{26}$ with the state numbers 16 to 26 increase from 0.617 to 1.000. At this time, the normalized output voltage $V_n$ increments by 1/26 from a value in the case of the previous signal number X. Since the output voltage $V_{25}$ with the state number 26 in the case where the signal number X is 31 is $V_H$, the normalized output voltage $V_{26}$ has a maximum value of 1.

<First Example of Transmitter 11-1>

Figure 10:
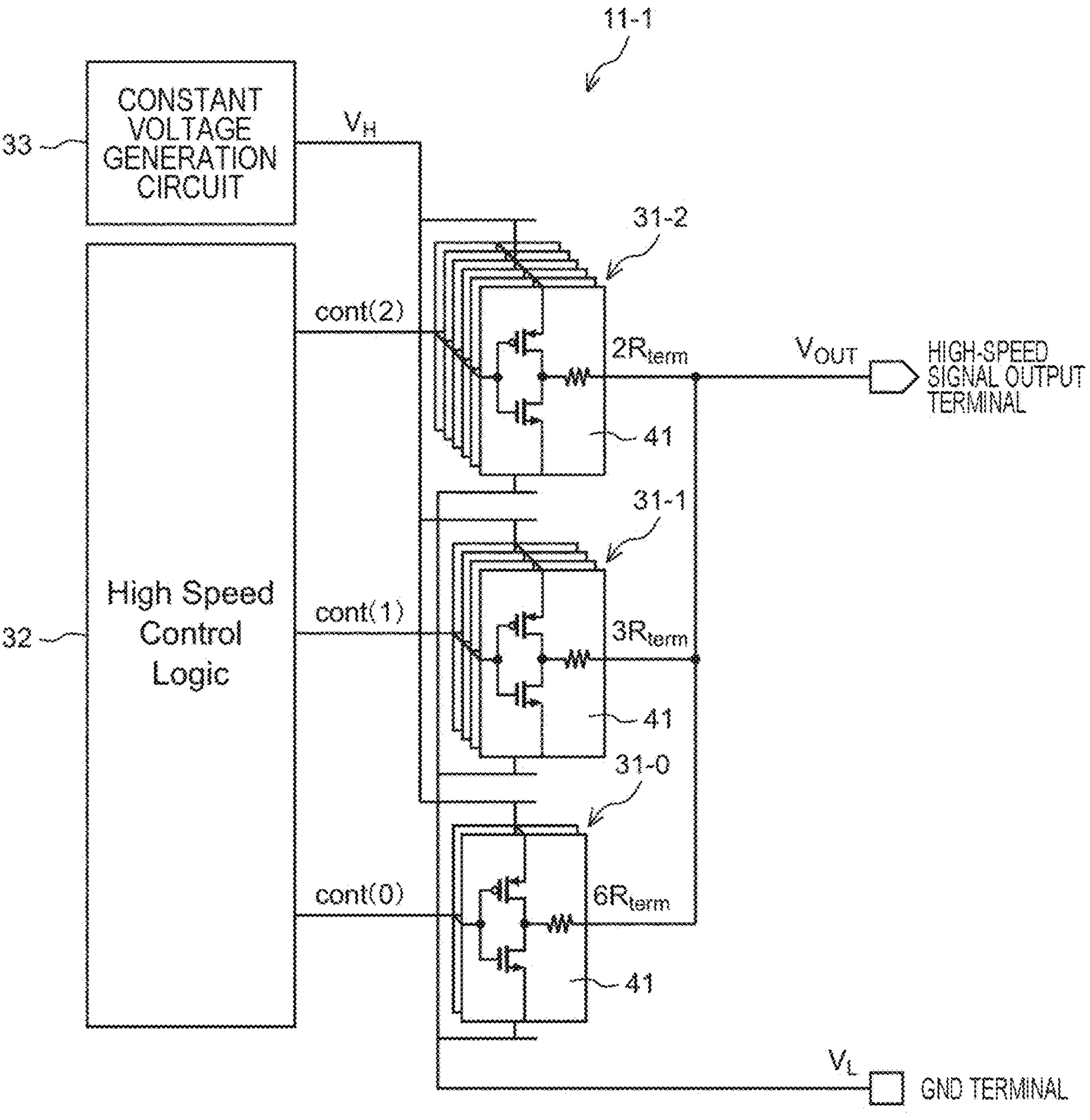
FIG. 10 is a configuration diagram illustrating a first example of the transmitter in FIG. 4 (a case where N=7).

FIG. 10 is a configuration diagram illustrating a first example of the transmitter 11-1 (a case where N=7) in FIG. 4. In FIG. 10, the transmitter 11-1 includes unit drivers 31-1 to 31-3. Each of the unit drivers 31-0 to 31-2 includes one or a plurality of units 41 having the same circuit configuration and circuit characteristics. Each unit 41 includes a driver (referred to as a unit driver D) having characteristics similar to those of the drivers $D_0$ to $D_2$ illustrated in FIG. 4 and an output resistor (corresponds to a unit resistor $L{\cdot}R_{term}$ described later, though will be referred to as a unit resistor $R_{OUT}$ here) connected to an output terminal of the unit driver D. Each unit 41 is mounted on, for example, one IC chip or one substrate. Note that, in FIG. 10, the unit driver D in each unit 41 has a circuit configuration of a complementary MOS (CMOS) including a combination of a p-type MOSFET and an n-type MOSFET, but the circuit configuration of the driver D is an example and is not limited to this. A resistance value of the unit resistor $R_{OUT}$ in each unit 41 can be expressed as $12{\cdot}R_{term}$. Since the resistance value $R_{term}$ is not limited to a specific value, the unit resistance $R_{OUT}$ in each unit 41 is also not limited to a specific resistance value. Each unit 41 need not include the unit resistor $R_{OUT}$ as a resistance element, and the resistance value of the unit resistor $R_{OUT}$ as a resistance element may be 0Ω, instead. In this case, too, it is assumed that the unit resistor $R_{OUT}$ of 0Ω is connected to the driver D. Note that in a case where the drivers $D_0$ to $D_{M-1}$ and the output resistors $R_0$ to $R_{M-1}$ of the required number (control value M) of the control numbers 0 to M−1 are configured using a plurality of units 41, each of which is a combination circuit of the unit driver D and the unit resistor $R_{OUT}$ having the same characteristics, the drivers $D_0$ to $D_{M-1}$ and the output resistors $R_0$ to $R_{M-1}$ are configured by the unit driver D and the unit resistor $R_{OUT}$ of one or a plurality of units 41. That is, a plurality of unit drivers D controlled by control signals of the same control number is equivalent to one driver of the control number, and is equivalent to a plurality of unit resistors $R_{OUT}$ connected to the unit drivers D being connected in parallel with one another. Each of the drivers $D_0$ to $D_{M-1}$ and each of the output resistors $R_0$ to $R_{M-1}$, therefore, can be achieved by the unit driver D and the unit resistance $R_{OUT}$ of one or a plurality of units 41 having the same characteristics. As described above, the unit driver D and the unit resistor $R_{OUT}$, which are a unit constituting the drivers $D_0$ to $D_{M-1}$ and the output resistors $R_0$ to $R_{M-1}$ of the control numbers 0 to M−1, respectively, will be referred to as a unit driver and a unit resistor in order to distinguish the unit driver and the unit resistor from the drivers $D_0$ to $D_{M-1}$ and the output resistors $R_0$ to $R_{M-1}$. Furthermore, as described above, the unit driver D and the unit resistance $R_{OUT}$ that is the output resistor thereof may be regarded as representing an equivalent circuit of one unit driver D, and in this case, the unit 41 represents the unit driver D.

In FIG. 10, in the unit drivers 31-0 to 31-2, two units 41, four units 41, and six units 41 are connected in parallel with one another, respectively. Connecting the units 41 in parallel with one another means that terminals of the same type of the plurality of units 41 are connected to the same line. Each unit 41 includes an input terminal to which a control signal to the unit driver D is input, an output terminal that outputs an output voltage from an output side (a side opposite a contact with the unit driver D) of the unit resistor $R_{OUT}$, a high voltage terminal to which the high voltage $V_H$ is applied, and a low voltage terminal to which the low voltage $V_L$ is applied.

With respect to the two units 41 of the unit driver 31-0, the input terminals of the units 41 are connected to an output terminal (a supply line through which the control signal cont(0) is supplied) of a high speed control logic (logic circuit) 32 that outputs the control signal cont(0). The output terminals of the units 41 are connected to an output terminal $V_{OUT}$ (a transmission line through which a multi-level signal is transmitted) as the transmitter 11-1. The high voltage terminals of the units 41 are connected to a terminal that outputs the high voltage $V_H$ generated by a constant voltage generation circuit 33. The low voltage terminals are connected to a GND terminal. The two units 41 are thus connected in parallel with each other and always perform the same operation, thereby constituting a circuit equivalent to the driver $D_0$ and the output resistor $6R_{term}$ of the control number 0 in FIG. 4.

With respect to the four units 41 of the unit driver 31-1, the input terminals of the units 41 are connected to an output terminal (a supply line through which the control signal cont(1) is supplied) of the high speed control logic 32 that outputs the control signal cont(1). The output terminals of the unit 41 are connected to the output terminal $V_{OUT}$ as the transmitter 11-1. The high voltage terminals of the units 41 are connected to a terminal that outputs the high voltage $V_H$ generated by a constant voltage generation circuit 33. The low voltage terminals of the units 41 are connected to the GND terminal. The four units 41 are thus connected in parallel with each other and always perform the same operation, thereby constituting a circuit equivalent to the driver $D_1$ and the output resistor $3R_{term}$ of the control number 1 in FIG. 4.

With respect to the six units 41 of the unit driver 31-2, the input terminals of the units 41 are connected to an output terminal (a supply line through which the control signal cont(2) is supplied) of the high speed control logic 32 that outputs the control signal cont(2). The output terminals of the unit 41 are connected to the output terminal $V_{OUT}$ as the transmitter 11-1. The high voltage terminals of the units 41 are connected to a terminal that outputs the high voltage $V_H$ generated by a constant voltage generation circuit 33. The low voltage terminals of the units 41 are connected to the GND terminal. The six units 41 are thus connected in parallel with each other and always perform the same operation, thereby constituting a circuit equivalent to the driver $D_2$ and the output resistor $2R_{term}$ of the control number 2 in FIG. 4.

According to the first example in FIG. 10, the unit drivers 31-0 to 31-2 constitute the circuit of the transmitter 11-1 in FIG. 4. Furthermore, a potential (0 V) of GND is applied to the unit drivers 31-0 to 31-2 as the low voltage $V_L$. Since the unit drivers 31-0 to 31-2 can be configured using the units 41 having the same configuration, the transmitter 11-1 can be easily manufactured, and space saving can be achieved. Note that the unit drivers 31-0 to 31-2 may include one unit 41, two units 41, and three units 41, respectively, where the resistance value of the unit resistor $R_{OUT}$ of each unit 41 is $6 \cdot R_{term}$. Furthermore, a ratio of the number of units 41 constituting each of the unit drivers 31-0 to 31-2 matches a ratio of a reciprocal of the output resistors $R_0$ to $R_2$ of the control numbers 0 to 2 constituted by the unit drivers 31-0 to 31-2. As described in FIG. 3, the above Expression (1) limits the ratio of the resistance values $R_0$ to $R_2$ of the output resistors $R_0$ to $R_2$ and does not limit the resistance values of the output resistors $R_0$ to $R_2$. In a case where the number of states N is 7 as in the first example in FIG. 10, therefore, the ratio of the resistance values $R_0$ to $R_2$ needs to be 6:3:2 as illustrated in FIG. 3. At this time, since the ratio of the reciprocal of the resistance values $R_0$ to $R_2$ is 1:2:3, the ratio of the number of units 41 of the unit drivers 31-0 to 31-2 constituting the drivers $D_0$ to $D_2$ and the output resistors $_{02}R_0$ to $R_2$ of the control numbers 0 to 2 may be 1:2:3. The number of units 41 constituting the unit drivers 31-0 to 31-2 may be values obtained by multiplying 1, 2, and 3 by any natural number, respectively. Similarly, the number of units 41 is not limited in second to fourth examples and the like described below with reference to FIGS. 11 to 14.

<Second Example of Transmitter 11-1>

Figure 11:
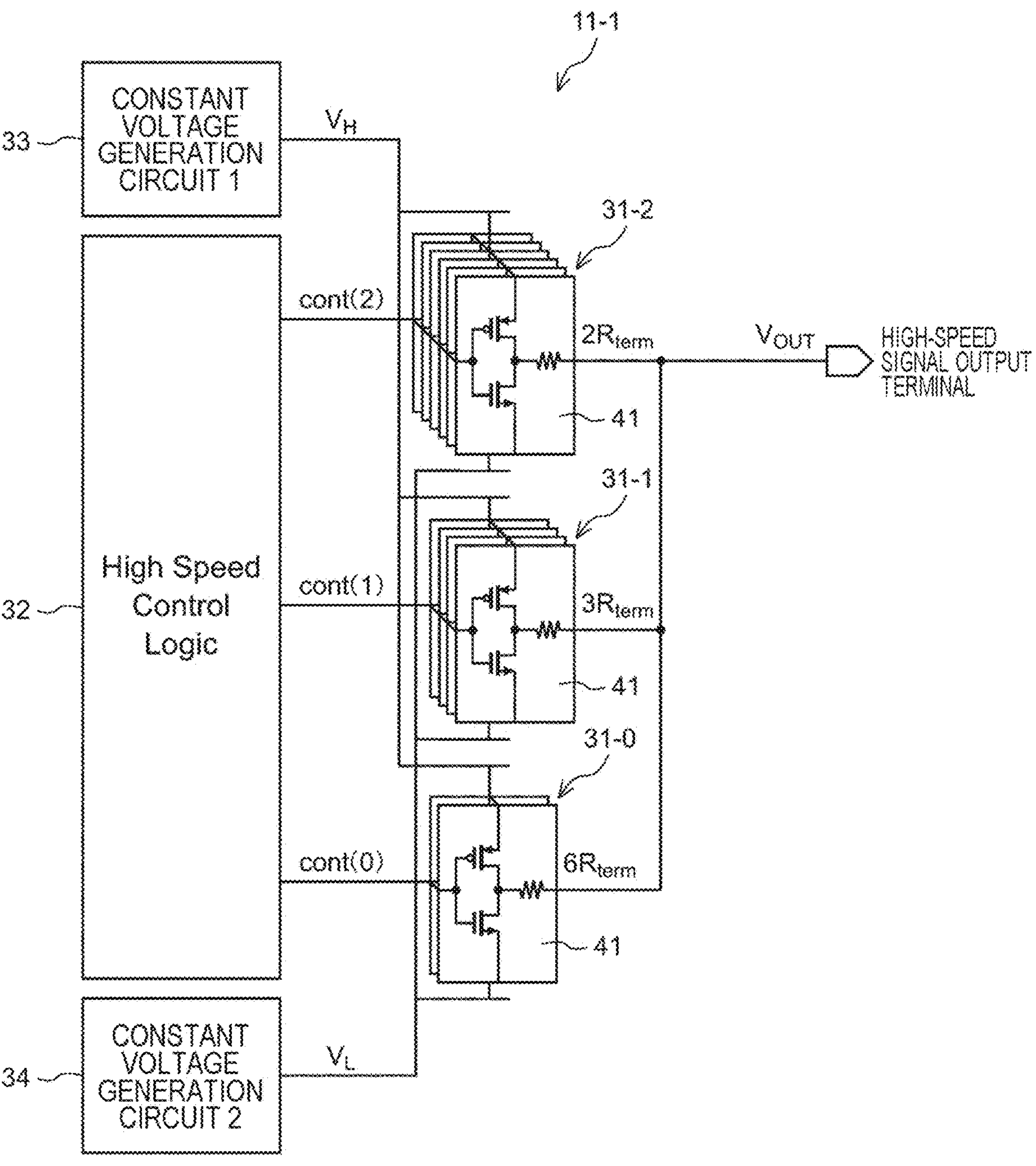
FIG. 11 is a configuration diagram illustrating a second example of the transmitter in FIG. 4 (a case where N=7).

FIG. 11 is a configuration diagram illustrating a second example of the transmitter 11-1 (a case where N=7) in FIG. 4. Note that, in the figure, parts common to those in FIG. 10 are given the same reference numerals, and description thereof is omitted. The second example in FIG. 11 is different from the first example in FIG. 10 in that a constant voltage generation circuit 34 (described as a constant voltage generation circuit 2 in the figure) is included. Note that the constant voltage generation circuit 33 that generates and outputs the high voltage terminal is illustrated as a constant voltage generation circuit 1.

The low voltage terminals of the units 41 in each of the unit drivers 31-0 to 31-2 are connected to a terminal that outputs a low voltage $V_L$ generated by the constant voltage generation circuit 34. According to the second example in FIG. 11, the unit drivers 31-0 to 31-2 constitute the circuit of the transmitter 11-1 in FIG. 4 as in FIG. 10. Furthermore, as the low voltage $V_L$, not the GND potential but the low voltage $V_L$ generated by the constant voltage generation circuit 34 is applied to the unit drivers 31-0 to 31-2.

<Third Example of Transmitter 11-1>

Figure 12:
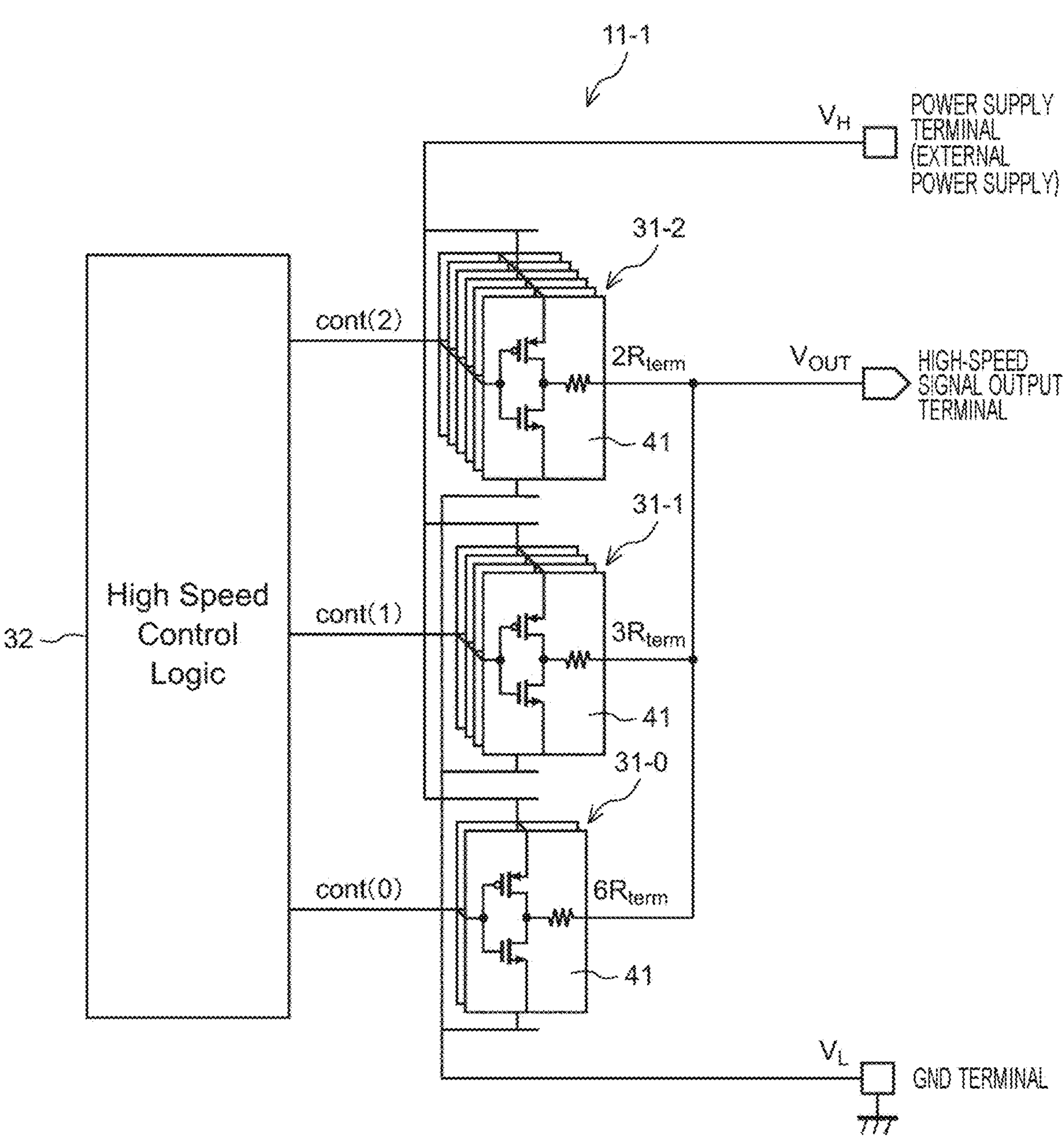
FIG. 12 is a configuration diagram illustrating a third example of the transmitter in FIG. 4 (a case where N=7).

FIG. 12 is a configuration diagram illustrating a third example of the transmitter 11-1 (a case where N=7) in FIG. 4. Note that, in the figure, parts common to those in FIG. 10 are given the same reference numerals, and description thereof is omitted. The third example in FIG. 12 is different from the first example in FIG. 10 in that the constant voltage generation circuit 33 is not provided. The high voltage terminals of the units 41 in each of the unit drivers 31-0 to 31-2 is connected to a power supply terminal. A high voltage $V_H$ from an external voltage source is supplied to the power supply terminal.

According to the third example in FIG. 12, the unit drivers 31-0 to 31-2 constitute the circuit of the transmitter 11-1 in FIG. 4 as in FIG. 10. Furthermore, it is possible to supply the high voltage $V_H$ from any external power supply without requiring the constant voltage generation circuit 33 that accompanies the unit drivers 31-0 to 31-2 and that generates the high voltage $V_H$ as illustrated in FIG. 10.

<Fourth Example of Transmitter 11-1>

Figure 13:
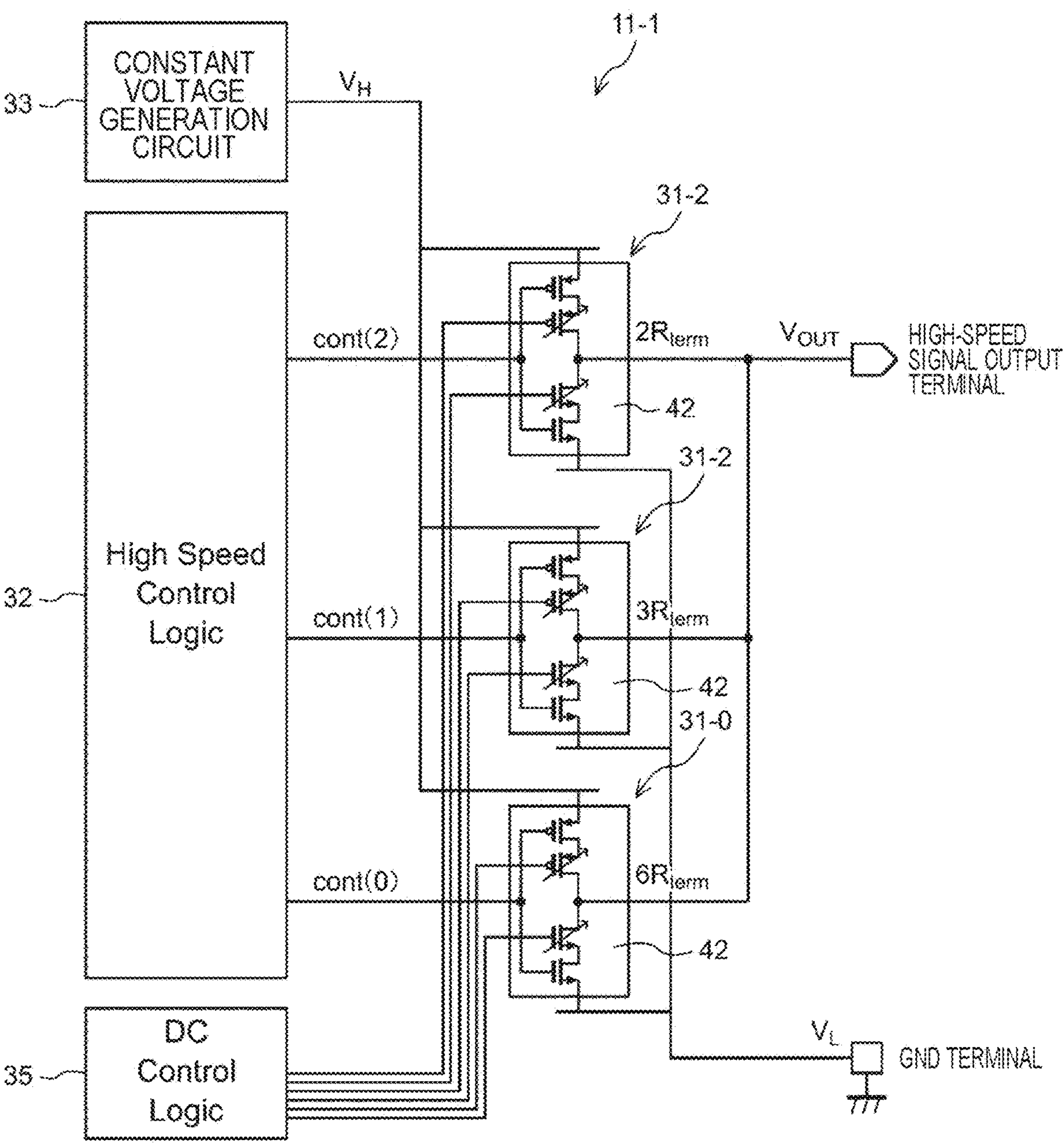
FIG. 13 is a configuration diagram illustrating a fourth example of the transmitter in FIG. 4 (a case where N=7).

FIG. 13 is a configuration diagram illustrating a fourth example of the transmitter 11-1 (a case where N=7) in FIG. 4. Note that, in the figure, parts common to those in FIG. 10 are given the same reference numerals, and description thereof is omitted. In the fourth example in FIG. 13, configuration of units 42 in each of the unit drivers 31-0 to 31-2 is different from that of the units 41 of FIG. 10, and the unit drivers 31-0 to 31-2 each include one unit 42. A resistance MOSFET is connected in each unit 42 instead of the unit resistor $R_{OUT}$ of each unit 41 of FIG. 10. A DC voltage from a DC control logic (logic circuit) 35 is applied to a gate of the resistance MOSFET, and a resistance value of on-resistance between a source and a drain of the resistance MOSFET is varied in accordance with a voltage value of the DC voltage. The resistance values of the on-resistance of the resistance MOSFETs in the units 42 of the unit drivers 31-0 to 31-2 are adjusted to $6R_{term}$, $3R_{term}$, and $2R_{term}$, respectively, that is, adjusted in such a way as to achieve a ratio of 6:3:2. As a result, the unit driver 31-0 configures a circuit equivalent to the driver $D_0$ and the output resistor $6R_{term}$ of the control number 0 in FIG. 4, the unit driver 31-1 configures a circuit equivalent to the driver $D_1$ and the output resistor $3R_{term}$ of the control number 1 in FIG. 4, and the unit driver 31-2 configures a circuit equivalent to the driver $D_2$ and the output resistor $2R_{term}$ of the control number 2 in FIG. 4.

According to the fourth example in FIG. 13, the unit drivers 31-0 to 31-2 constitute the circuit of the transmitter 11-1 in FIG. 4 as in FIG. 10.

<Fifth Example of Transmitter 11-1>

Figure 14:
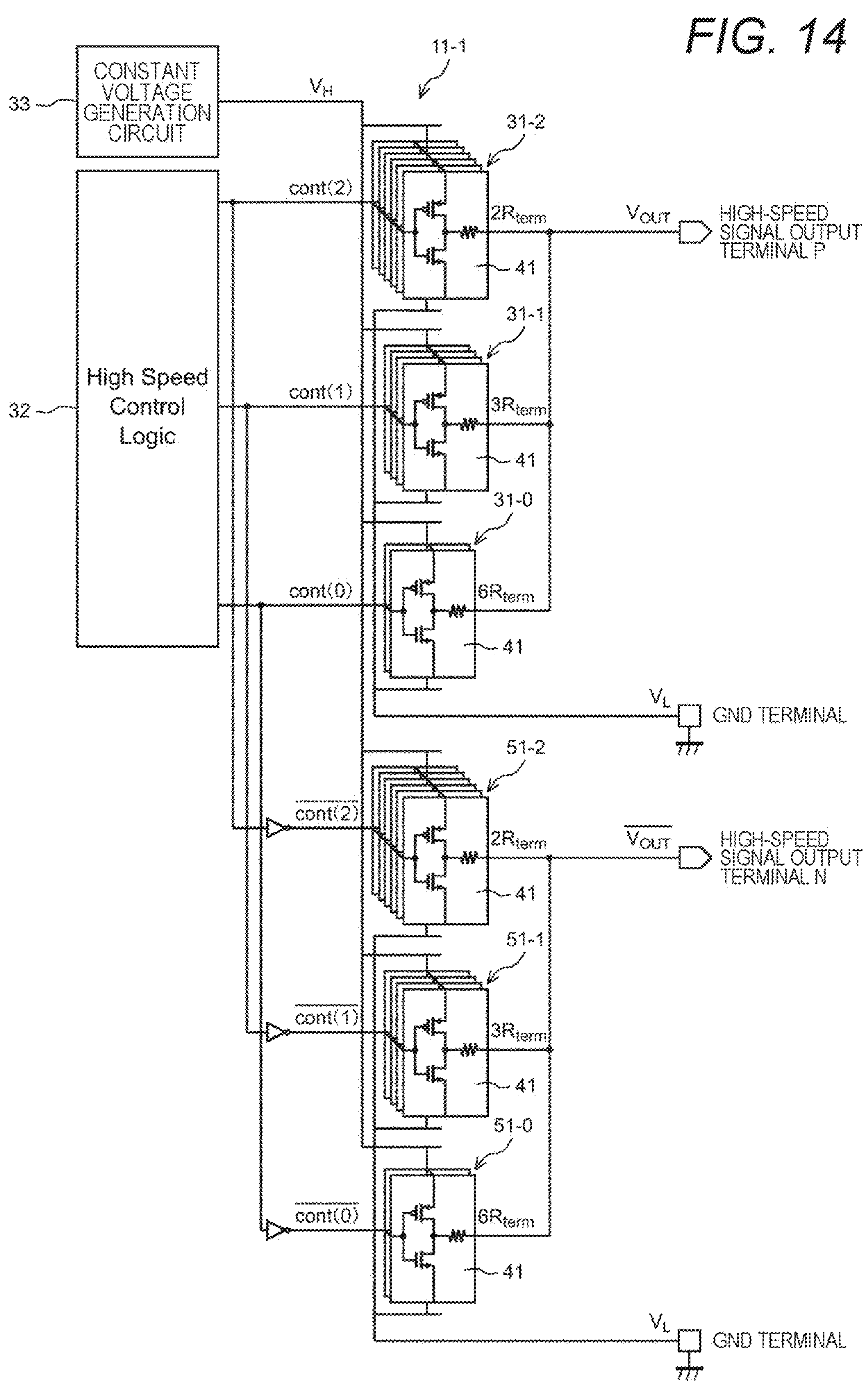
FIG. 14 is a configuration diagram illustrating a fifth example of the transmitter in FIG. 4 (a case where N=7).

FIG. 14 is a configuration diagram illustrating a fifth example of the transmitter 11-1 (a case where N=7) in FIG. 4. Note that, in the figure, parts common to those in FIG. 10 are given the same reference numerals, and description thereof is omitted. A fifth example in FIG. 14 is an example in a case where a multi-level signal for differential transmission is output by applying the configuration of the transmitter 11-1 in FIG. 4. In FIG. 14, the unit drivers 31-0 to 31-2 have the same configuration as in FIG. 10, and the output terminals thereof are connected to an output terminal $V_{OUT}$ (expressed as an output terminal P in the figure) for p-output (for forward output) as the transmitter 11-1.

Unit drivers 51-0 to 51-2 have the same configuration as the unit drivers 31-0 to 31-2, respectively. With respect to the two units 41 in the unit driver 51-0, however, the input terminals of the units 41 are connected, via a NOT circuit, to the output terminal of the high speed control logic (logic circuit) 32 that outputs the control signal cont(0). An inverted value of the control signal cont(0), therefore, is input to the input terminals of the units 41. The output terminals of the units 41 are connected to an output terminal $V_{OUT}$ (expressed as an output terminal N in the figure) with a negative symbol for n-output (for inverted output) as the transmitter 11-1. The high voltage terminals of the units 41 are connected to a terminal that outputs the high voltage $V_H$ generated by a constant voltage generation circuit 33. The low voltage terminals of the units 41 are connected to the GND terminal. The two units 41 are thus connected in parallel with each other and always perform the same operation, thereby constituting a circuit equivalent to the driver $D_0$ and the output resistor $6R_{term}$ of the control number 0 in FIG. 4.

With respect to the four units 41 in the unit driver 51-1, the input terminals of the units 41 are connected, via a NOT circuit, to the output terminal of the high speed control logic (logic circuit) 32 that outputs the control signal cont(1). An inverted value of the control signal cont(1), therefore, is input to the input terminals of the units 41. The output terminals of the units 41 are connected to the output terminal $V_{OUT}$ with the negative symbol for n-output (for inverted output) as the transmitter 11-1. The high voltage terminals of the units 41 are connected to a terminal that outputs the high voltage $V_H$ generated by a constant voltage generation circuit 33. The low voltage terminals of the units 41 are connected to the GND terminal. The four units 41 are thus connected in parallel with each other and always perform the same operation, thereby constituting a circuit equivalent to the driver $D_1$ and the output resistor $3R_{term}$ of the control number 1 in FIG. 4.

With respect to the six units 41 in the unit driver 51-2, the input terminals of the units 41 are connected, via a NOT circuit, to the output terminal of the high speed control logic (logic circuit) 32 that outputs the control signal cont(2). An inverted value of the control signal cont(2), therefore, is input to the input terminals of the units 41. The output terminals of the units 41 are connected to the output terminal $V_{OUT}$ with the negative symbol for n-output (for inverted output) as the transmitter 11-1. The high voltage terminals of the units 41 are connected to a terminal that outputs the high voltage $V_H$ generated by a constant voltage generation circuit 33. The low voltage terminals of the units 41 are connected to the GND terminal. The six units 41 are thus connected in parallel with each other and always perform the same operation, thereby constituting a circuit equivalent to the driver $D_2$ and the output resistor $2R_{term}$ of the control number 2 in FIG. 4.

According to the fifth embodiment in FIG. 14, the unit drivers 31-0 to 31-2 constitute the circuit of the transmitter 11-1 in FIG. 4, and a forward transmission signal is output from the output terminal $V_{OUT}$ for p-output (for forward output). The unit drivers 51-0 to 51-2 also constitute the circuit of the transmitter 11-1 in FIG. 4, and the inverted values of the control signals cont(0) to cont(2) are input to the unit drivers 51-0 to 51-2, respectively. An inverted transmission signal, therefore, is output from the output terminal $V_{OUT}$ with the negative symbol for n-output (for inverted output). Note that, in the fifth example, the configurations in the second to fourth examples can also be applied.

<Example of Circuit Configuration of Units 41 in Unit Drivers 31-0 to 31-2>

Figure 15:
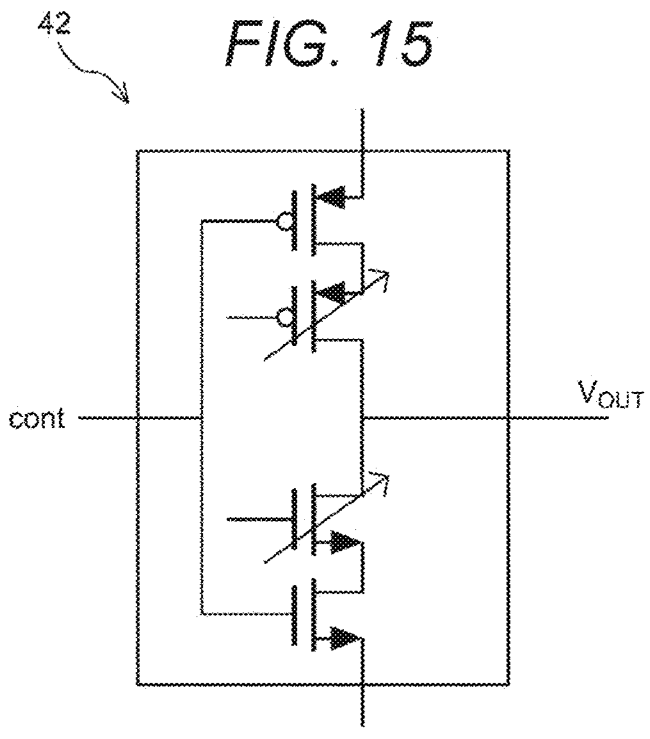
FIG. 15 is a diagram illustrating another example of circuit configuration of a unit.

In the first example of the transmitter 11-1 in FIG. 10, the circuit configuration of the units 41 constituting each of the unit drivers 31-0 to 31-2 is not limited to the case illustrated in FIG. 10. FIG. 15 is a diagram illustrating another example of the circuit configuration of the unit 41. In FIG. 15, a unit 42 is the unit 42 in the fourth example in FIG. 13, and a resistance MOSFET is connected instead of the unit resistor $R_{OUT}$ of the unit 41 of FIG. 10. Note that the unit 42 has been described in the fourth example in FIG. 13, and description thereof is omitted here.

Figure 16:
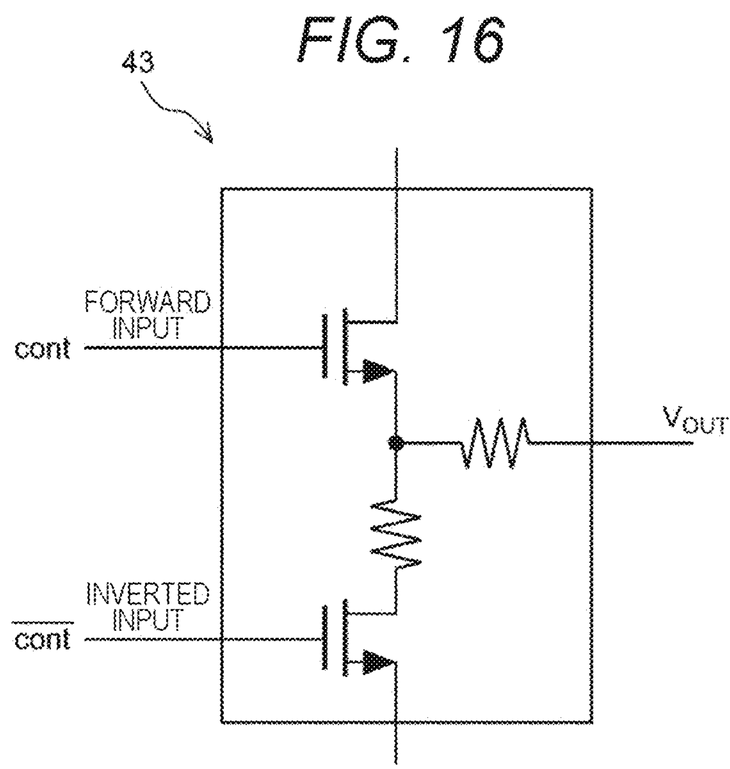
FIG. 16 is a diagram illustrating another example of circuit configuration of another unit.
Figure 17:
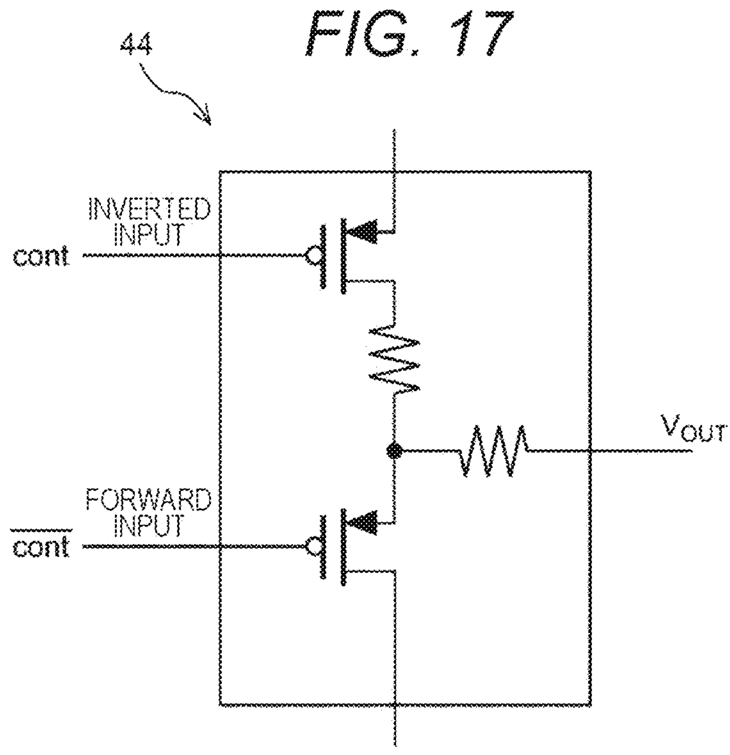
FIG. 17 is a diagram illustrating another example of circuit configuration of another unit.
Figure 18:
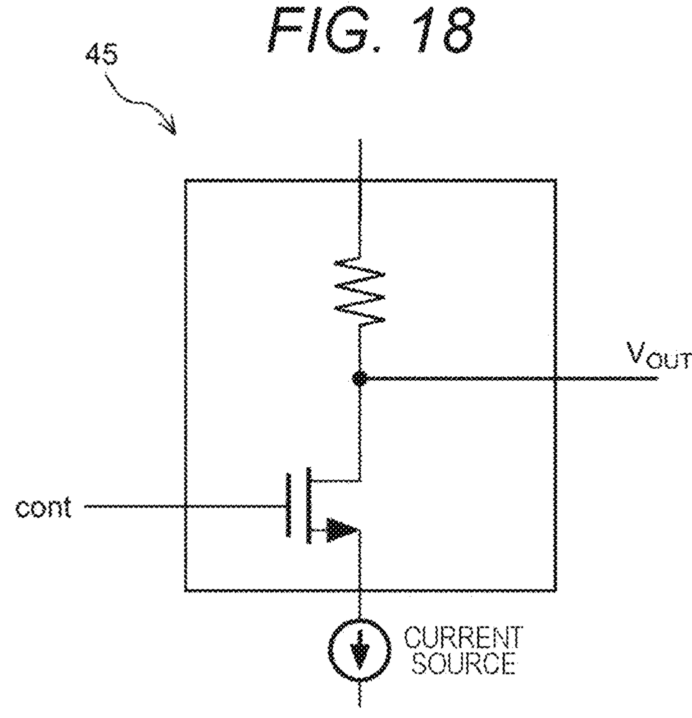
FIG. 18 is a diagram illustrating another example of circuit configuration of another unit.

FIG. 16 is a diagram illustrating another example of the circuit configuration of the unit 41. In FIG. 16, a unit 43 is an example of circuit configuration in a case where the unit driver D is configured by only a pair of n-type MOSFETs instead of the CMOS constituting the unit driver D in the unit 41 illustrated in FIG. 10. A forward control signal cont is input to a gate of one of the n-type MOSFETs, and an inverted control signal cont (an inverted value of the control signal cont) is input to a gate of the other n-type MOSFET. FIG. 17 is a diagram illustrating another example of the circuit configuration of the unit 41. In FIG. 17, a unit 44 is an example of circuit configuration in a case where the unit driver D is configured by only a pair of p-type MOSFETs instead of the CMOS constituting the unit driver D in the unit 41 illustrated in FIG. 10. A forward control signal cont is input to a gate of one of the p-type MOSFETs, and an inverted control signal cont (an inverted value of the control signal cont) is input to a gate of the other p-type MOSFET. FIG. 18 is a diagram illustrating another example of the circuit configuration of the unit 41. In FIG. 18, a unit 45 is an example of circuit configuration including a unit driver D (for example, a current mode logic (CML) driver) having a general configuration using an n-type MOSFET.

<First Mode of Receiver 12>

Figure 19:
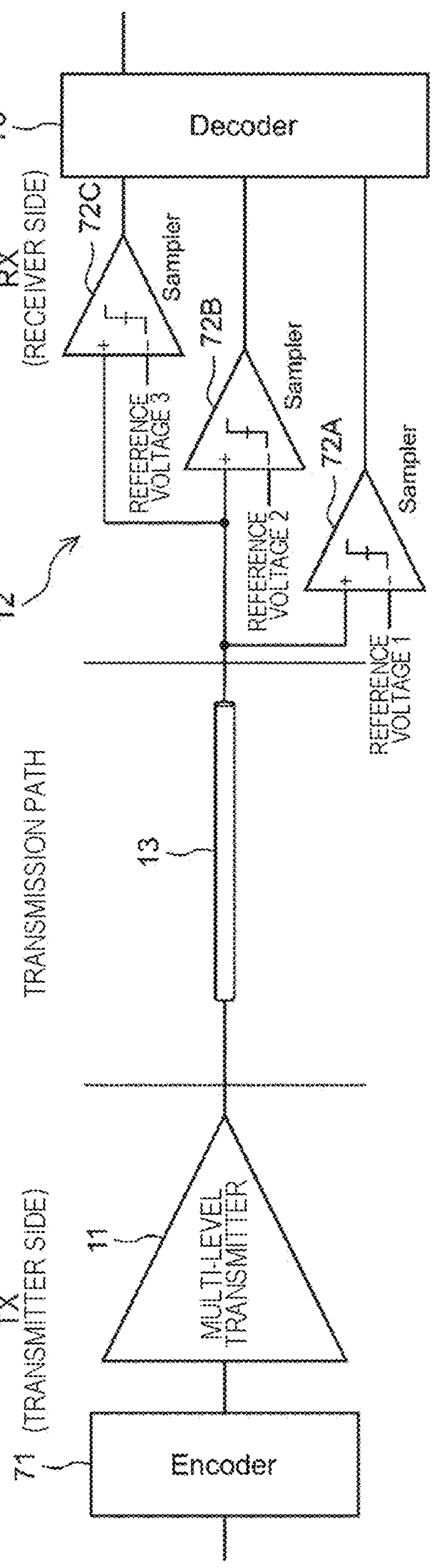
FIG. 19 is a diagram illustrating an example of configuration of a first mode of a receiver in FIG. 1.

FIG. 19 is a diagram illustrating an example of configuration of a first mode of the receiver 12 in FIG. 1. A data transmission system in FIG. 19 is a single-line single-phase communication system, and the transmitter 11 is a multi-level output driver that outputs a transmission signal of N multiple levels (voltage levels) (a multi-level signal of the number of states N) with the transmitter 11-1 or the like in the first mode in FIG. 2. Note that it is assumed that the number of states N is 4. An encoder 71 generates M-bit (control value M) control signals cont(0) to cont(M−1) for converting data to be transmitted to the receiver 12 into a multi-level signal, and supplies the generated control signals to the transmitter 11. The transmitter 11 generates a multi-level signal on the basis of the control signals cont(0) to cont (M−1) from the encoder 71, and transmits the multi-level signal to the receiver 12 via the transmission path 13. Since the number of states N is 4 in the present description, the control value M is 2.

The receiver 12 includes a plurality of samplers (comparators) 72A to 72C. Since the number of samplers 72A to 72C is equal to the number of states N−1 and the number of states N is 4, the receiver 12 includes the three samplers 72A to 72C. The multi-level signal transmitted from the transmitter 11 is input to a positive input terminal of each of the samplers 72A to 72C. Reference voltages 1 to 3 are input to a negative input terminal of each of the samplers 72A to 72C. Each of the samplers 72A to 72C compares a voltage of a multi-level signal input to the positive input terminal with a reference voltage input to the negative input terminal, and outputs 0 or 1 in accordance with a magnitude relationship therebetween. For example, the samplers 72A to 72C output 1 in a case where the former is smaller than or equal to the latter, and output 0 in a case where the former is larger than the latter. The reference voltage 1 input to the negative input terminal of the sampler 72A is set to a voltage larger than the voltage $V_0$ of the state number 0 of the multi-level signal and smaller than the voltage $V_1$ of the state number 1. As a result, 1 is output from the sampler 72A in a case where the multi-level signal has the voltage $V_0$ of the state number 0. In a case where the multi-level signal has the voltage $V_1$ of the state number 1, the voltage $V_2$ of the state number 2, or the voltage $V_3$ of the state number 3, 0 is output from the sampler 72A. The reference voltage 2 input to the negative input terminal of the sampler 72B is set to a voltage larger than the voltage $V_1$ of the state number 1 of the multi-level signal and smaller than the voltage $V_2$ of the state number 2. As a result, 1 is output from the sampler 72B in a case where the multi-level signal has the voltage $V_0$ of the state number 0 or the voltage $V_1$ of the state number 1. In a case where the multi-level signal has the voltage $V_2$ of the state number 2 or the voltage $V_3$ of the state number 3, 0 is output from the sampler 72B. The reference voltage 3 input to the negative input terminal of the sampler 72C is set to a voltage larger than the voltage $V_2$ of the state number 2 of the multi-level signal and smaller than the voltage $V_3$ of the state number 3. As a result, 1 is output from the sampler 72C in a case where the multi-level signal has the voltage $V_0$ of the state number 0, the voltage $V_1$ of the state number 1, or the voltage $V_2$ of the state number 2. In a case where the multi-level signal has the voltage $V_3$ of the state number 3, 0 is output from the sampler 72C.

The decoder 73 detects multiple levels (voltage levels) of a multi-level signal on the basis of output values of the samplers 72A to 72C, and decodes, on the basis of the detected multiple levels, the multiple levels into data before conversion into the multi-level signal performed by the encoder 71 and the transmitter 11.

<Second Mode of Receiver 12>

Figure 20:
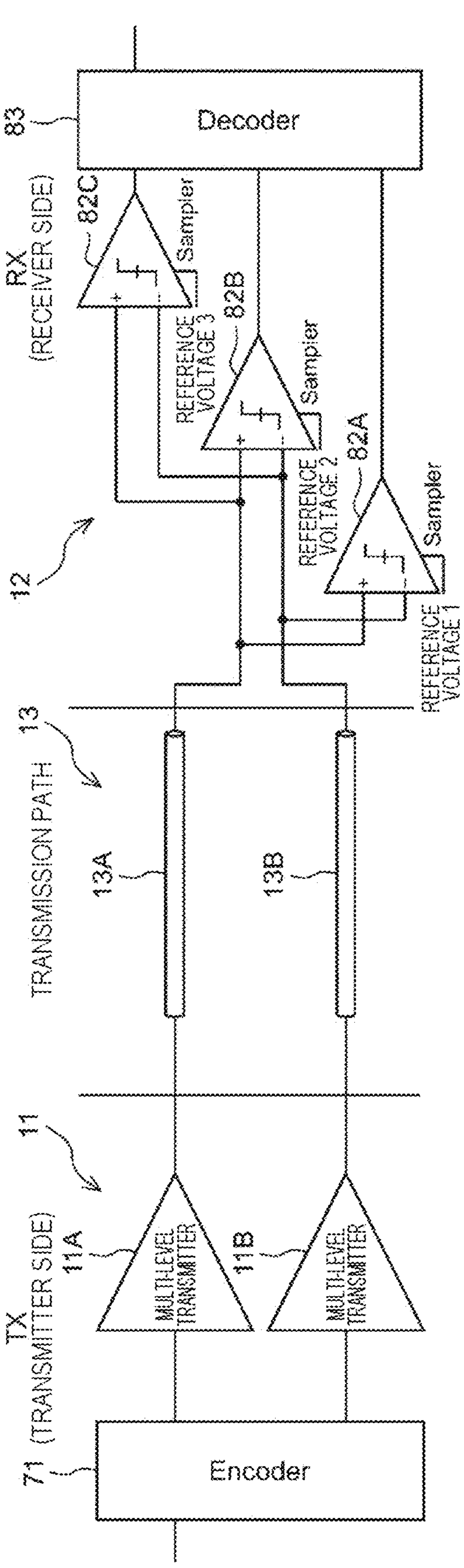
FIG. 20 is a diagram illustrating an example of configuration of a second mode of the receiver in FIG. 1.

FIG. 20 is a diagram illustrating an example of configuration of a second mode of the receiver 12 in FIG. 1. A data transmission system in FIG. 20 is a two-line differential communication system, and the transmitter 11 is a multi-level output driver that outputs a forward transmission signal (a multi-level signal of the number of states N) and an inverted transmission signal (a multi-level signal of the number of states N) of N multiple levels (voltage levels) with the transmitter 11-1 or the like in accordance with the fifth example in FIG. 14. The transmitter 11 includes a transmitter 11A that outputs a forward transmission signal of N multiple levels and a transmitter 11B that outputs an inverted transmission signal of N multiple levels. Note that it is assumed that the number of states N is 4. The encoder 71 generates M-bit (control value M) control signals cont(0) to cont(M−1) for converting data to be transmitted to the receiver 12 into a multi-level signal, and supplies the generated control signals to each of the transmitters 11A and 11B. Since the number of states N is 4 in the present description, the control value M is 2. The transmitter 11 includes a transmitter 11A for p-output (for forward output) and a transmitter 11B for n-output (for inverted output). The transmitters 11A and 11B generate and output a forward multi-level signal and an inverted multi-level signal on the basis of the control signals cont(0) to cont(M−1), respectively, from the encoder 71. The transmission path 13 includes transmission paths 13A and 13B, and the transmission path 13A transmits, to the receiver 12, the forward multi-level signal output from the transmitter 11A. The transmission path 13B transmits, to the receiver 12, the inverted multi-level signal output from the transmitter 11B.

The receiver 12 includes a plurality of samplers (comparators) 82A to 82C. Since the number of samplers 82A to 82C is equal to the number of states N−1 and the number of states N is 4, the receiver 12 includes the three samplers 82A to 82C. The forward multi-level signal transmitted from the transmitter 11A is input to a positive input terminal of each of the samplers 82A to 82C. The forward multi-level signal transmitted from the transmitter 11B is input to a negative input terminal of each of the samplers 82A to 82C. Furthermore, reference voltages 1 to 3 are input to a reference voltage input terminal of each of the samplers 82A to 82C. The samplers 82A to 82C each generate a difference signal (differential signal) that is a difference between a voltage of the forward multi-level signal input to the positive input terminal and a voltage of the inverted multi-level signal input to the negative input terminal, and compares the difference signal with the reference voltage input to the reference voltage input terminal. The samplers 82A to 82C each output 0 or 1 in accordance with a magnitude relationship between the difference signal and the reference voltage. For example, the samplers 82A to 82C output 1 in a case where the former is smaller than or equal to the latter, and output 0 in a case where the former is larger than the latter. The difference signal can take one of four voltage levels corresponding to state numbers 0 to 3. The reference voltages 1 to 3 input to the reference voltage input terminals of the samplers 82A to 82C, therefore, are set to voltages between the four voltage levels of the state numbers 0 to 3 that can be taken by the difference signal, as in the first mode of the receiver 12 in FIG. 19. A detailed situation in a case where the samplers 82A to 82C output 0 or 1 is similar to that in the first example in FIG. 19, and description thereof is omitted. The decoder 83 detects multiple levels (voltage levels) of the multi-level signal on the basis of output values of the samplers 72A to 72C, and decodes, on the basis of the detected multiple levels, the multiple levels into data before conversion into the multi-level signal performed by the encoder 81 and the transmitter 11.

<Third Mode of Receiver 12>

Figure 21:
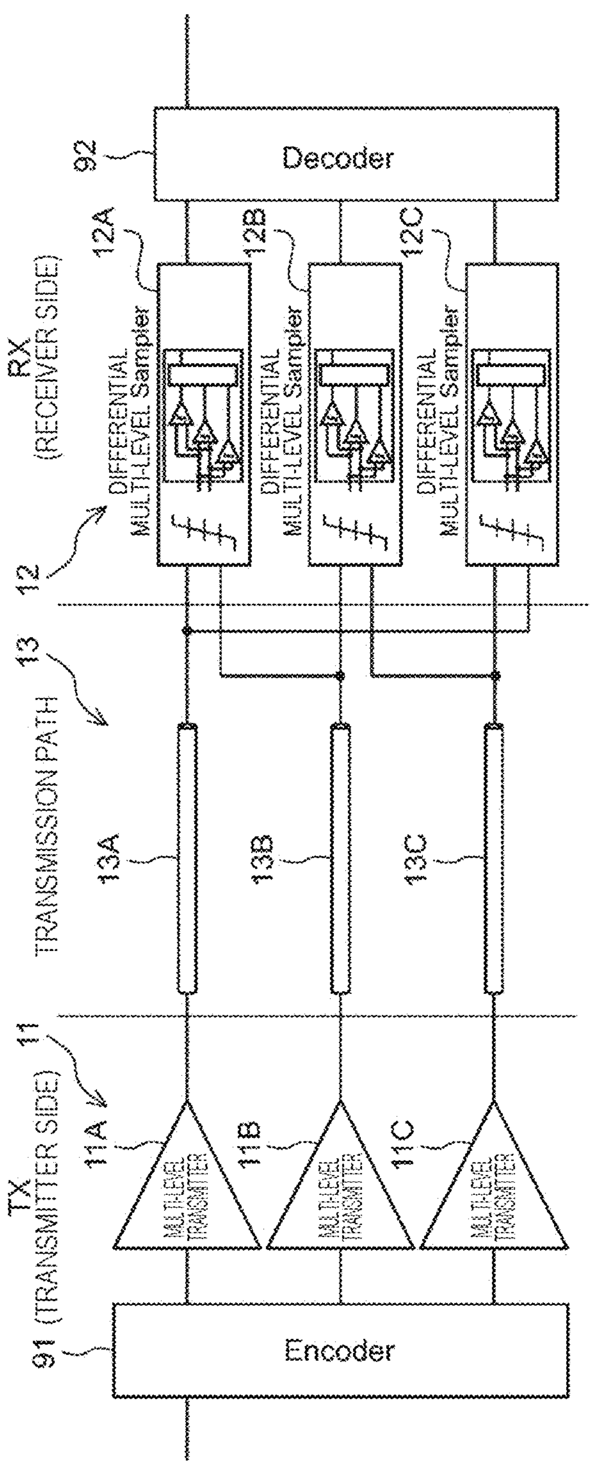
FIG. 21 is a diagram illustrating an example of configuration of a third mode of the receiver in FIG. 1.

FIG. 21 is a diagram illustrating an example of configuration of a third mode of the receiver 12 in FIG. 1. A data transmission system in FIG. 21 is a three-line differential communication system employed in a data transfer standard such as MIPI C-PHY, and the transmitter 11 is a multi-level output driver that outputs a transmission signal of N multiple levels (voltage levels) (a multi-level signal of the number of states N). Note that it is assumed that the number of states N is 4. The transmitter 11 includes three transmitters 11A to 11C that output transmission signals of N multiple levels, and causes the receiver 12 to recognize the N multiple levels on the basis of a difference signal (differential signal) between the transmission signal output from the transmitter 11A and the transmission signal output from the transmitter 11B, a difference signal between the transmission signal output from the transmitter 11B and the transmission signal output from the transmitter 11C, and a difference signal between the transmission signal output from the transmitter 11C and the transmission signal output from the transmitter 11A. The encoder 91 generates M-bit (control value M) control signals cont(0) to cont(M−1) for converting data to be transmitted to the receiver 12 into a multi-level signal, and supplies the generated control signals to each of the transmitters 11A to 11C. Since the number of states N is 4 in the present description, the control value M is 2. The transmitters 11A to 11C of the transmitter 11 generate and output multi-level signals on the basis of the control signals cont(0) to cont(M−1), respectively, from the encoder 71. The transmission path 13 includes transmission paths 13A to 13C, and the transmission path 13A transmits, to the receiver 12, the multi-level signal output from the transmitter 11A. The transmission path 13B transmits, to the receiver 12, the multi-level signal output from the transmitter 11B. The transmission path 13C transmits, to the receiver 12, the multi-level signal output from the transmitter 11C.

The receiver 12 includes three differential multi-level samplers 12A to 12C. The differential multi-level samplers 12A to 12C each have the configuration of the receiver 12 including the samplers 82A to 82C in FIG. 20. The transmission signals (multi-level signals) from the transmitters 11A and 11B are input to the differential multi-level sampler 12A, and the multiple levels (voltage levels) of the difference signal are detected on the basis of the difference signals. The transmission signals (multi-level signals) from the transmitters 11B and 11C are input to the differential multi-level sampler 12B, and the multiple levels (voltage levels) of the difference signal are detected on the basis of the difference signals. The transmission signals (multi-level signals) from the transmitters 11C and 11A are input to the differential multi-level sampler 12C, and the multiple levels (voltage levels) of the difference signal are detected on the basis of the difference signals. The decoder 92 detects multiple levels (voltage levels) on the basis of output values of the samplers 12A to 12C, and decodes, on the basis of the detected multiple levels, the multiple levels into data before conversion into the multi-level signal performed by the encoder 91 and the transmitter 11.

<Comparison between Transmitter 11 to Which Present Technology Is Applied and Comparative Technologies 1 and 2>

FIG. 22 is a list illustrating a result of comparison between the transmitter 11 (the transmitter 11-1 in FIG. 2) to which the present technology is applied and comparative technologies 1 and 2. Comparative technology 1 is a technique of a transmitter disclosed in JP 5-336174 A and WO 2011/045830 A of Patent Documents 1 and 2. Comparative technology 2 is a technique of a transmitter disclosed in JP 10-303994 A and JP 11-154859 A.

Figure 23:
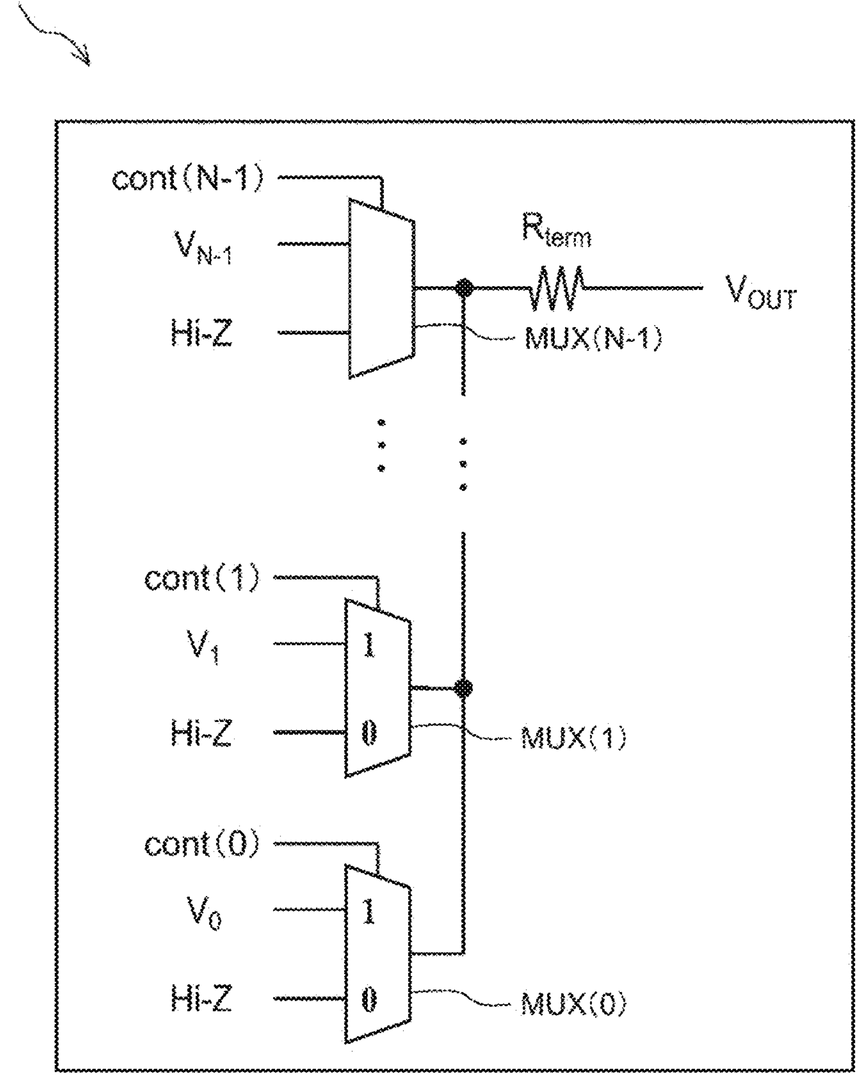
FIG. 23 is a schematic diagram of a transmitter in comparative technology 1.

FIG. 23 is a schematic diagram of a transmitter in comparative technology 1. In FIG. 23, a transmitter 401 outputs a transmission signal of N multiple levels (a multi-level signal of the number of states N). The transmitter 401 includes multiplexers (selectors) MUX(0) to MUX(N−1) and an output resistor $R_{term}$. The multiplexers MUX(0) to MUX(N−1) each include a first input terminal, a second input terminal, an output terminal, and a selection terminal. Among the first input terminal and the second input terminal of each of the multiplexers MUX(0) to MUX(N−1), a terminal internally connected to the output terminal is switched in accordance with the value (0 or 1) of the control signals cont(0) to cont(N−1) input to the selection terminal. Note that it is assumed that the first input terminal is connected to the output terminal in a case where the value of the control signal cont is 0, and the second input terminal is connected to the output terminal in a case where the value of the control signal cont is 1. Voltages $V_0$ to $V_{N-1}$ of multi-level signals with the state numbers n of 0 to N−1 are applied to the first input terminals of the multiplexers MUX(0) to MUX(N−1), respectively, and a high impedance element is connected to the second input terminals. According to this, in a case where a multi-level signal of the voltage $V_n$ of the state number n is output from the transmitter 401, the value of the control signal cont(n) input to the selection terminal of the multiplexer MUX(n) is set to 0, and the voltage $V_n$ applied to the first input terminal is output from the output terminal of the multiplexer MUX(n). For the multiplexers other than the multiplexer MUX(n), the value of the control signal is set to 1, and a high impedance element is connected to the output terminals. As a result, a multi-level signal of the voltage $V_n$ of the state number n is output from the output terminal $V_{OUT}$ of the transmitter 401 as a transmission signal.

Figure 24:
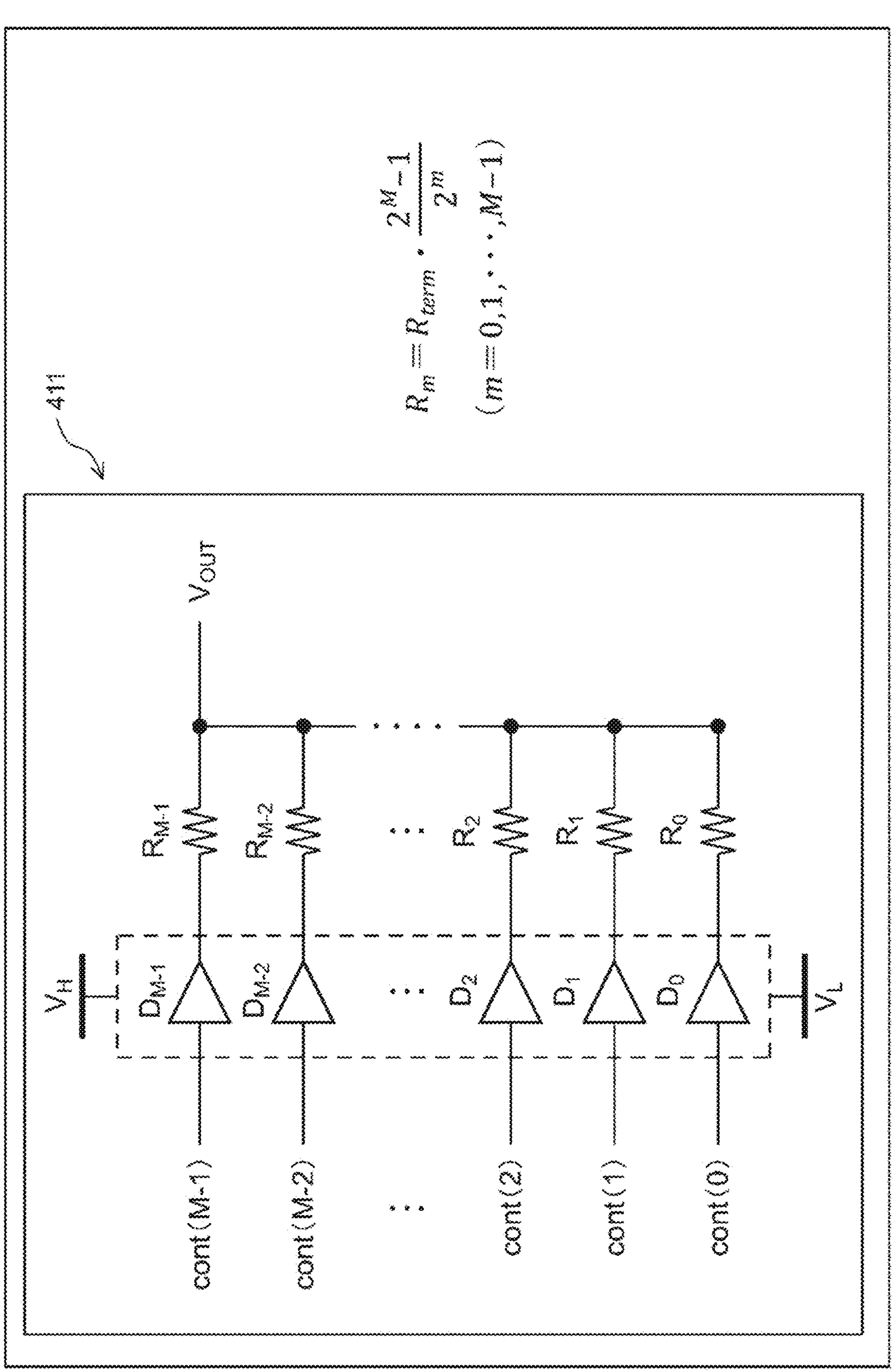
FIG. 24 is a schematic diagram of a transmitter in comparative technology 2.

FIG. 24 is a schematic diagram of a transmitter in comparative technology 2. In FIG. 24, a transmitter 411 has the same circuit configuration as the transmitter 11-1 in the first mode illustrated in FIG. 2, and parts corresponding to those of the transmitter 11-1 in FIG. 2 are given the same reference numerals. Output resistors $R_0$ to $R_{M-1}$ in the transmitter 411, however, are different from the transmitter 11-1 in the first mode, and are determined by the following Expression (4).

[Math. 4]

$$R_m = R_{term} \cdot \frac{2^M - 1}{2^m} \quad (m = 0, 1 \cdots, M-1) \tag{4}$$

The transmitter 401 of comparative technology 1 and the transmitter 411 of comparative technology 2 described above will be compared with the transmitter 11 to which the present technology is applied. As indicated by a first row in FIG. 22, the transmitter 401 of comparative technology 1 requires a power supply that supplies, to the transmitter 401, voltages $V_0$ to $V_{N-1}$ as many as the number N (the number of states N) of multiple levels of a multi-level signal. Furthermore, it is necessary to supply, to the transmitter 401, control signals cont(0) to cont(N−1) as many as the number of states N. Circuit area therefore increases.

The transmitter 11 (11-1) of the present technology illustrated in FIG. 2, on the other hand, only needs to include two power supplies that supply the low voltage $V_L$ and the high voltage $V_H$ to the transmitter 11 regardless of the number of states N. Furthermore, since the transmitter 11 of the present technology does not require multiplexers, control signals for controlling the multiplexers are also unnecessary. The circuit area, therefore, can be reduced.

Figures 25, 26:
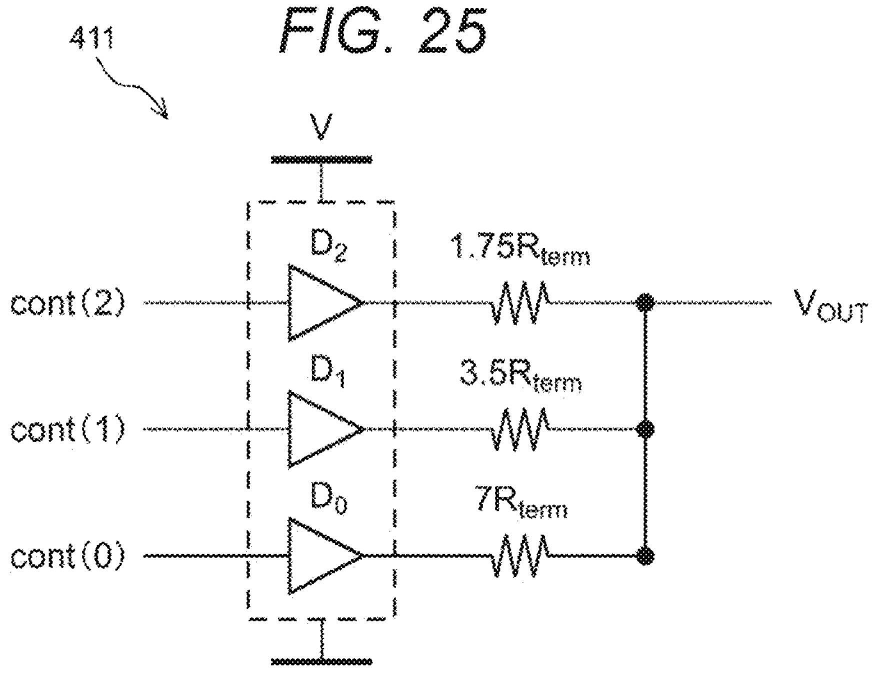
FIG. 25 is a diagram illustrating configuration of the transmitter in comparative technology 2 in a case where the number of states is 7.
FIG. 26 is a diagram illustrating operation of the transmitter in FIG. 25.

As indicated by a sixth row in FIG. 22, in the transmitter 411 of comparative technology 2, voltage ranges of the low voltage $V_L$ and the high voltage $V_H$ cannot be used to the maximum as multiple levels of a multilevel signal. For example, FIG. 25 illustrates configuration of the transmitter 411 that outputs a multi-level signal with the number of states N of 7. The control value M is three. Resistance values of output resistors $R_0$ to $R_2$ of control numbers 0 to 2 represented by resistance values $7R_{term}$, $3.5R_{term}$, and $1.75R_{term}$ are values calculated by the above Expression (4).

Figure 27:
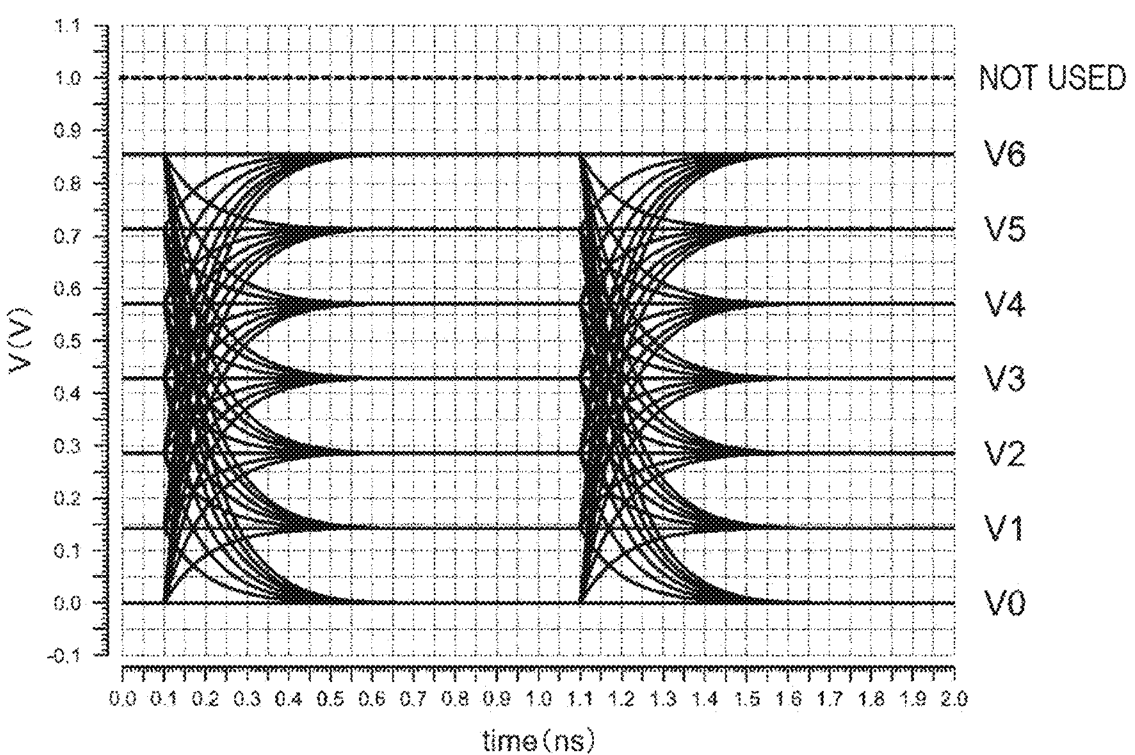
FIG. 27 is a graph illustrating temporal changes in output voltage of the transmitter in FIG. 25.

FIG. 26 is a diagram illustrating operation of the transmitter 411 in FIG. 25. In FIG. 26, signal numbers X of 0 to 7 are shown in a leftmost column. The signal number X is a value obtained by representing 3-bit digital data indicated by the control signals cont(0) to cont(2) in a decimal number. In each of rows of the signal numbers X, the values (0 or 1) of the control signals cont(0) to cont(2) and the normalized output voltage $V_n$ of the state number n output from the output terminal $V_{OUT}$ are shown. According to this, every time the signal number X increments from 0 by 1, the state number n increments by 1, and the normalized output voltage $V_n$ increases by 1/7 at equal intervals. In a case where the number of states N is 7, output voltages $V_0$ to $V_6$ of the state numbers n of 0 to 6 for a case where the signal number X is 0 to 6 are used as voltage levels of a multi-level signal, and an output voltage $V_7$ of the state number n of 7 for a case where the signal number X is 7 is not used in order to maintain a constant interval between possible voltage levels of the multi-level signal. FIG. 27 illustrates temporal changes in the normalized output voltage $V_{OUT}$ in a case where the output voltage $V_n$ of any control number n (0 to 6) changes to the output voltage $V_n$ of another control number n (0 to 6) with a horizontal axis representing time and a vertical axis representing the normalized output voltage $V_{OUT}$. Furthermore, FIG. 27 illustrates a state in which the normalized output voltage $V_{OUT}$ has transitioned to the normalized output voltages $V_0$ to $V_6$ of the control numbers 0 to 6 over a certain period of time after the control signals cont(0) to cont(2) were changed at 0.1 (ns) and 1.1 (ns).

The transmitter 411 of prior art 2 corresponds to a case where the number of states N is a value different from a power of 2 by determining the resistance values of the output resistors $R_0$ to $R_{M-1}$ of each control number m while assuming a case where the number of states N is a power of 2 (M-th power) and by not using the output voltage of one of the state numbers 0 to N−1. In the example of configuration in FIG. 25, the resistance values of the output resistors $R_0$ to $R_{M-1}$ of the control numbers 0 to 2 are determined on an assumption that the number of states N is 8 (the cube of 2). As can be seen from FIGS. 26 and 27, the transmitter 411 with the number of states N of 7 is obtained by using only the output voltages $V_0$ to $V_6$ of the state numbers 0 to 6 among the state numbers 0 to 7. The normalized output voltages $V_0$ to $V_6$ of the state numbers 0 to 6 indicate values at regular intervals, but since the normalized output voltage $V_7$ of the state number 7 is not used, 1, which is an original maximum value of the normalized output voltage, is not used as for the multi-level signal. In a case where the low voltage $V_L$ is 0 (volts) and the high voltage $V_H$ is V (volts), for example, a difference between a minimum voltage and a maximum voltage of the multi-level signal output from the transmitter 411 is (6/7)·V (volts). A voltage loss of approximately 14%, therefore, is involved as suggested in a seventh row in FIG. 22. Signal amplitude is a parameter directly linked to reception availability on a receiver side, and even if the signal amplitude is increased by boosting the voltage V, for example, it is disadvantageous in terms of power.

The circuit configuration and the operation in a case where the number of states N is 7 in the transmitter 11 in the present technology, on the other hand, are as described with reference to FIGS. 4 to 6, and the voltage range between the low voltage $V_L$ and the high voltage $V_H$ is maximally used as the multilevel levels of the multi-level signal. In a case where the low voltage $V_L$ is 0 (volts) and the high voltage $V_H$ is V (volts), for example, the output voltage $V_3$ of the state number 3 overlaps at (3/6)·V in a case where the signal number X is 3 and 4 as illustrated in FIGS. 5 and 6. Furthermore, the resistance values of the output resistors $R_0$ to $R_{M-1}$ of the control numbers 0 to 2 are set such that the output voltages $V_0$ to $V_6$ of the state numbers 0 to 6 become six voltage levels obtained by equally dividing (dividing into five equal parts) the voltage range from 0 (volts) to V (volts). The transmitter 11 of the present technology, therefore, can output a multi-level signal using the entire voltage range between 0 (volts) and V (volts) even in a case where the number of states N is a value different from a power of 2, and there is no disadvantage such as a voltage loss as in the transmitter 411 of prior art 2.

Furthermore, in the transmitter 401 of comparative technology 1, as indicated by an eighth row in FIG. 22, it is necessary to prepare control signals to be supplied to the transmitter 401 in accordance with the number of states N (the number N of multiple levels) of the multi-level signal, which is disadvantageous in terms of AC power and unsuitable for speeding up due to wiring capacitance.

In the transmitter 11 in the present technology, on the other hand, as indicated by eighth and ninth rows in FIG. 22, the number of high-speed signal lines for supplying control signals to the transmitter 11 may be equal to the control value M, which is advantageous to the transmitter 401 of comparative technology 1 in terms of high speed and AC power. Furthermore, in a case where differential transmission is performed using the transmitter 11 of the present technology, a control signal for an inversion driver can be easily achieved by inverting of the control signal cont, and control logic can be simplified. In this respect, the transmitter 11 of the present technology is more advantageous in terms of AC power than the transmitter 411 of comparative technology 2.

Note that the above comparison between the transmitter 11 of the present technology and comparative technologies 1 and 2 is not limited to the first mode of the transmitter 11, and also applies to other modes such as second and third modes, which will be described hereinafter.

<<Second Mode of Transmitter 11

Figure 28:
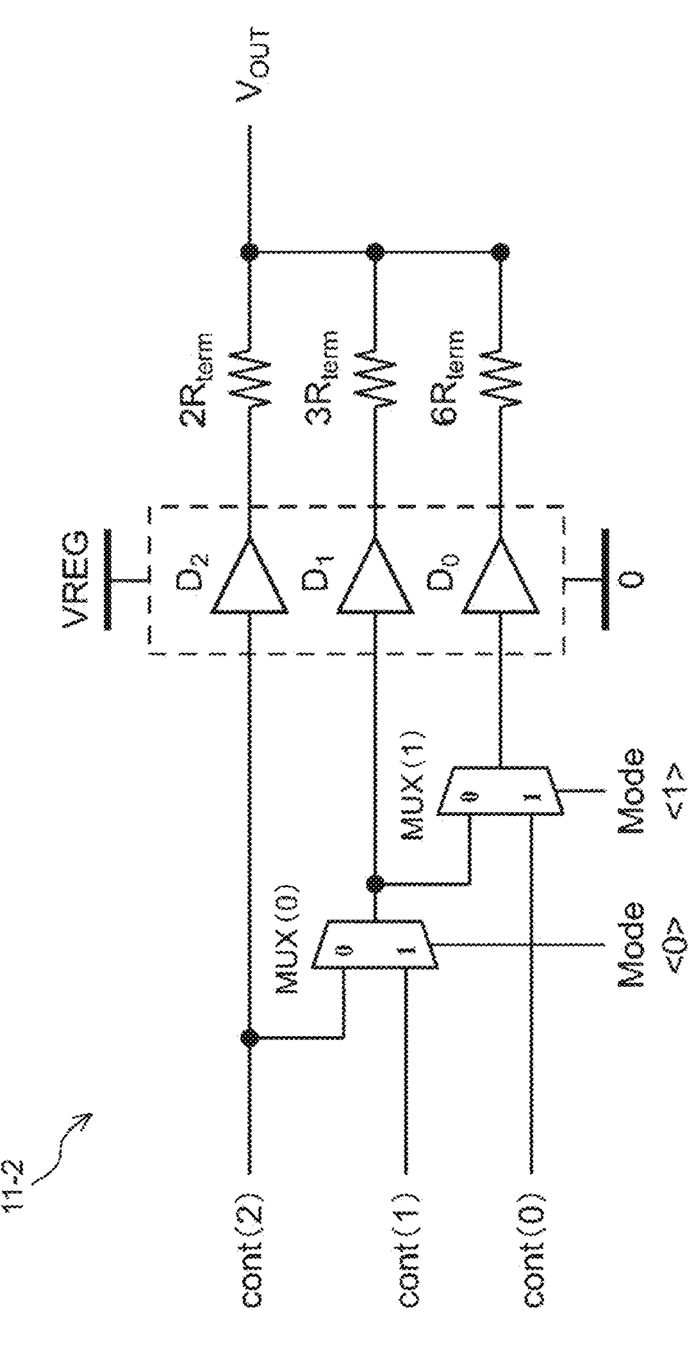
FIG. 28 is a diagram illustrating an example of configuration of a second mode of the transmitter in FIG. 1.

FIG. 28 is a diagram illustrating an example of configuration of the second mode of the transmitter 11 in FIG. 1. A transmitter 11-2 in the second mode in FIG. 28 has a configuration in which the number of states N can be set or changed to any of 7, 3, and 2. The transmitter 11-2 includes drivers $D_0$ to $D_2$, output resistor $R_0$ to $R_2$ indicated by resistance values $6R_{term}$, $3R_{term}$, and $2R_{term}$, and multiplexers MUX (0) and MUX(1). An output terminal of the multiplexer MUX(1) is connected to an input terminal of the driver $D_0$, and an output terminal of the multiplexer MUX(0) is connected to an input terminal of the driver $D_0$. A control signal cont(2) is input to an input terminal of the driver $D_2$. A low voltage $V_L$ and a high voltage $V_H$ are applied to the drivers $D_0$ to $D_2$, respectively. In the present mode, it is assumed that the low voltage $V_L$ is a GND potential (0) and the high voltage $V_H$ is $V_{REG}$. Output terminals of the drivers $D_0$ to $D_2$ are connected to an output terminal $V_{OUT}$ (transmission line through which a multi-level signal is transmitted) as the transmitter 11-2 via the output resistors $R_0$ to $R_2$, respectively. The multiplexers MUX(0) and MUX(1) each include a first input terminal, a second input terminal, an output terminal, and a selection terminal. Among the first input terminal and the second input terminal of each of the multiplexers MUX(0) and MUX(1), a terminal internally connected to the output terminal is switched in accordance with a values (0 or 1) of selection signals (mode values) Mode<0> and Mode<1> input to the selection terminal. Note that in a case where the mode value Mode<0> is 0, the first input terminal denoted as "0" is connected to the output terminal, and in a case where the mode value Mode<0> is 1, the second input terminal denoted as "1" is connected to the output terminal. The control signal cont(2) is input to the first input terminal of the multiplexer MUX(0), and the control signal cont(1) is input to the second input terminal. The output terminal of the multiplexer MUX(0) is connected to the input terminal of the driver $D_1$ and is connected to the first input terminal of the multiplexer MUX(1). The control signal cont(0) is input to the second input terminal of the multiplexer MUX (1), and the output terminal of the multiplexer MUX(1) is connected to the input terminal of the driver $D_0$.

Here, it is assumed that the mode values Mode<0> and Mode<1> are each set to 0 or 1. Furthermore, a bit in the 1 digit (first digit) among bits of two digits is set as a value of the mode value Mode<0>, and a bit in the 2 digit (second digit) is set as a value of the mode value Mode<1>. At this time, a mode value of a two-digit binary number is represented as Mode<1:0>, and is mainly represented as a decimal number. In a case where both the mode values Mode<0> and Mode<1> are 1 and the mode value Mode<1:0> is 3, the control signals cont(0) to cont(2) are input to the drivers $D_0$ to $D_2$, respectively. The transmitter 11-2, therefore, operates similarly to the transmitter 11-1 illustrated in FIG. 4, and outputs a multi-level signal with the number of states N of 7. FIG. 29 is a diagram illustrating operation of the transmitter 11-2 in a case where the mode value Mode<1:0> is 3. FIG. 29 illustrates a relationship between the value of each of the control signals cont(0) to cont(2) and the output voltage $V_{OUT}$ of the transmitter 11-2. In FIG. 29, the signal number X at a time of values of the control signals cont(0) to cont(2) in each row increments from 0 to 7 by 1 in order from the top. In a case where the signal number X is 0 to 3, the output voltage $V_{OUT}$ increments from 0 by $(1/6) \cdot V_{REG}$. In a case where the signal number X is 3 and 4, since the output voltage $V_{OUT}$ overlaps at (3/6) $V_{REG}$, the state number n does not change. In a case where the signal number X is 4 to 7, the output voltage $V_{OUT}$ increments from (3/6) $V_{REG}$ to $V_{REG}$ by $(1/6) \cdot V_{REG}$. In a case where the mode value Mode<1:0> is 3, therefore, the transmitter 11-2 outputs a multi-level signal with the number of states N of 7.

In a case where the mode value Mode<0> is 1 and the mode value Mode<1> is 0, the mode value Mode<1:0> is 1. In this case, control signals cont(1) and cont(2) are input to the drivers $D_1$ and $D_2$, respectively. The control signal cont(1), on the other hand, is input to the driver $D_0$. FIG. 30 is a diagram illustrating operation of the transmitter 11-2 in a case where the mode value Mode<1:0> is 1. FIG. 30 illustrates a relationship between the value of each of the control signals cont(0) to cont(2) and the output voltage $V_{OUT}$ of the transmitter 11-2. In a case where the mode value Mode<1:0> is 1, the same value (the value of the control signal cont(1)) is always input to the drivers $D_0$ to $D_1$ regardless of the value of the control signal cont(0), and it can be regarded that one of the values of the control signals cont(0) to cont(2) of the signal number X of 0, 3, 4, and 7 in FIG. 29 in a case where the mode value <1:0> is 3 is input to the drivers $D_0$ to $D_2$. Rows in FIG. 30 indicate the values of the control signals cont(1) and cont(2) in a case where the signal number X is 0, 3, 4, and 7 and the output voltage $V_{OUT}$ of the transmitter 11-2 in order from the top. In a case where the signal number X is 3 and 4, since the output voltage $V_{OUT}$ overlaps at (3/6) $V_{REG}$, the transmitter 11-2 outputs a multi-level signal with the number of states N of 3 in a case where the mode value Mode<1:0> is 1.

In a case where the mode value Mode<0> is 0 and the mode value Mode<1> is 0, the mode value Mode<1:0> is 0. In this case, the control signal cont (2) is input to all of the drivers $D_0$ to $D_2$. FIG. 31 is a diagram illustrating operation of the transmitter 11-2 in a case where the mode value Mode<1:0> is 0. FIG. 31 illustrates a relationship between the value of the control signal cont(2) and the output voltage $V_n$ of the transmitter 11-2. In a case where the mode value Mode<1:0> is 0, the same value (the value of the control signal cont(2)) is always input to the drivers $D_0$ to $D_2$ regardless of the values of the control signals cont(0) and cont(1), and it can be regarded that one of the values of the control signals cont(0) to cont(2) of the signal number X of 0 and 7 in FIG. 29 in a case where the mode value <1:0> is 3 is input to the drivers $D_0$ to $D_2$. Rows in FIG. 31 indicate the values of the control signal cont (2) when the control number X is 0 and 7 and the output voltage $V_{OUT}$ of the transmitter 11-2 in order from the top. Since the output voltage $V_{OUT}$ are 0 and $V_{REG}$ in a case where the signal number X is 0 and 7, respectively, the transmitter 11-2 outputs a multi-level signal with the number of states N of 2 in a case where the mode value Mode<1:0> is 0.

With the transmitter 11-2 in the second mode, since the output resistors $R_0$ to $R_2$ indicated by the resistance values $6R_{term}$, $3R_{term}$, and $2R_{term}$ correspond to the output resistors $R_0$ to $R_2$ of the control numbers 0 to 2 in the control value 7 in FIG. 3 in a case where the mode value Mode<1:0> is 3, the number of states N of the transmitter 11-2 is set to 7. In a case where the mode value Mode<1:0> is 1, since the output resistors $R_0$ and $R_1$ are connected in parallel with each other and the resistance values thereof become $2R_{term}$, the output resistors $R_0$ and $R_1$ correspond to the output resistor $R_0$ of the control number 0 in the control value 3 in FIG. 3. The output resistor $R_2$ corresponds to the output resistor $R_1$ of the control number 1 in the control value 3 in FIG. 3. It is assumed that the control signal cont(1) and the control signal cont(2) in FIG. 28 are used as the control signal cont(0) and the control signal cont(1) of the control numbers 0 and 1 in FIG. 3. The number of states N of the transmitter 11-2, therefore, is set to 3. Note that the output resistors $R_0$ and $R_1$ may correspond to the output resistor $R_1$ of the control number 1 in the control value 3 in FIG. 3, and the output resistor $R_2$ may correspond to the output resistor $R_0$ of the control number 0 in the control number 3 in FIG. 3. In a case where the mode value Mode<1:0> is 0, since the output resistors $R_0$ to $R_2$ are connected in parallel with one another and the resistance values thereof become $R_{term}$, the output resistors $R_0$ to $R_2$ correspond to the output resistor $R_0$ of the control number 0 in the control value 2 in FIG. 3. The number of states N of the transmitter 11-2, therefore, is set to 2. It is assumed that the control signal cont(2) in FIG. 28 is used as the control signal cont(0) of the control number 0 in FIG. 3. As described above, the resistance value of the output resistor of each control number can be changed or the control value can be changed by setting control signals to be input to a plurality of drivers to control signals of different control numbers (control numbers whose values are independently determined) or by setting a subset or all of the control signals to control signals of the same control number. As a result, the number of states N can be changed.

<<Third Mode of Transmitter 11

Figure 32:
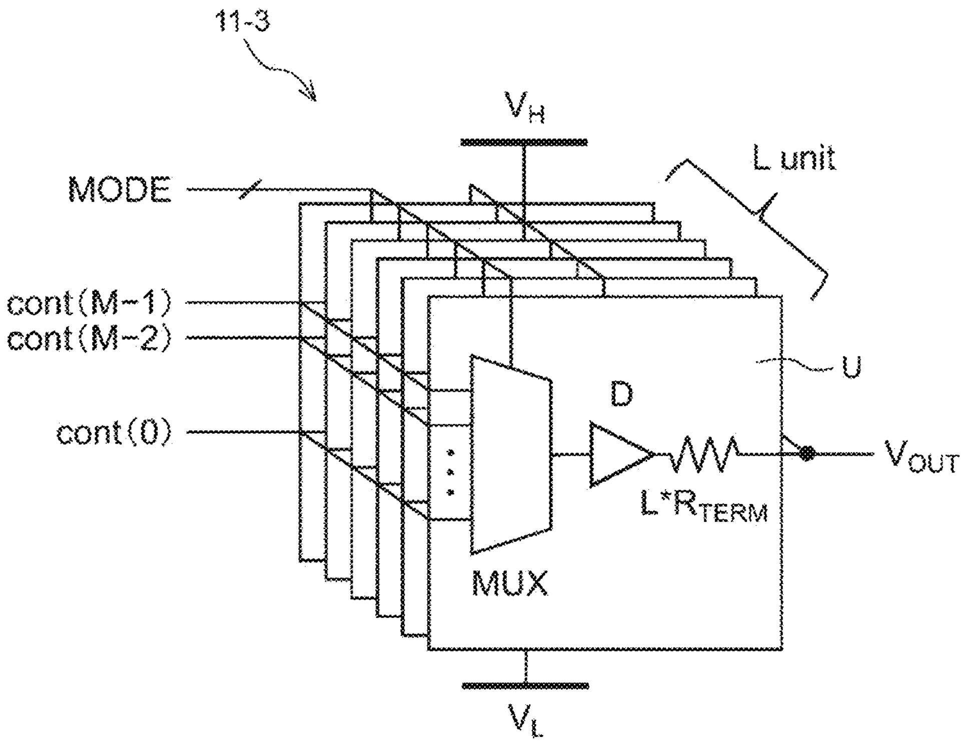
FIG. 32 is a diagram illustrating an example of configuration of a third mode of the transmitter in FIG. 1.

FIG. 32 is a diagram illustrating an example of configuration of the third mode of the transmitter 11 in FIG. 1. A transmitter 11-3 in the third mode in FIG. 32 has a configuration in which the number of states N can be changed as with the transmitter 11-2 in the second mode in FIG. 28. Furthermore, in the third mode, a plurality of (L) units U having the same circuit configuration and circuit characteristics in which a unit driver D, a unit resistor $L \cdot R_{term}$, and the like are mounted as in the units 41 in the first example of the transmitter 11-1 in the first mode in FIG. 10 are connected in parallel with one another. Note that, as described above, the unit driver D and the unit resistor $L \cdot R_{term}$, which is an output resistor of the unit driver D, may be regarded as representing an equivalent circuit of one unit driver D. A multiplexer MUX is mounted on each unit U, and units U that perform the same operation are set or changed by the multiplexers MUX on the basis of control signals of the same control number. As a result, a unit driver including one or a plurality of units U is configured as with the unit drivers 31-0 to 31-2 in FIG. 10, and the number of unit drivers and the number of units U constituting the unit driver can be changed. Since the number of unit drivers (referred to as unit drivers of the control numbers m) in which the unit drivers D are controlled on the basis of control signals of different control numbers m and the resistance values $R_m$ of the output resistors $R_m$ of the control numbers m configured by the output resistors $L \cdot R_{term}$ connected in parallel with one another in the unit driver of each control number m can be changed, the number of states N of a multi-level signal output by the transmitter 11-3 can be changed.

In FIG. 32, the transmitter 11-3 includes the plurality of (L) units U. The units U have the same circuit configuration and circuit characteristics, and each unit U is configured by mounting the unit driver D, the unit resistor $L \cdot R_{term}$ indicated by a resistance value $L \cdot R_{term}$, and the multiplexer MUX on one IC chip or one substrate. Each unit U includes input terminals (a first input terminal to an M-th input terminal) to which control signals cont(0) to cont(M−1) to the unit driver D are input via the multiplexer MUX, an output terminal that outputs an output voltage from an output side (a side opposite a contact with the unit driver D) of the unit resistor $L \cdot R_{term}$, a selection terminal to which a selection signal (mode value) for controlling the multiplexer MUX is input, a high voltage terminal to which the high voltage $V_H$ is applied, and a low voltage terminal to which the low voltage $V_L$ is applied. Connecting the units U in parallel with one another means that terminals of the same type other than the selection terminal are connected to the same line. The first input terminal to the M-th input terminal of each unit U are connected to terminals (supply lines through which control signals are transmitted) of a logic circuit that outputs the control signals cont(0) to cont(M−1), respectively. The output terminal of each unit U is connected to an output terminal $V_{OUT}$ (a transmission line through which a multi-level signal is transmitted) as the transmitter 11-3. The high voltage terminal of each unit U is connected to a terminal of a circuit that outputs the high voltage $V_H$. The low voltage terminal of each unit U is connected to a terminal (including a GND terminal) of a circuit that outputs the low voltage $V_L$. The selection terminal of each unit U is connected to one of a plurality of terminals of a logic circuit that outputs selection signals (mode values) of a plurality of types.

(Relationship Between Number of States N and L)

Here, a relationship between the number of states N and L will be described. Each of a plurality of control signals supplied by a plurality of supply lines will be denoted by a different control number m hereinafter, and a combined resistor in a case where output resistors connected between one or a plurality of unit drivers D to which a control signal cont(m) is input and an output terminal $V_{OUT}$ are connected in parallel with one another will be referred to as an output resistor $R_m$ of the control number m. Furthermore, the unit driver D to which the control signal cont(m) is supplied and the unit U including the unit driver D will also be referred to as the unit driver D of the control number m and the unit U of the control number m, respectively.

As can be seen from the above Expression (1) and FIG. 3, in a case where the transmitter 11-3 (the transmitter 11-3 with the number of states N) that outputs a multi-level signal with the number of states N, the control value M is determined as a value that satisfies $2^{M-1}<N\leq 2^M$ (or $\log_2 N\leq M<\log_2 N+1$). That is, the control value M is determined as the minimum power of 2 that is larger than or equal to the number of states N. The output resistor $R_m$ of the control number m has a resistance value in a case where an integral number of output resistors (hereinafter referred to as unit resistors $(N-1)\cdot R_{term}$) having a resistance value $(N-1)\cdot R_{term}$ are connected in parallel with one another. More specifically, with respect to the control value M, the output resistors $R_m$ of the control numbers m (0 to M−2) other than the control number M−1 have resistance values in a case where $2^m$ (1, 2, 4, 8, . . . ) unit resistors $(N-1)$ $R_{term}$ are connected in parallel with one another. Note that the total number of unit resistors $(N-1)\cdot R_{term}$ constituting the output resistors $R_m$ with the control numbers m of 0 to M−2 is $(2^{M-1}-1)$.

The output resistor $R_m$ of the control number M−1 has a resistance value in a case where $(N-2^{M-1})$ unit resistors $(N-1)\cdot R_{term}$ are connected in parallel with one another, and the number of unit resistors $(N-1)\cdot R_{term}$ constituting the output resistor $R_m$ of the control number M−1 also increments by one each time the number of states N increments by one from $2^{M-1}+1$ to $2^M$. The total number of unit resistors $(N-1)$ $R_{term}$ required in the case of the number of states N is $(2^{M-1}-1)+(N-2^{M-1})=(N-1)$, which matches a coefficient of $R_{term}$ of the unit resistors $(N-1)\cdot R_{term}$.

In a case where N−1 is set to L, therefore, the transmitter 11-3 with the number of states N(=L+1) can be configured by using a total of L units U including the unit resistors $L \cdot R_{term}$ as the output resistors of the unit drivers D. Since the resistance value $R_{term}$ is not limited to a specific value as described above, however, the unit resistors $L \cdot R_{term}$ may have any resistance value. The transmitter 11-3 with the number of states N(=L+1), therefore, can be configured by using L units U including unit resistors having any resistance values as the output resistors of the unit drivers D. In other words, in a case where the transmitter 11-3 with the number of states N is configured, N−1 units U are required.

If, by the way, a ratio of the resistance value $R_m$ of the output resistor $R_m$ of each control number m matches a ratio with any number of states N in FIG. 3, the transmitter 11-3 with the number of states N is configured. The number of states N of the transmitter 11-3 can be changed to the number of states other than L+1 by changing, using the multiplexer MUX, the number of unit resistors $L \cdot R_{term}$ constituting the output resistor $R_m$ of each control number m with respect to a total of predetermined L unit resistors $L \cdot R_{term}$ (units U) of the transmitter 11-3.

For example, the transmitter 11-3 with the number of states N of 7 has the control value M of 3 and L of 6, and includes a total of six unit resistors $6 \cdot R_{term}$ (units U). In this case, the total of six unit resistors $6 \cdot R_{term}$ include one unit resistor $6 \cdot R_{term}$ of the control number 0, two unit resistors $6 \cdot R_{term}$ of the control number 1, and three unit resistors $6 \cdot R_{term}$ of the control number 2. As a result, the resistance values $R_m$ of the output resistors $R_m$ with the control numbers m of 0 to 2 are set to $6 \cdot R_{term}$, $\mathbf{3} \cdot R_{term}$, and $\mathbf{2} \cdot R_{term}$, respectively.

The transmitter 11-3 with the number of states N of 7, on the other hand, can set to the number of states N of 4, 3, or 2 by changing the number of unit resistors $6 \cdot R_{term}$ of each control number m without changing the total number of units U.

In a case where the number of states N of the transmitter 11-3 is set to 4, the total of six unit resistors $6 \cdot R_{term}$ include two unit resistors $6 \cdot R_{term}$ of the control number 0, four unit resistors $6 \cdot R_{term}$ of the control number 1, and zero unit resistors $6 \cdot R_{term}$ of the control number 2. As a result, the resistance values $R_m$ of the output resistors $R_m$ with the control numbers m of 0 to 2 are set to $3 \cdot R_{term}$, $1.5 \cdot R_{term}$, and $\infty$, respectively.

In a case where the number of states N of the transmitter 11 is set to 3, the total of six unit resistors $6 \cdot R_{term}$ include three unit resistors $6 \cdot R_{term}$ of the control number 0, three unit resistors $6 \cdot R_{term}$ of the control number 1, and zero unit resistors $6 \cdot R_{term}$ of the control number 2. As a result, the resistance values $R_m$ of the output resistors $R_m$ with the control numbers m of 0 to 2 are set to $2 \cdot R_{term}$, $2 \cdot R_{term}$, and $\infty$, respectively.

In a case where the number of states N of the transmitter 11 is set to 2, the total of six unit resistors $6 \cdot R_{term}$ include six unit resistors $6 \cdot R_{term}$ of the control number 0, zero unit resistors $6 \cdot R_{term}$ of the control number 1, and zero unit resistors $6 \cdot R_{term}$ of the control number 2. As a result, the resistance values $R_m$ of the output resistors $R_m$ with the control numbers m of 0 to 2 are set to $1 \cdot R_{term}$, $\infty$, and $\infty$, respectively.

Furthermore, inclusion of a total of L unit resistors $L \cdot R_{term}$ can be regarded as equivalent to inclusion of a total of Ld unit resistors $Ld \cdot R_{term}$ by connecting L/Ld unit resistors $L \cdot R_{term}$ in parallel with one another, where an arbitrary divisor of L is denoted by Ld. The number of states N of the transmitter 11-3 with the number of states N of L+1, therefore, can be set to Ld+1. As described above, in a case where the number of states N is 7, since L is 6, the number of states N can be changed to 2, 3, or 4, which are obtained by adding 1 to 1, 2, or 3 that are divisors of 6. As an example of a case where the number of states N is other than 7, for example, in a case where the number of states N is 31, L is 30, and the divisor Ld of 30 is 1, 2, 3, 5, 6, 10, or 15. The number of states N, therefore, can be changed to 2, 3, 4, 6, 7, 11, or 16. In a case where the number of states N is set to 31, for example, a total of thirty unit resistors $30 \cdot R_{term}$ include one unit resistor $30 \cdot R_{term}$ of the control number 0, two unit resistors $30 \cdot R_{term}$ of the control number 1, four unit resistors $30 \cdot R_{term}$ of the control number 2, eight unit resistors $30 \cdot R_{term}$ of the control number 3, and fifteenth unit resistors $30 \cdot R_{term}$ of the control number 4. As a result, the resistance values $R_m$ of the output resistors $R_m$ with the control numbers m of 0 to 4 are set to $30 \cdot R_{term}$, $15 \cdot R_{term}$, $7.5 \cdot R_{term}$, $3.75 \cdot R_{term}$, and $2 \cdot R_{term}$, respectively. In a case where the number of states N is set to 11, on the other hand, a total of thirty unit resistors $30 \cdot R_{term}$ include three unit resistor $30 \cdot R_{term}$ of the control number 0, six unit resistors $30 \cdot R_{term}$ of the control number 1, twelve unit resistors $30 \cdot R_{term}$ of the control number 2, nine unit resistors $30 \cdot R_{term}$ of the control number 3, and zero unit resistors $30 \cdot R_{term}$ of the control number 4. As a result, the resistance values $R_m$ of the output resistors $R_m$ with the control numbers m of 0 to 4 are set to $10 \cdot R_{term}$, $5 \cdot R_{term}$, $2.5 \cdot R_{term}$, $3.33 \cdot R_{term}$, and $\infty$, respectively.

Note that, in a case where a transmitter 11-3 whose settable number of states N is N1 to NK (K is a natural number larger than or equal to 2) is configured, a total of L unit resistors $L \cdot R_{term}$ (units U) are used, where L denotes a positive common multiple of N1−1 to NK−1. When L denotes the least common multiple of N1−1 to NK−1, the number of units U can be minimized, but a value obtained by multiplying L, which denotes the least common multiple, by any positive integer (natural number) a may be set as the number of units U. In this case, if the a units U are always treated as units U having the same control number and regarded as one unit U, the resistance value of the unit resistor of the unit U can be set to 1/a, and the resistance value of the unit resistor can be adjusted by the number of units U. For example, although the example of the configuration of the transmitter 11-1 in the first mode illustrated in FIG. 10 is an example in which the number of states N is not changed and is fixed to the number of states of 7, the minimum number of necessary units 41 is 6. In a case where twelve units 42, which are twice as many as the minimum number of necessary units 41, are used, on the other hand, two units 42 are regarded as one unit, and a resistance value of the unit resistor of the unit is set to ½ of the predetermined resistance value of the unit resistor $R_{OUT}$ of each unit 42. As a result, the output resistor of each control number is set to ½ of the case where six units 42 are used.

(Change of Number of States N)

In order to change the control number m of each of the total of L unit resistors $L \cdot R_{term}$ in accordance with the number of states N, the multiplexer MUX is disposed at a preceding stage of the unit driver D of each unit U. The control signals cont(m) with the control numbers m of 0 to M−1 are input to the plurality of input terminals of each unit U. The control value M indicates a maximum value (referred to as a maximum control value M) among required control values for a plurality of numbers of state N that can be set (changed). A selection signal (mode value) for selecting an input terminal to be internally connected to an output terminal of the multiplexer MUX is input to a selection terminal of the multiplexer MUX of each unit U.

In response to the selection signal, the multiplexer MUX outputs, from the output terminal to the unit driver D, one of the control signals cont(m) (m is 0 to M−1) input to the input terminals. In a case where the number of states N is set to Nk, for example, a control value Mk necessary for the number of states Nk is determined on the basis of a relationship between the number of states N and the resistance values $R_m$ of the output resistors $R_m$($R_0$ to $R_{M-1}$) in FIG. 3, and the number L(m) of unit resistors $L \cdot R_{term}$ of each of the control numbers m of 0 to Mk−1 is determined. A coefficient L and the number L of unit resistors $L \cdot R_{term}$ are the sum of the numbers L(m). Note that in a case where the control value Mk is smaller than the maximum control value M, it is assumed that the number L(m) of unit resistors $L \cdot R_{term}$ with the control numbers m of Mk to M−1 is 0. In this case, by interpreting that the control signals cont(m) with the control numbers m of Mk to M−1 are not used, the control value Mk may be regarded as the maximum control value M. The number L(m) of unit resistors $L \cdot R_{term}$ with each of the control numbers m of 0 to M−1 corresponds to the number of multiplexers MUX that output the control signal cont(m) of the control number m among the multiplexers MUX of the L units U. The selection signals, therefore, control L(m) multiplexers MUX such that the L(m) multiplexers MUX output the control signals cont(m) input from the input terminals to the unit drivers D from the output terminals for each of the control numbers m of 0 to M−1. In the transmitter 11-3 whose settable number of states N is 7 and 4, for example, L is 6, and a total of six units U (unit resistors $6 \cdot R_{term}$) are used. The maximum control value M is 3. In a case where the number of states N of the transmitter 11-3 is set to 7, the control value is 3, which is equivalent to the maximum control value M, and the number L(m) of unit resistors $6 \cdot R_{term}$ with the control numbers m of 0 to 2 is 1 to 3. The selection signals, therefore, control the multiplexers MUX of the units U such that one multiplexer MUX outputs the control signal cont(0), two multiplexers MUX output the control signal cont(1), and three multiplexers MUX output the control signal cont(2). Furthermore, in a case where the number of states N of the transmitter 11-3 is set to 4, the control value is 2, which is smaller than 3, which is the maximum control value M, and the numbers L(m) of unit resistors $6 \cdot R_{term}$ with the control numbers m of 0 and 1 are 2 and 4, respectively. The number L(m) of unit resistors $6 \cdot R_{term}$ with the control number m of 2 is 0. The selection signals, therefore, control the multiplexers MUX such that two multiplexers MUX output the control signal cont(0), four multiplexers MUX output the control signal cont(1), and zero multiplexers MUX output the control signal cont (2).

Note that each unit U (multiplexer MUX) of the transmitter 11-3 includes M input terminals to which the control signals cont(0) to cont(M−1) of the control numbers 0 to M−1, the number of which is at least the same as the maximum control value M, are input. Allocation (which control signal is to be input) of the control signals cont(0) to cont(M−1) input to the M input terminals can be appropriately changed by a circuit (logic circuit) in a preceding stage that outputs the control signals cont(0) to cont(M−1). Furthermore, in FIG. 3, the control numbers m of 0 to M−1 are assigned to the output resistors $R_m$ in order, but the control numbers m are used to associate the control signals cont(0) to cont(M−1) for controlling the plurality of drivers (drivers $D_0$ to $D_{M-1}$) input from the input terminals of the unit U with the output resistors $R_m$ of the drivers controlled by the control signals cont(0) to cont(M−1), and may be any numbers. In a case where the transmitter 11-3 is set to the predetermined number of states N and the number of unit resistors $L \cdot R_{term}$ of each of the control numbers 0 to M−1 identified from FIG. 3 is L(0) to L(M−1), therefore, the numbers L(0) to L(M−1) may be rearranged as the numbers for the control numbers 0 to M−1 differently from FIG. 3. In a case where the number of states N of the transmitter 11-3 is set to 7 in the transmitter 11-3 whose settable number of states N is 7 and 4 as in the above-described example, for example, the numbers L(0) to L(2) of unit resistors $6 \cdot R_{term}$ of the control numbers 0 to 2 are 1 to 3, respectively, according to FIG. 3. The numbers L(0) to L(2) of unit resistors $6 \cdot R_{term}$ of the control numbers 0 to 2, on the other hand, may be 1, 3, and 2, respectively. That is, the control numbers 1 and 2 in FIG. 3 may be changed as the control numbers 2 and 1, and the control signals cont(1) and cont(2) of the control numbers 1 and 2 assumed in FIG. 3 may be supplied to each unit U as the control signals cont(2) and cont(1) of the control numbers 2 and 1, instead. Furthermore, in a case where the number of states N of the transmitter 11-3 is set to 4, the numbers L(0) to L(2) of the unit resistors $6 \cdot R_{term}$ of the control numbers 0 to 2 are 2, 4, and 0, respectively. The numbers L(0) to L(2) of unit resistors $6 \cdot R_{term}$ of the control numbers 0 to 2, on the other hand, may be 0, 2, and 4, respectively. In this case, the selection signals, therefore, control the multiplexers such that two multiplexers MUX output the control signal cont (1), four multiplexers MUX output the control signal cont (2), and zero multiplexers MUX output the control signal cont(0).

Here, in a case where the multiplexers MUX are individually controlled, it is necessary to supply selection signals as many as the number (L) of multiplexers MUX. Since the number of selection signals and signal lines increases in this case, the number of selection signals and signal lines may be reduced as follows. Assuming that the maximum control value of the transmitter 11-3 including a total of L unit resistors $L \cdot R_{term}$ is M and the transmitter 11-3 is set to the number of states N, values of the number L(m) in a case where the numbers L(m) of unit resistors $L \cdot R_{term}$ of the control numbers m are arranged in descending order are L(1, N), L(2, N), . . . , L(p, N), . . . , L(P, N) (P is a natural number and $1 \leq P \leq M$) using a number p (p is a natural number). In a case where the settable number of states N of the transmitter 11 is N1 to NK at this time, the minimum value excluding 0 among the numbers L(p, N1) to L(p, NK) of the same number p is assumed to be a minimum number Lmin(p). In a case where the settable number of states N is 7, 4, 3, and 2, for example, the numbers L(2, 7), L(2, 4), and L(2, 3) when the number p is 2 are other than 0 in a case where the number of states N is 7, 4, or 3, but since the number L(2, 2) when the number p is 2 is 0 in a case where the number of states N is 2, the minimum number Lmin(2) when the number p is 2 is a minimum value among the numbers L(2, 7), L(2, 4), and L(2, 3) in a case where the number of states N is 7, 4, or 3. More specifically, in a case where the settable number of states N of the transmitter 11 is 7, 4, 3, and 2 and the number of states N is 7, the numbers L(1, 7), L(2, 7), and L (3, 7) are 3, 2, and 1, respectively. In a case where the number of states N is 4, the numbers L(1, 4), L(2, 4), and L(3, 4) are 4, 2, and 0, respectively. In a case where the number of states N is 3, the numbers L(1, 3), L(2, 3), and L(3, 3) are 3, 3, and 0, respectively. In a case where the number of states N is 2, the numbers L(1, 2), L(2, 3), and L(3, 3) are 6, 0, and 0, respectively. The minimum number Lmin(1) with the number p of 1, therefore, is 3, which is the minimum value among the numbers L(1, 7), L(1, 4), L(1, 3), and L(1, 2). The minimum number Lmin(2) with the number p of 2 is 2, which is the minimum value among the numbers L(2, 7), L(2, 4), and L(2, 3). The minimum number Lmin(3) with the number p of 3 is 1, which is the minimum value among the numbers L(3, 7), L(3, 4), and L(3, 3). As described above, regardless of the number of states N, since a set of Lmin(p) ($1 \leq p \leq M$) unit resistors $L \cdot R_{term}$ is used as unit resistors $L \cdot R_{term}$ of the same control number m, the same selection signal is input to the minimum number Lmin(p) of multiplexers MUX. The number of selection signals and signal lines, therefore, can be reduced by short-circuiting the selection terminals of the minimum number Lmin(p) of the multiplexers MUX and connecting the selection terminals to the signal lines (supply lines) of the same selection signal. Furthermore, since the minimum number Lmin(p) of units U operate as one unit regardless of the set value of the number of states N, the configuration of the units U may be regarded as one in a case where a unit is configured by one unit driver and one output resistor. That is, the minimum number Lmin(p) of units U may be regarded as being configured by one unit driver D and one unit resistor (L·/Lmin (p))·$R_{term}$. The example of the configuration of the transmitter 11-2 in the second mode illustrated in FIG. 28 and the like corresponds to this case.

<First Example of Configuration of Transmitter 11-3>

Figure 33:
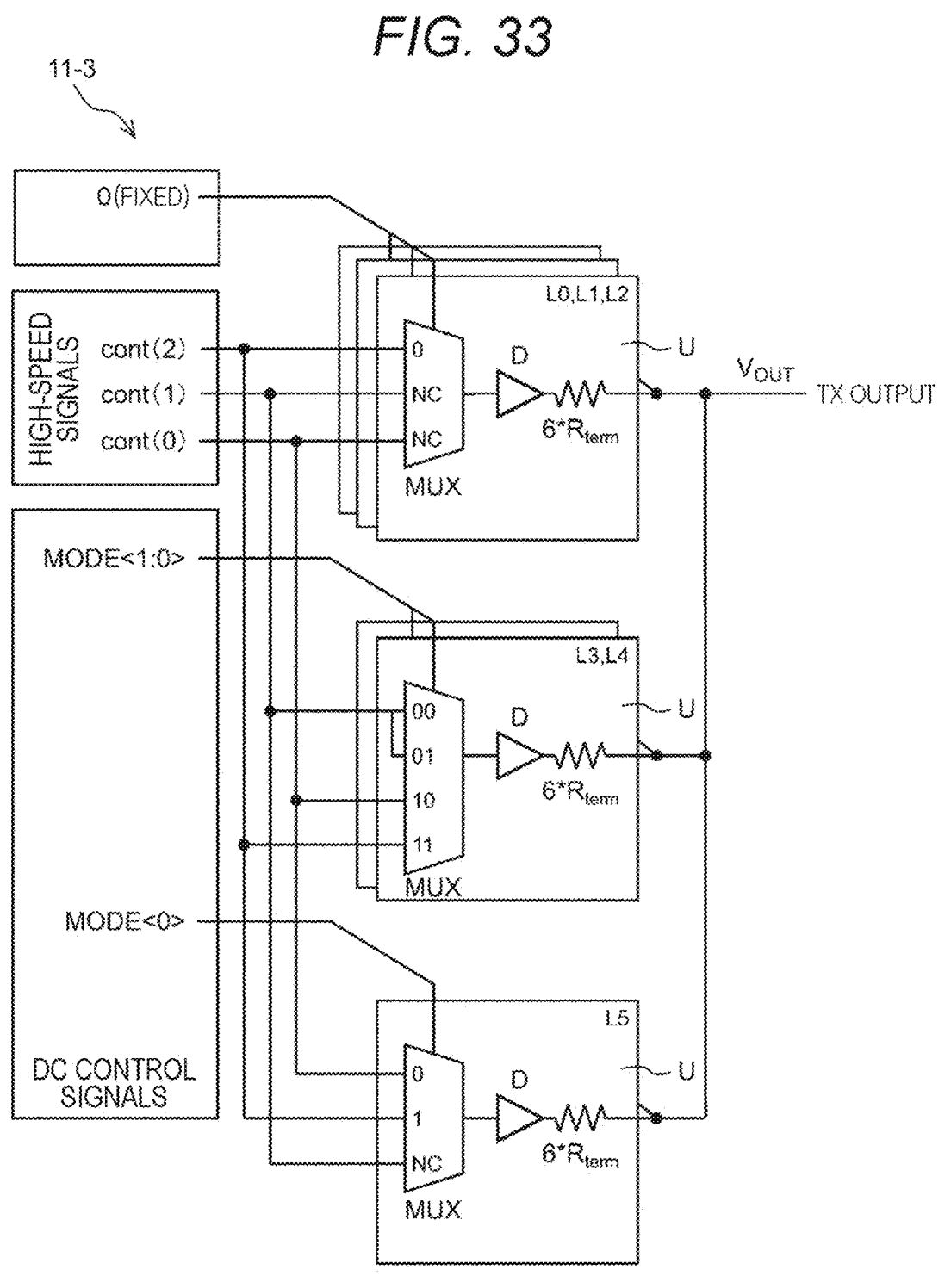

FIG. 33 is a configuration diagram illustrating a first example of configuration of the transmitter 11-3 in the third mode in FIG. 32. FIG. 33 illustrates an example of configuration in a case where the settable number of states N of the transmitter 11-3 in FIG. 32 is 7, 4, 3, and 2. In FIG. 33, the transmitter 11-3 includes three units U (units L0 to L2) connected in parallel with one another, two units U (units L3 and L4) connected in parallel with each other, and one unit U (unit L5). Furthermore, the number L of units U in FIG. 32 is 6 in FIG. 33, and the unit resistor L·$R_{term}$ (resistance value L·$R_{term}$), which is the output resistor $R_{OUT}$ of the unit driver D of each of the units L0 to L5, is represented by 6·$R_{term}$. In a case where the settable number of states N is 7, 4, 3, and 2, the maximum control value M is 3, the minimum number Lmin(1) is 3, the minimum number Lmin(2) is 2, and the minimum number Lmin(3) is 1. The same selection signal, therefore, is input to the selection terminals of the three units L0 to L2 (the selection terminals of the multiplexers MUX), the same selection signal is input to the selection terminals of the two units L3 and L4 (the selection terminals of the multiplexers MUX), and the same selection signal is input to the one unit L5 (the selection terminal of the multiplexer MUX). Note that the multiplexers MUX of the units L0 to L5 may include, for example, three or more input terminals to which the control signals cont(0) to cont(2) are input, and selection terminals to which selection signals for selecting a control signal input from one of the input terminals as a signal to be output from output terminals are input. In the transmitter 11-3 of FIG. 33, configurations of the multiplexers MUX of the units L0 to L2 and L5 and the multiplexers MUX of the units L3 and L4 are different from each other, but this difference is for describing the operation of the multiplexers MUX, and the configurations may be the same in practice.

The control signals cont(0) to cont(2) are input to the three input terminals of the units L0 to L2, respectively, and the control signals cont(0) to cont(2) are input to the three input terminals of the multiplexer MUX, respectively. A selection signal of the mode value 0 is input to the selection terminals of the multiplexers MUX of the units L0 to L2 as a fixed value. In this case, the multiplexers MUX output the control signal cont(2) input to the input terminals from the output terminals, and supply the control signal cont(2) to the unit drivers D.

The control signals cont(0) to cont(2) are input to the three input terminals of the units L3 and L4, respectively, and the control signals cont(0) to cont(2) are input to the four input terminals of the multiplexer MUX, respectively. A selection signal of the mode value MODE<1:0> is input to the selection terminals of the multiplexers MUX of the units L3 and L4. The mode value MODE<1:0> and the operation of the multiplexer MUX based on the mode value MODE<1:0> will be described later.

The control signals cont(0) to cont(2) are input to the three input terminals of the unit L5, and are input to the three input terminals of the multiplexer MUX, respectively. A selection signal of the mode value MODE<0> is input to the selection terminal of the multiplexer MUX of the unit L5. The mode value MODE<0> and the operation of the multiplexer MUX based on the mode value MODE<0> will be described later.

Here, unlike the case where the multiplexer MUX of each of the units L0 to L5 in the example of configuration of the transmitter 11-3 in FIG. 33 performs an operation according to the example of configuration in FIG. 33 that will be described later, a case where the multiplexer MUX performs an operation according to the number L(m) of unit resistors L·$R_{term}$ of each control number m in the number of states N identified from FIG. 3 as it is will be described. In a case where the number of states N is set to 7, selection signals are input to the multiplexers MUX of the units L0 to L2 such that the control signal cont(2) is output from the multiplexers MUX to the unit drivers D. Selection signals are input to the multiplexers MUX of the units L3 and L4 such that the control signal cont(1) is output from the multiplexers MUX to the unit drivers D. A selection signal is input to the multiplexer MUX of the unit L5 such that the control signal cont(0) is output from the multiplexer MUX to the unit driver D. As a result, the number L(2) of the control number of 2 is set to 3, the number L(1) of the control number of 1 is set to 2, and the number L(0) of the control numbers of 0 is set to 1.

In a case where the number of states N is set to 4, selection signals are input to the multiplexers MUX of the units L0 to L2 such that the control signal cont(1) is output from the multiplexers MUX to the unit drivers D. Selection signals are input to the multiplexers MUX of the units L3 and L4 such that the control signal cont(0) is output from the multiplexers MUX to the unit drivers D. A selection signal is input to the multiplexer MUX of the unit L5 such that the control signal cont(1) is output from the multiplexer MUX to the unit driver D. As a result, the number L(2) of the control number of 2 is set to 0, the number L(1) of the control number of 1 is set to 4, and the number L(0) of the control numbers of 0 is set to 2.

In a case where the number of states N of the transmitter 11-3 is set to 3, selection signals are input to the multiplexers MUX of the units L0 to L2 such that the control signal cont(1) is output from the multiplexers MUX to the unit drivers D. Selection signals are input to the multiplexers MUX of the units L3 and L4 such that the control signal cont(0) is output from the multiplexers MUX to the unit drivers D. A selection signal is input to the multiplexer MUX of the unit L5 such that the control signal cont(0) is output from the multiplexer MUX to the unit driver D. As a result, the number L(2) of the control number of 2 is set to 0, the number L(1) of the control number of 1 is set to 3, and the number L(0) of the control numbers of 0 is set to 3.

In a case where the number of states N of the transmitter 11-3 is set to 2, selection signals are input to the multiplexers MUX of the units L0 to L2 such that the control signal cont(0) is output from the multiplexers MUX to the unit drivers D. Selection signals are input to the multiplexers MUX of the units L3 and L4 such that the control signal cont(0) is output from the multiplexers MUX to the unit drivers D. A selection signal is input to the multiplexer MUX of the unit L5 such that the control signal cont(0) is output from the multiplexer MUX to the unit driver D. As a result, the number L(2) of the control number of 2 is set to 0, the number L(1) of the control number of 1 is set to 0, and the number L(0) of the control numbers of 0 is set to 6.

The transmitter 11-3 in FIG. 33 sets a mode value corresponding to the number of states N, and uses the set mode value as selection signals for the multiplexers MUX. Furthermore, in the transmitter 11-3 of FIG. 33, with respect to the numbers L(0) to L(M−1) of unit resistors $6 \cdot R_{term}$ of the control numbers 0 to 2 in the number of states N identified from FIG. 3, the numbers L(0) to L(M−1) are rearranged as the numbers of unit resistors $6 \cdot R_{term}$ of the control numbers 0 to 2 different from FIG. 3.

FIG. 34 is a table illustrating relationships between the mode value corresponding to the number of states N and the control signal output from the multiplexer MUX of each of the units L0 to L5 in the transmitter 11-3 of FIG. 33. In FIG. 34, cases 1 to 4 represent cases where the number of states N of the transmitter 11-3 is set to 7, 4, 3, and 2, respectively, and the number of states N set in cases 1 to 4 is indicated as the number of output levels. Furthermore, the mode value is represented by a combination of MODE<1> and MODE<0>, each of which is set to 0 or 1. Case 1 is a case where the number of states N is set to 7, and MODE<1> and MODE<0> are set to 0. Case 2 is a case where the number of states N is set to 4, and MODE<1> and MODE<0> are set to 0 and 1, respectively. Case 3 is a case where the number of states N is set to 3, and MODE<1> and MODE<0> are set to 1 and 0, respectively. Case 4 is a case where the number of states N is set to 2, and MODE<1> and MODE<0> are set to 1 and 1. Outputs of the multiplexers MUX in each of cases 1 to 4 will be individually described later.

(Case 1)

Figure 35:
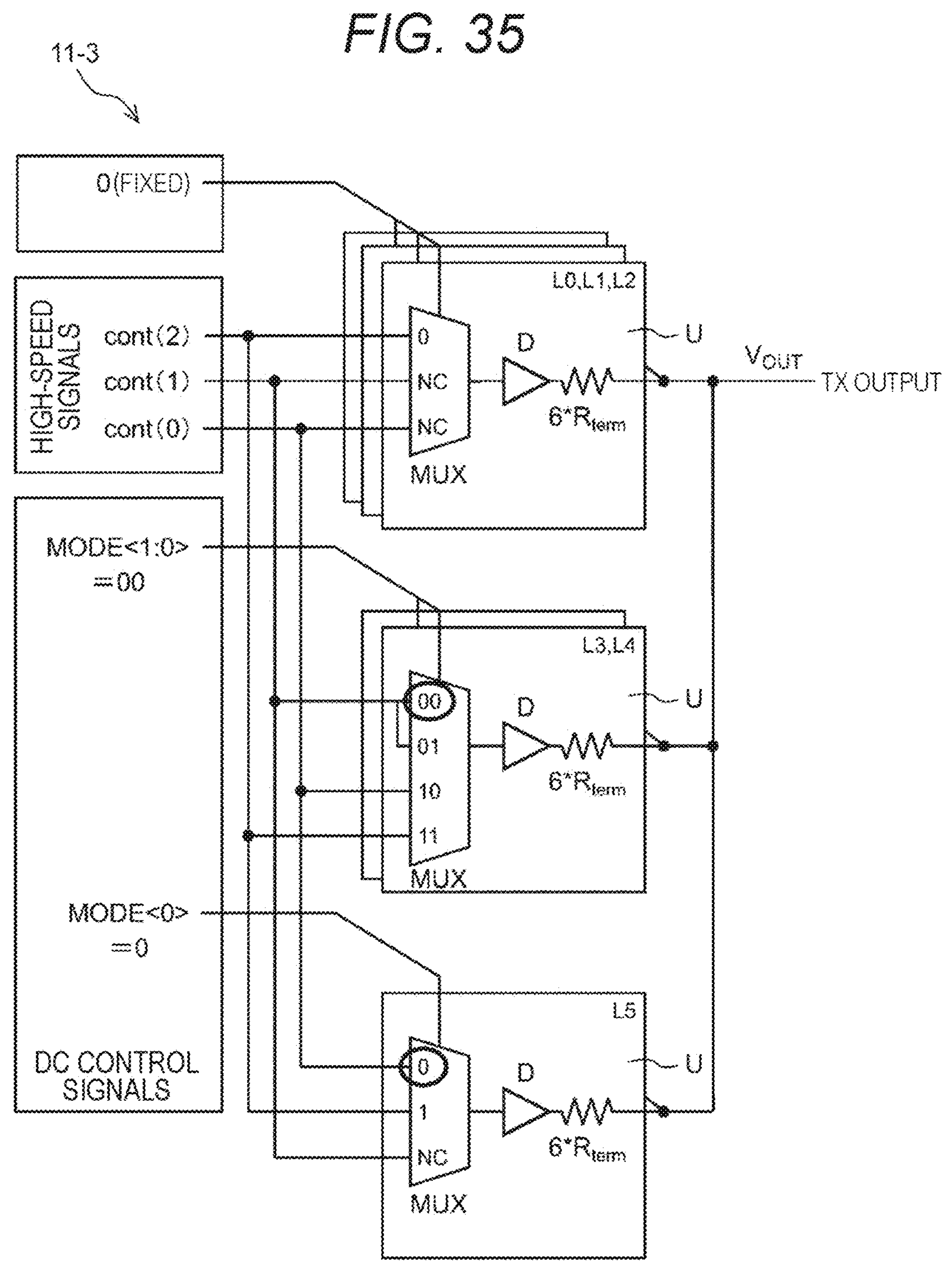
FIG. 35 is a diagram illustrating case 1 in FIG. 34 (a case where the number of states N=7).

FIG. 35 is a diagram illustrating operation of the transmitter 11-3 in FIG. 33 in case 1 of FIG. 34 (a case where the number of states N is 7), and FIG. 36 is a table illustrating case 1 extracted from FIG. 34. In FIGS. 35 and 36, the mode value MODE<1> and the mode value MODE<0> are set to 0. In a case where a two-digit binary number obtained by combining the mode value MODE<1> and the mode value MODE<0> is set as the mode value MODE<1:0>, the mode value MODE<1:0> is set to 00. In case 1, 0, which is a fixed value, is input to the multiplexers MUX of the units L0 to L2 as the selection signal, 00 is input to the multiplexers MUX of the units L3 and L4 as the mode value MODE<1:0> that is the selection signal, and 0 is input to the multiplexer MUX of the unit L5 as the mode value MODE<0> that is the selection signal. As a result, in the units L0 to L2, the control signal cont(2) is supplied from the multiplexers MUX to the unit drivers D. In the units L3 and L4, the control signal cont(1) is supplied from the multiplexers MUX to the unit drivers D. In the unit L5, the control signal cont(0) is supplied from the multiplexer MUX to the unit driver D. As a result, the three unit resistors $6 \cdot R_{term}$ of the units L0 to L2 constitute the output resistor $R_2$ of the control number 2, the two unit resistors $6 \cdot R_{term}$ of the units L3 and L4 constitute the output resistor $R_1$ of the control number 1, and the one unit resistor $6 \cdot R_{term}$ of the unit L5 constitutes the output resistor $R_0$ of the control number 0. The number of states N of the transmitter 11-3, therefore, is set to 7.

Figures 37, 38:
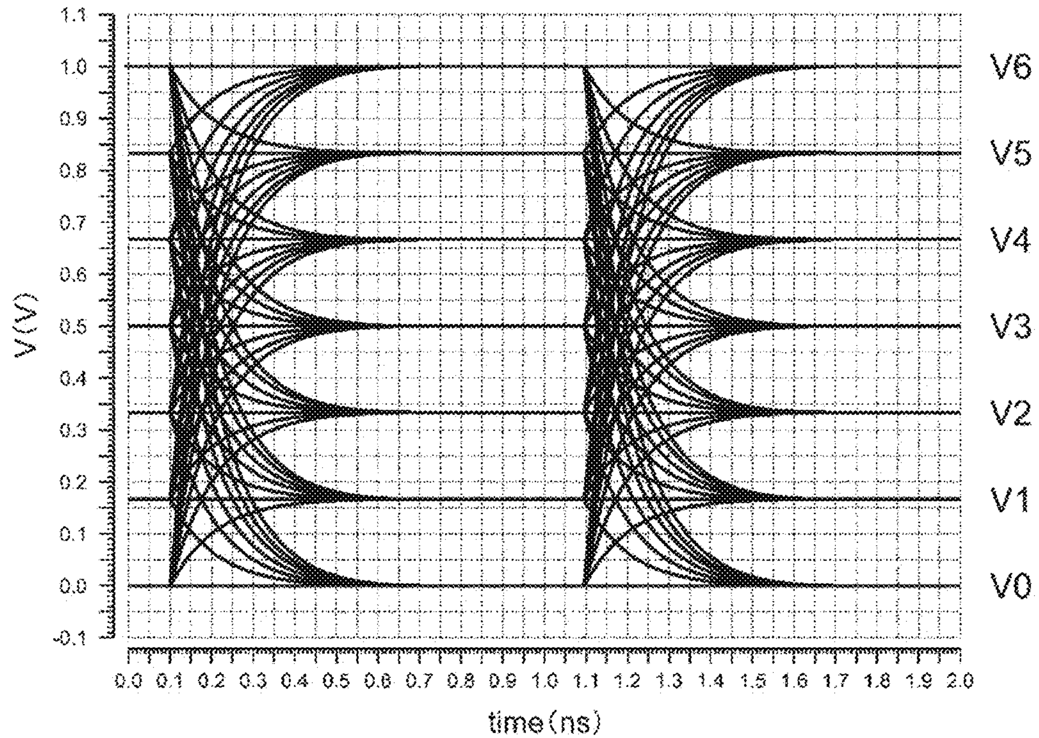
FIG. 37 is another diagram used to describe case 1 in FIG. 34.
FIG. 38 is another diagram used to describe case 1 in FIG. 34.

FIG. 37 is a table illustrating the normalized output voltage $V_n$ output from the output terminal $V_{OUT}$ of the transmitter 11-3 for each combination of the values of the control signals cont(0) to cont(2). In FIG. 37, signal numbers X of 0 to 7 are shown in a leftmost column as in FIG. 5. The signal number X is a value obtained by representing 3-bit digital data indicated by the control signals cont(0) to cont(2) in a decimal number. In each of rows of the signal numbers X of 0 to 7, values (0 or 1) of the control signals cont(0) to cont(2) input to the transmitter 11-3 and the normalized output voltage $V_n$ of the state number n output from the output terminal $V_{OUT}$ are shown. Since what is illustrated in FIG. 37 is similar to that described with reference to FIGS. 5 and 6, described description with reference to FIG. 37 is omitted. The output voltage $V_3$ of the state number 3 is output in a case where the signal number X is 3 and 4. For eight combinations of the values of the control signals cont(0) to cont(2) with the signal numbers X of 0 to 7, the normalized output voltage $V_n$ is one of seven levels obtained by equally dividing (dividing into six equal parts) a range of 0 to 1. FIG. 38 illustrates temporal changes in the normalized output voltage $V_{OUT}$ in a case where the output voltage $V_n$ of any control number n (0 to 6) changes to the output voltage $V_n$ of another control number n (0 to 6) with a horizontal axis representing time and a vertical axis representing the normalized output voltage $V_{OUT}$. According to this, the normalized output voltage $V_{OUT}$ has transitioned to the normalized output voltages $V_0$ to $V_6$ of the control numbers 0 to 6 over a certain period of time after the control signals cont(0) to cont(2) were changed at 0.1 (ns) and 1.1 (ns).

(Case 2)

Figure 39:
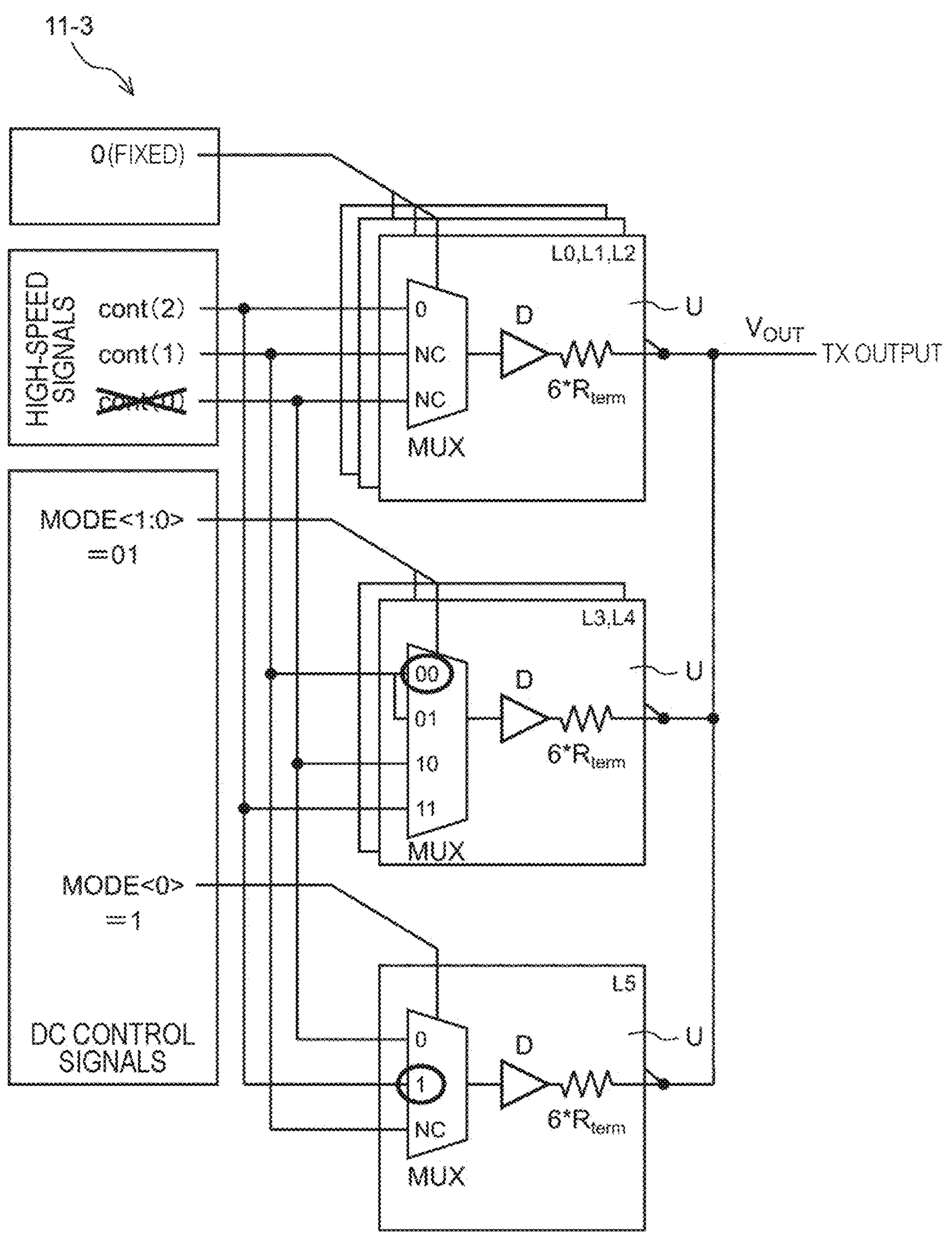
FIG. 39 is a diagram illustrating case 2 in FIG. 34 (a case where the number of states N=4).

FIG. 39 is a diagram illustrating operation of the transmitter 11-3 in FIG. 33 in case 2 of FIG. 34 (a case where the number of states N is 4), and FIG. 40 is a table illustrating case 2 extracted from FIG. 34. In FIGS. 39 and 40, the mode value MODE<1> and the mode value MODE<0> are set to 0 and 1, respectively, and the mode value MODE<1:0> is set to 01. In case 2, 0, which is a fixed value, is input to the multiplexers MUX of the units L0 to L2 as the selection signal, 01 is input to the multiplexers MUX of the units L3 and L4 as the mode value MODE<1:0> that is the selection signal, and 1 is input to the multiplexer MUX of the unit L5 as the mode value MODE<0> that is the selection signal. As a result, in the units L0 to L2, the control signal cont(2) is supplied from the multiplexers MUX to the unit drivers D. In the units L3 and L4, the control signal cont(1) is supplied from the multiplexers MUX to the unit drivers D. In the unit L5, the control signal cont(2) is supplied from the multiplexer MUX to the unit driver D. As a result, the four unit resistors $6 \cdot R_{term}$ of the units L0 to L2 and L5 constitute the output resistor $R_2$ of the control number 2, the two unit resistors $6 \cdot R_{term}$ of the units L3 and L4 constitute the output resistor $R_1$ of the control number 1, and the output resistor $R_0$ of the control number 0 is not configured. The number of states N of the transmitter 11-3, therefore, is set to 4.

Figures 41, 42:
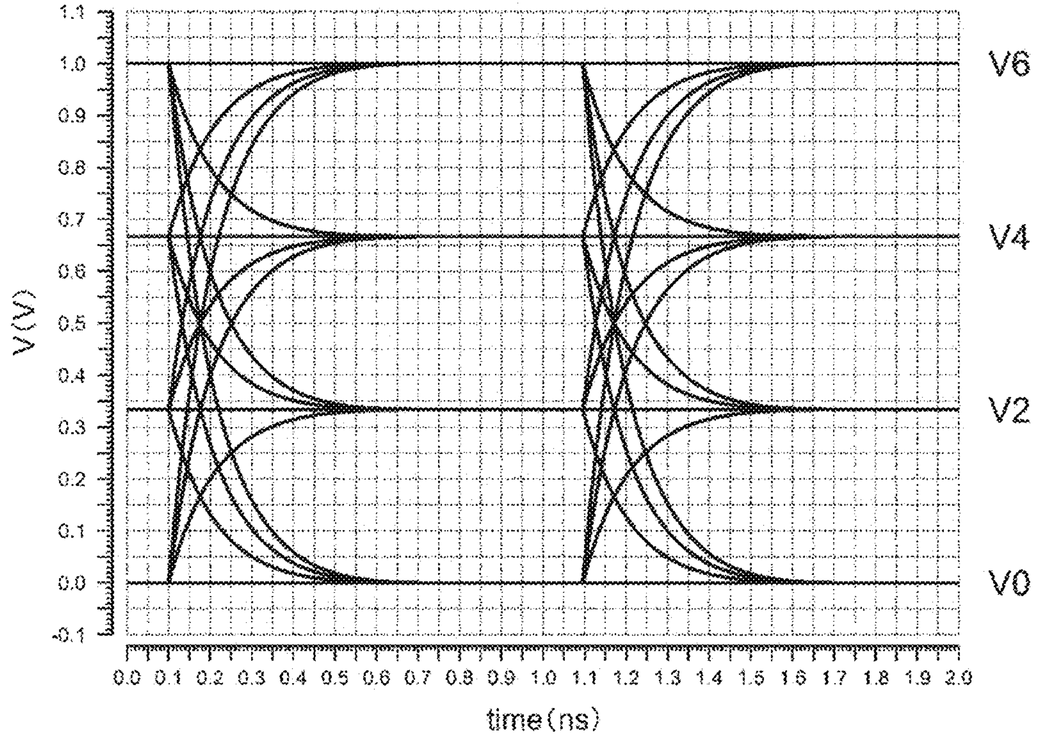
FIG. 41 is another diagram used to describe case 2 in FIG. 34.
FIG. 42 is another diagram used to describe case 2 in FIG. 34.

FIG. 41 is a table illustrating the normalized output voltage $V_n$ output from the output terminal $V_{OUT}$ of the transmitter 11-3 for each combination of the values of the control signals cont(0) to cont(2). In FIG. 41, signal numbers X of 0 to 3 are shown in a leftmost column. The signal number X is a value obtained by representing 2-bit digital data in which the control signals cont(1) and cont(2) are values of the 1 digit (first digit) and the 2 digit (second digit), respectively, in a decimal number. In each of rows of the signal numbers X of 0 to 3, values (0 or 1) of the control signals cont(0) to cont(2) input to the transmitter 11-3 and the normalized output voltage $V_n$ of the state number n output from the output terminal $V_{OUT}$ are shown. Note that since the output resistor $R_0$ of the control number 0 does not exist, the control signal cont(0) is not used.

According to FIG. 41, the state numbers n are 0 to 3, and the normalized output voltages $V_0$ to $V_3$ of the state numbers 0 to 3 are 0.000, 0.333, 0.667, and 1.000, respectively. Every time the signal number X increases by 1 from 0 to 3, the normalized output voltage $V_n$ increases by ⅓ within the range of 0 to 1. For four combinations of the values of the control signals cont(1) and cont(2) with the signal numbers X of 0 to 3, the normalized output voltage $V_n$ is one of four levels obtained by equally dividing (dividing into three equal parts) a range of 0 to 1. Note that, for the four output voltages $V_0$ to $V_3$, output voltages $V_0$, $V_2$, $V_4$, and $V_6$ of the control numbers 0, 2, 4, and 6 of equivalent voltages among the output voltages $V_0$ to $V_6$ in case 1 of FIG. 37 are shown in a Remarks field. FIG. 42 illustrates temporal changes in the normalized output voltage $V_{OUT}$ in a case where the output voltage $V_n$ of any control number n (0 to 3) changes to the output voltage $V_n$ of another control number n (0 to 3) with a horizontal axis representing time and a vertical axis representing the normalized output voltage $V_{OUT}$. According to this, the normalized output voltage $V_{OUT}$ has transitioned to the normalized output voltages $V_0$ to $V_3$ of the control numbers 0 to 3 over a certain period of time after the control signals cont(0) to cont(2) were changed at 0.1 (ns) and 1.1 (ns). Note that, in FIG. 42, the normalized output voltages $V_0$ to $V_3$ of control numbers 0 to 3 are indicated as output voltages $V_0$, $V_2$, $V_4$, and $V_6$ in case 1, respectively.

(Case 3)

Figure 43:
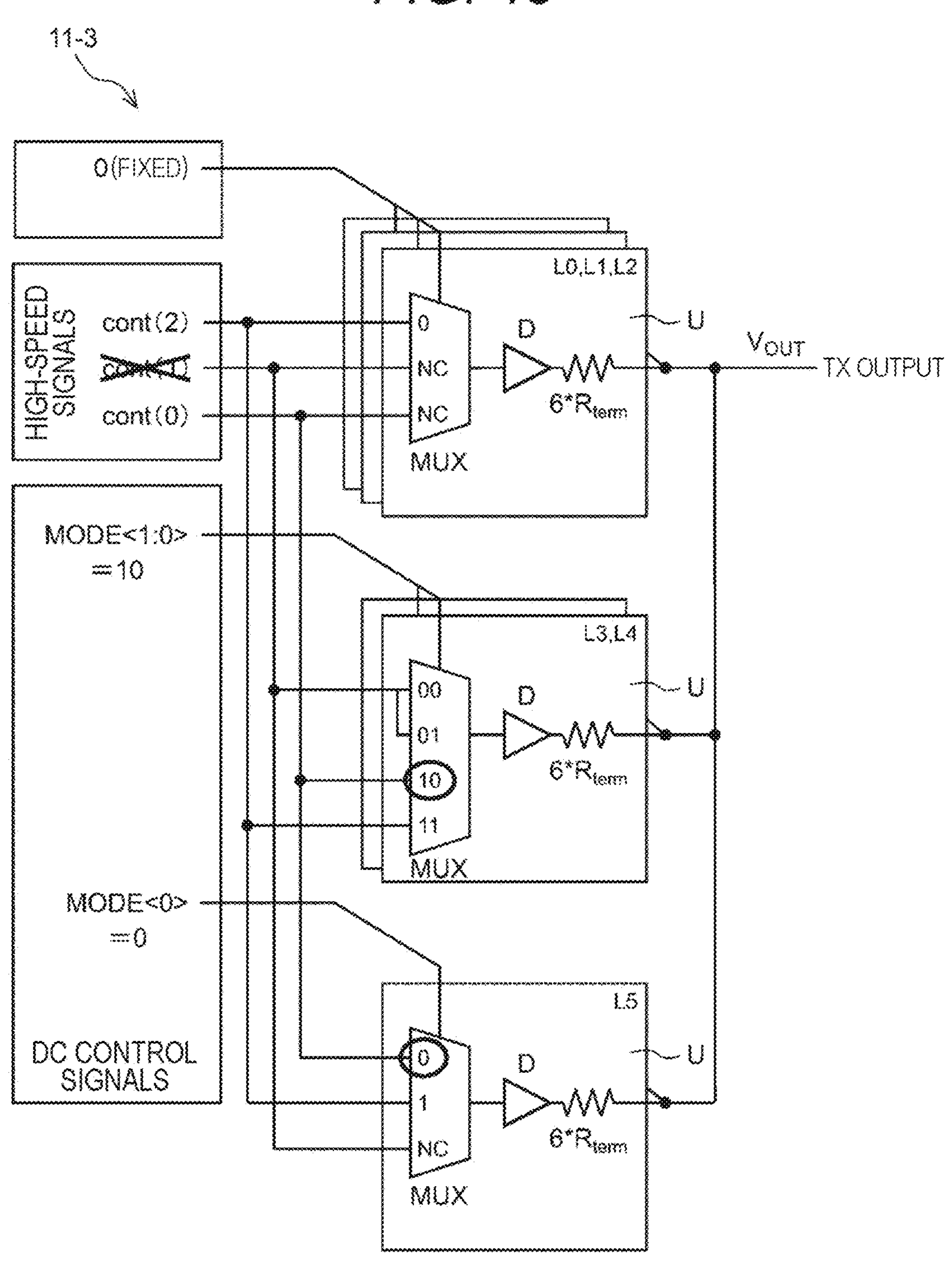
FIG. 43 is a diagram illustrating case 3 in FIG. 34 (a case where the number of states N=3).

FIG. 43 is a diagram illustrating operation of the transmitter 11-3 in FIG. 33 in case 3 of FIG. 34 (a case where the number of states N is 3), and FIG. 44 is a table illustrating case 3 extracted from FIG. 34. In FIGS. 43 and 44, the mode value MODE<1> and the mode value MODE<0> are set to 1 and 0, respectively, and the mode value MODE<1:0> is set to 10. In case 3, 0, which is a fixed value, is input to the multiplexers MUX of the units L0 to L2 as the selection signal, 10 is input to the multiplexers MUX of the units L3 and L4 as the mode value MODE<1:0> that is the selection signal, and 0 is input to the multiplexer MUX of the unit L5 as the mode value MODE<0> that is the selection signal. As a result, in the units L0 to L2, the control signal cont(2) is supplied from the multiplexers MUX to the unit drivers D. In the units L3 and L4, the control signal cont(0) is supplied from the multiplexers MUX to the unit drivers D. In the unit L5, the control signal cont(0) is supplied from the multiplexer MUX to the unit driver D. As a result, the three unit resistors $6 \cdot R_{term}$ of the units L0 to L2 constitute the output resistor $R_2$ of the control number 2, the three unit resistors $6 \cdot R_{term}$ of the units L3 to L5 constitute the output resistor $R_0$ of the control number 0, and the output resistor $R_1$ of the control number 1 is not configured. The number of states N of the transmitter 11-3, therefore, is set to 3.

Figures 45, 46:
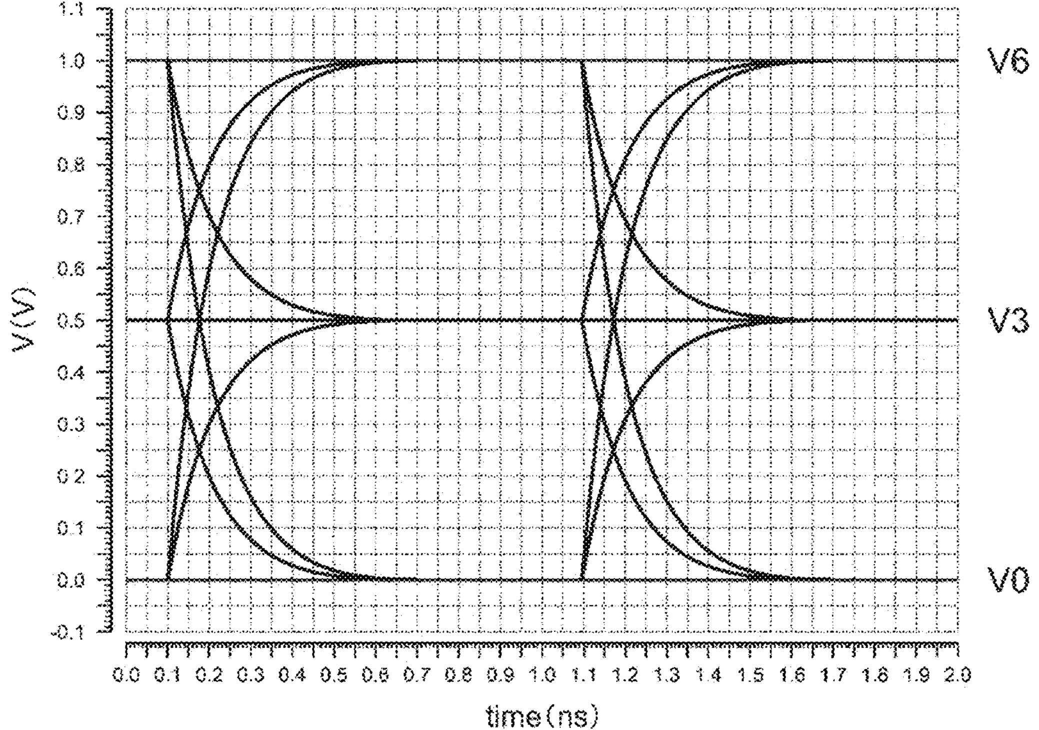
FIG. 45 is another diagram used to describe case 3 in FIG. 34.
FIG. 46 is another diagram used to describe case 3 in FIG. 34.

FIG. 45 is a table illustrating the normalized output voltage $V_n$ output from the output terminal $V_{OUT}$ of the transmitter 11-3 for each combination of the values of the control signals cont(0) to cont(2). In FIG. 45, signal numbers X of 0 to 3 are shown in a leftmost column. The signal number X is a value obtained by representing 2-bit digital data in which the control signals cont(0) and cont(2) are values of the 1 digit (first digit) and the 2 digit (second digit), respectively, in a decimal number. In each of rows of the signal numbers X of 0 to 3, values (0 or 1) of the control signals cont(0) to cont(2) input to the transmitter 11-3 and the normalized output voltage $V_n$ of the state number n output from the output terminal $V_{OUT}$ are shown. Note that since the output resistor $R_1$ of the control number 1 does not exist, the control signal cont(1) is not used.

According to FIG. 45, the state numbers n are 0 to 2, and the normalized output voltages $V_0$ to $V_2$ of the state numbers 0 to 2 are 0.000, 0.500, and 1.000, respectively. In a case where the signal number X is 1 and 2, the output voltage $V_1$ of the state number 1 is output. In a case where the signal number X increases by 1 from 0 to 1 or from 2 to 3, the state number n increases by 1, and the normalized output voltage $V_n$ increases by ½ within the range of 0 to 1. For four combinations of the values of the control signals cont(0) to cont(2) with the signal numbers X of 0 to 3, the normalized output voltage $V_n$ is one of three levels obtained by equally dividing (dividing into two equal parts) a range of 0 to 1. Note that, for the three output voltages $V_0$ to $V_2$, output voltages $V_0$, $V_3$, and $V_6$ of the control numbers 0, 3, and 6 of equivalent voltages among the output voltages $V_0$ to $V_6$ in case 1 of FIG. 37 are shown in a Remarks field. FIG. 46 illustrates temporal changes in the normalized output voltage $V_{OUT}$ in a case where the output voltage $V_n$ of any control number n (0 to 2) changes to the output voltage $V_n$ of another control number n (0 to 2) with a horizontal axis representing time and a vertical axis representing the normalized output voltage $V_{OUT}$. According to this, the normalized output voltage $V_{OUT}$ has transitioned to the normalized output voltages $V_0$ to $V_2$ of the control numbers 0 to 2 over a certain period of time after the control signals cont(0) to cont(2) were changed at 0.1 (ns) and 1.1 (ns). Note that, in FIG. 46, the normalized output voltages $V_0$ to $V_2$ of control numbers 0 to 2 are indicated as output voltages $V_0$, $V_3$, and $V_6$ in case 1, respectively.

(Case 4)

Figure 47:
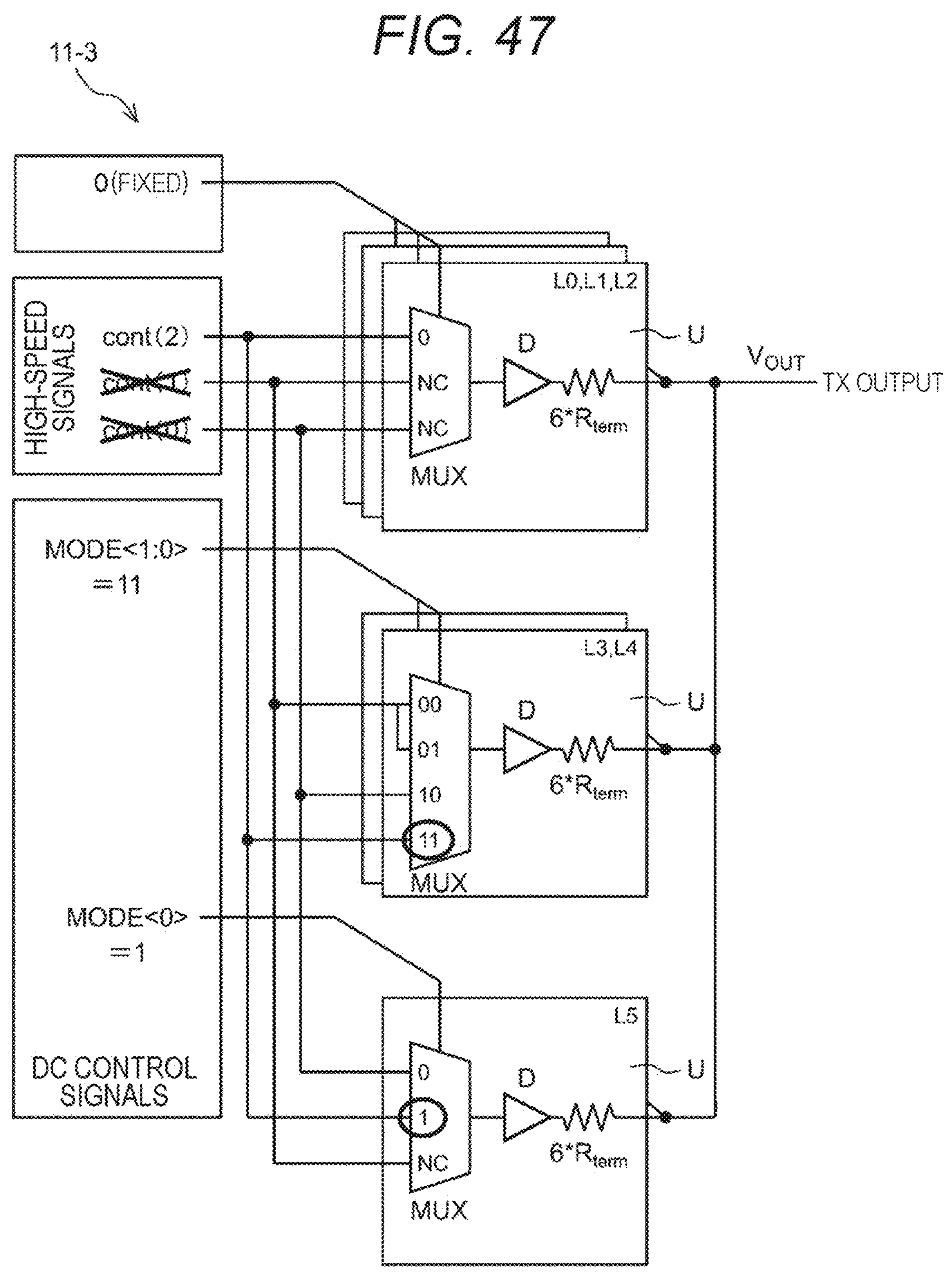
FIG. 47 is a diagram illustrating case 4 in FIG. 34 (a case where the number of states N=2).

FIG. 47 is a diagram illustrating operation of the transmitter 11-3 in FIG. 33 in case 4 of FIG. 34 (a case where the number of states N is 2), and FIG. 48 is a table illustrating case 4 extracted from FIG. 34. In FIGS. 47 and 48, the mode value MODE<1> and the mode value MODE<0> are set to 1, and the mode value MODE<1:0> is set to 11. In case 4, 0, which is a fixed value, is input to the multiplexers MUX of the units L0 to L2 as the selection signal, 11 is input to the multiplexers MUX of the units L3 and L4 as the mode value MODE<1:0> that is the selection signal, and 1 is input to the multiplexer MUX of the unit L5 as the mode value MODE<0> that is the selection signal. As a result, in the units L0 to L2, the control signal cont(2) is supplied from the multiplexers MUX to the unit drivers D. In the units L3 and L4, the control signal cont(2) is supplied from the multiplexers MUX to the unit drivers D. In the unit L5, the control signal cont(2) is supplied from the multiplexer MUX to the unit driver D. As a result, the six unit resistors $6 \cdot R_{term}$ of the units L0 to L5 constitute the output resistor $R_2$ of the control number 2, and the output resistors $R_0$ and $R_1$ of the control numbers 0 and 1 are not configured. The number of states N of the transmitter 11-3, therefore, is set to 2.

Figures 49, 50:
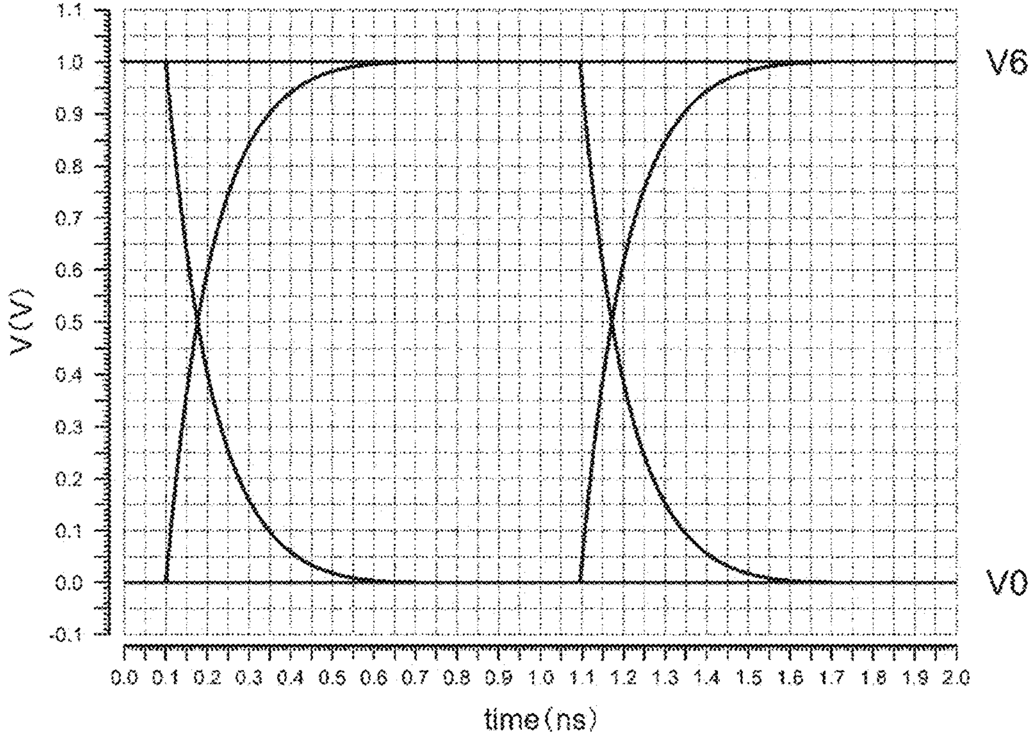
FIG. 49 is another diagram used to describe case 4 in FIG. 34.
FIG. 50 is another diagram used to describe case 4 in FIG. 34.

FIG. 49 is a table illustrating the normalized output voltage $V_n$ output from the output terminal $V_{OUT}$ of the transmitter 11-3 for each combination of the values of the control signals cont(0) to cont(2). In FIG. 49, signal numbers X of 0 and 1 are shown in a leftmost column. The signal number X is a value obtained by representing 2-bit digital data of the control signal cont(2) in a decimal number. In each of rows of the signal numbers X of 0 and 1, values (0 or 1) of the control signals cont(0) to cont(2) input to the transmitter 11-3 and the normalized output voltage $V_n$ of the state number n output from the output terminal $V_{OUT}$ are shown. Note that since the output resistors $R_0$ and $R_1$ of the control numbers 0 and 1 do not exist, the control signals cont(0) and cont(1) are not used.

According to FIG. 49, the state numbers n are 0 and 1, and the normalized output voltages $V_0$ and $V_1$ of state numbers 0 and 1 are 0.000 and 1.000, respectively. In a case where the signal number X increases from 0 to 1, the normalized output voltage $V_n$ increases from 0 to 1. The normalized output voltage $V_n$ becomes one of two levels of 0 and 1 with respect to the two values of the control signal cont(2) with the signal number X of 0 and 1. Note that, for the two output voltages $V_0$ and $V_1$, output voltages $V_0$ and $V_6$ of the control numbers 0 and 6 of equivalent voltages among the output voltages $V_0$ to $V_6$ in case 1 of FIG. 37 are shown in a Remarks field. FIG. 50 illustrates temporal changes in the normalized output voltage $V_{OUT}$ in a case where the output voltage $V_n$ of any control number n (0 and 1) changes to the output voltage $V_n$ of another control number n (0 and 1) with a horizontal axis representing time and a vertical axis representing the normalized output voltage $V_{OUT}$. According to this, the normalized output voltage $V_{OUT}$ has transitioned to the normalized output voltages $V_0$ and $V_1$ of the control numbers 0 to 1 over a certain period of time after the control signals cont(0) to cont(2) were changed at 0.1 (ns) and 1.1 (ns). Note that, in FIG. 50, the normalized output voltages $V_0$ and $V_1$ of control numbers 0 and 1 are indicated as output voltages $V_0$ and $V_6$ in case 1, respectively.

<Second Example of Configuration of Transmitter 11-3>

Figure 51:
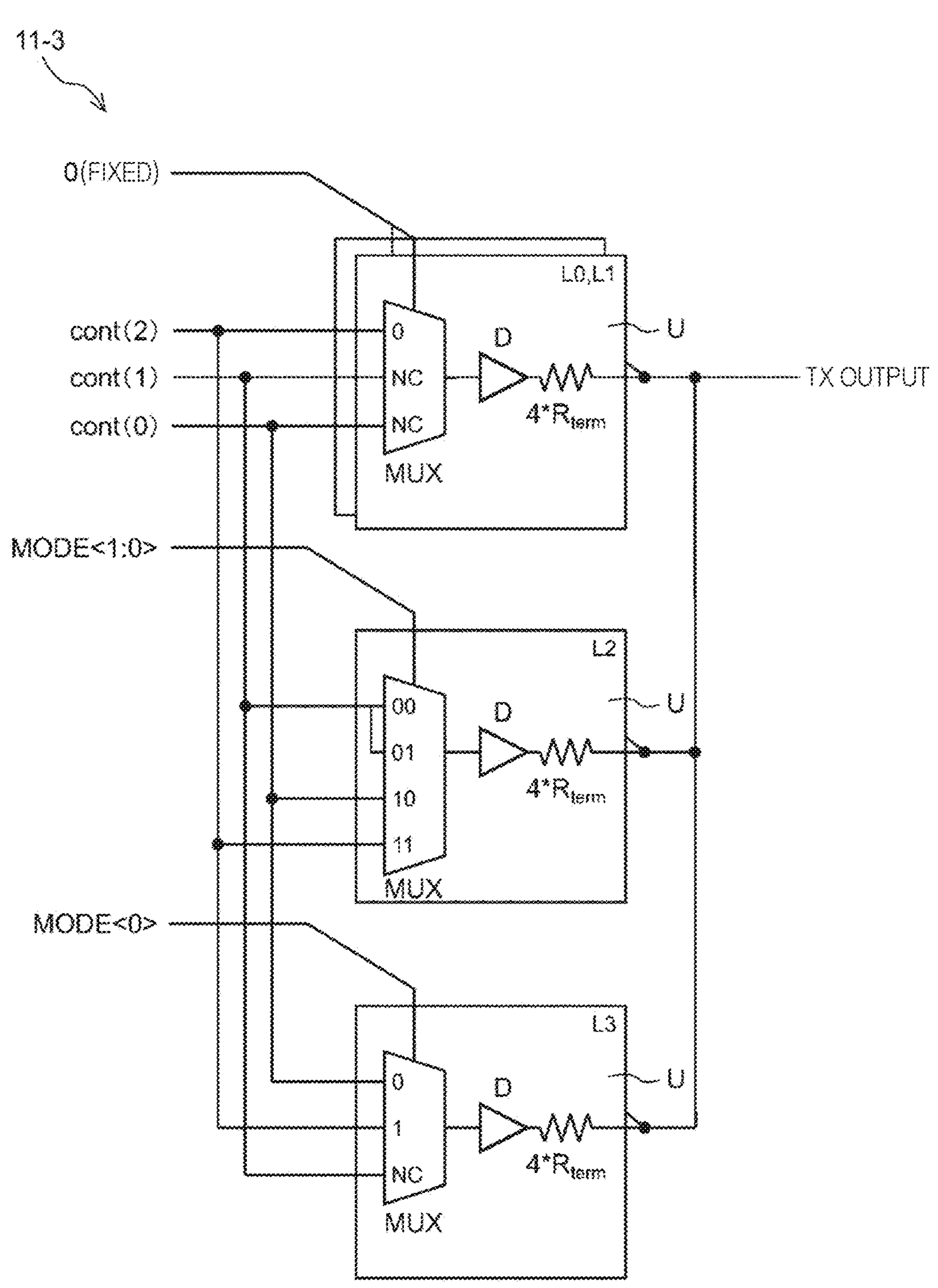
FIG. 51 is a configuration diagram illustrating a second example of the configuration of the transmitter in FIG. 32.

FIG. 51 is a configuration diagram illustrating a second example of the configuration of the transmitter 11-3 in FIG. 32. FIG. 51 illustrates an example of configuration in a case where the settable number of states N of the transmitter 11-3 in FIG. 32 is 5, 3, and 2. Note that the second example of the configuration of the transmitter 11-3 in FIG. 51 is similar in configuration and operation to the first example described with reference to FIGS. 33 to 50, and description thereof is simplified.

In FIG. 51, the transmitter 11-3 includes two units U (units L0 and L1) connected in parallel with each other and one unit U (units L2 and L3). Furthermore, the number L of units U in FIG. 32 is 4 in FIG. 51, and the unit resistor $L \cdot R_{term}$ (resistance value $L \cdot R_{term}$), which is the output resistor $R_{OUT}$ of the unit driver D of each of the units L0 to L3, is represented by $4 \cdot R_{term}$. In a case where the settable number of states N is 5, 3, and 2, the maximum control value M is 3, the minimum number Lmin(1) is 2, the minimum number Lmin(2) is 1, and the minimum number Lmin(3) is 1. The same selection signal, therefore, is input to the selection terminals (the selection terminals of the multiplexers MUX) of the two units L0 and L1, and individual single selection signals are input to the selection terminals (the selection terminals of the multiplexers MUX) of the units L3 and L4. Note that the multiplexers MUX of the units L0 to L3 may include, for example, three or more input terminals to which the control signals cont(0) to cont(2) are input, and selection terminals to which selection signals for selecting a control signal input from one of the input terminals as a signal to be output from output terminals are input. In the transmitter 11-3 of FIG. 51, configurations of the multiplexers MUX of the units L0, L1, and L3 and the multiplexer MUX of the unit L2 are different from each other, but this difference is for describing the operation of the multiplexers MUX, and the configurations may be the same in practice.

The control signals cont(0) to cont(2) are input to the three input terminals of the units L0 and L1, respectively, and the control signals cont(0) to cont(2) are input to the three input terminals of the multiplexer MUX, respectively. A selection signal of the mode value 0 is input to the selection terminals of the multiplexers MUX of the units L0 and L1 as a fixed value. In this case, the multiplexers MUX output the control signal cont(2) input to the input terminals from the output terminals, and supply the control signal cont(2) to the unit drivers D.

The control signals cont(0) to cont(2) are input to the three input terminals of the unit L2, respectively, and the control signals cont(0) to cont(2) are input to the four input terminals of the multiplexer MUX, respectively. A selection signal of the mode value MODE<1:0> is input to the selection terminal of the multiplexer MUX of the unit L2.

The control signals cont(0) to cont(2) are input to the three input terminals of the unit L3, and are input to the three input terminals of the multiplexer MUX, respectively. A selection signal of the mode value MODE<0> is input to the selection terminal of the multiplexer MUX of the unit L3.

In a case where the number of states N is set to 5, the mode value MODE<1> and the mode value MODE<0> are each set to 0, and the mode value MODE<1:0> is set to 00. In this case, 0, which is a fixed value, is input to the multiplexers MUX of the units L0 and L1 as the selection signal, 00 is input to the multiplexer MUX of the unit L2 as the mode value MODE<1:0> that is the selection signal, and 0 is input to the multiplexer MUX of the unit L3 as the mode value MODE<0> that is the selection signal. As a result, in the units L0 and L1, the control signal cont(2) is supplied from the multiplexers MUX to the unit drivers D. In the unit L2, the control signal cont(1) is supplied from the multiplexer MUX to the unit driver D. In the unit L3, the control signal cont(0) is supplied from the multiplexer MUX to the unit driver D. As a result, the two unit resistors $4 \cdot R_{term}$ of the units L0 and L1 constitute the output resistor $R_2$ of the control number 2, the one unit resistor $4 \cdot R_{term}$ of the unit L2 constitutes the output resistor $R_1$ of the control number 1, and the one unit resistor $4 \cdot R_{term}$ of the unit L3 constitutes the output resistor $R_0$ of the control number 0. The number of states N of the transmitter 11-3, therefore, is set to 5.

In a case where the number of states N is set to 3, the mode value MODE<1> and the mode value MODE<0> are set to 1 and 0, respectively, and the mode value MODE<1:0> is set to 10. In this case, 0, which is a fixed value, is input to the multiplexers MUX of the units L0 and L1 as the selection signal, 10 is input to the multiplexer MUX of the unit L2 as the mode value MODE<1:0> that is the selection signal, and 0 is input to the multiplexer MUX of the unit L3 as the mode value MODE<0> that is the selection signal. As a result, in the units L0 and L1, the control signal cont(2) is supplied from the multiplexers MUX to the unit drivers D. In the unit L2, the control signal cont(0) is supplied from the multiplexer MUX to the unit driver D. In the unit L3, the control signal cont(0) is supplied from the multiplexer MUX to the unit driver D. As a result, the two unit resistors $4 \cdot R_{term}$ of the units L0 and L1 constitute the output resistor $R_2$ of the control number 2, the two unit resistors $4 \cdot R_{term}$ of the units L2 and L3 constitute the output resistor $R_0$ of the control number 0, and the output resistor $R_1$ of the control number 1 is not configured. The number of states N of the transmitter 11-3, therefore, is set to 3.

In a case where the number of states N is set to 2, the mode value MODE<1> and the mode value MODE<0> are each set to 1, and the mode value MODE<1:0> is set to 11. In this case, 0, which is a fixed value, is input to the multiplexers MUX of the units L0 and L1 as the selection signal, 11 is input to the multiplexer MUX of the unit L2 as the mode value MODE<1:0> that is the selection signal, and 1 is input to the multiplexer MUX of the unit L3 as the mode value MODE<0> that is the selection signal. As a result, in the units L0 and L1, the control signal cont(2) is supplied from the multiplexers MUX to the unit drivers D. In the unit L2, the control signal cont(2) is supplied from the multiplexer MUX to the unit driver D. In the unit L3, the control signal cont(2) is supplied from the multiplexer MUX to the unit driver D. As a result, the four unit resistors $4 \cdot R_{term}$ of the units L0 and L3 constitute the output resistor $R_2$ of the control number 2, and the output resistors $R_0$ and $R_1$ of the control numbers 0 and 1 are not configured. The number of states N of the transmitter 11-3, therefore, is set to 2.

Figures 52, 53:
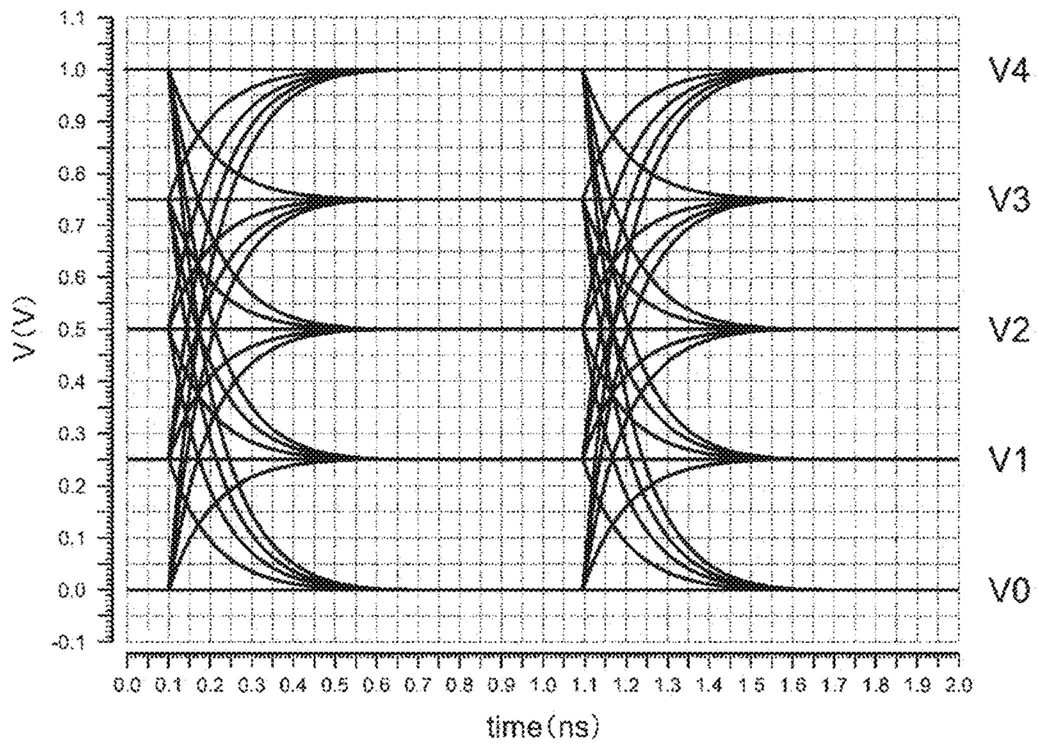
FIG. 52 is a diagram illustrating operation of the transmitter in FIG. 51.
FIG. 53 is another diagram illustrating the operation of the transmitter in FIG. 51.

FIG. 52 is a table illustrating the normalized output voltage $V_n$ output from the output terminal $V_{OUT}$ of the transmitter 11-3 for each combination of the values of the control signals cont(0) to cont(2) in a case where the number of states N is set to 5. In FIG. 52, signal numbers X of 0 to 7 are shown in a leftmost column as in FIG. 5. The signal number X is a value obtained by representing 3-bit digital data indicated by the control signals cont(0) to cont(2) in a decimal number. In a case where the number of states N is set to 5 in the second example of configuration, however, the control signals cont(1) and cont(2) of control numbers 1 and 2 are used as the control signal of the control number 2 and the control signal of the control number 1 in FIG. 3, respectively. In FIG. 52, therefore, the signal case X is a value obtained by representing a 3-digit binary number in which a 1 digit is the value of the control signal cont(0), a 2 digit is the value of the control signal cont(2), and a 3 digit is the control signal cont(1), in a decimal number. In each of rows of the signal numbers X of 0 to 7, values (0 or 1) of the control signals cont(0) to cont(2) input to the transmitter 11-3 and the normalized output voltage $V_n$ of the state number n output from the output terminal $V_{OUT}$ are shown.

According to FIG. 52, the state numbers n are 0 to 4, and the normalized output voltages $V_0$ to $V_4$ of the state numbers 0 to 4 are 0.000, 0.250, 0.500, 0.750, and 1.000, respectively. In a case where the signal number X is 1 to 3 and 4 to 6, the output voltages $V_1$ to $V_3$ of the state numbers 1 to 3 are output. In a case where the signal number X increases by 1 from any of 0 to 2 and 6, the state number n increases by 1, and the normalized output voltage $V_n$ increases by ¼ within the range of 0 to 1. For eight combinations of the values of the control signals cont(0) to cont(2) with the signal numbers X of 0 to 7, the normalized output voltage $V_n$ is one of four levels obtained by equally dividing (dividing into three equal parts) a range of 0 to 1. FIG. 53 illustrates temporal changes in the normalized output voltage $V_{OUT}$ in a case where the output voltage $V_n$ of any control number n (0 to 4) changes to the output voltage $V_n$ of another control number n (0 to 4) with a horizontal axis representing time and a vertical axis representing the normalized output voltage $V_{OUT}$. According to this, the normalized output voltage $V_{OUT}$ has transitioned to the normalized output voltages $V_0$ to $V_2$ of the control numbers 0 to 4 over a certain period of time after the control signals cont(0) to cont(2) were changed at 0.1 (ns) and 1.1 (ns). Note that description of a case where the number of states N is set to 3 or 2 is omitted.

<Comparison Between Third Mode of Transmitter 11 and Comparative Technology 2>

Figures 54, 55:
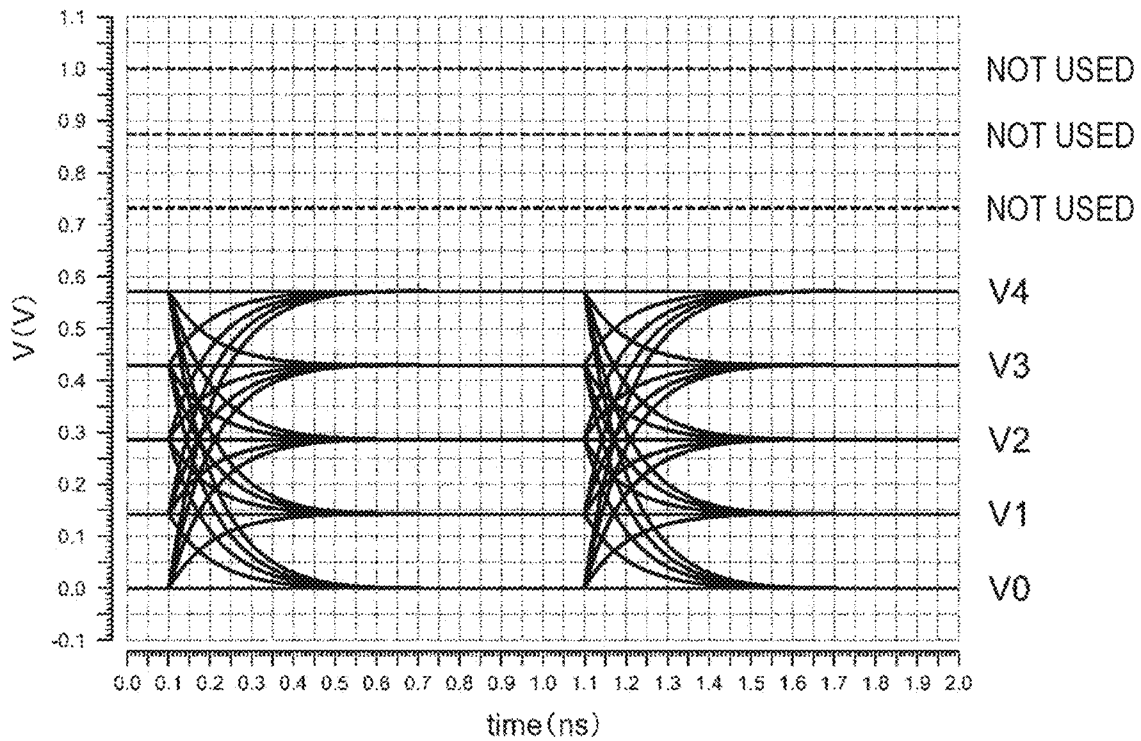
FIG. 54 is a diagram illustrating operation of the transmitter in comparative technology 2 in a case where the number of states is 7.
FIG. 55 is another diagram illustrating the operation of the transmitter in comparative technology 2.

Here, the transmitter 11-3, which is the third mode of the transmitter 11 to which the present technology is applied is compared with comparative technology 2. Note that, in the present comparison, the second example of the configuration of the transmitter 11-3 described with reference to FIGS. 51 to 53 is used as the third mode of the transmitter 11 to which the present technology is applied. FIG. 54 is a table illustrating the normalized output voltage $V_n$ output from the output terminal $V_{OUT}$ of the transmitter 411 for each combination of the values of the control signals cont(0) and cont(2) in a case where the number of states N of the transmitter 411 of comparative technique 2 in FIG. 25 is set to 5.

In FIG. 54, signal numbers X of 0 to 7 are shown in a leftmost column as in FIG. 26. The signal number X is a value obtained by representing 3-bit digital data indicated by the control signals cont(0) to cont(2) in a decimal number. In each of rows of the signal numbers X of 0 to 7, values (0 or 1) of the control signals cont(0) to cont(2) input to the transmitter 411 and the normalized output voltage $V_n$ of the state number n output from the output terminal $V_{OUT}$ are shown.

FIG. 55 illustrates temporal changes in the normalized output voltage $V_{OUT}$ in a case where the output voltage $V_n$ of any control number n (0 to 4) changes to the output voltage $V_n$ of another control number n (0 to 4) in the transmitter 411 of comparative technology 2 with the number of states of 5 with a horizontal axis representing time and a vertical axis representing the normalized output voltage $V_{OUT}$.

As illustrated in FIGS. 54 and 55, in a case where the number of states N of the transmitter 411 is set to 5, which is a value different from a power of 2, combinations of the values of the control signals input to the transmitter 411 are limited in the configuration in which the number of states N is a power of 2 such that the number of states N of the output voltage $V_n$ becomes 5.

According to FIGS. 54 and 55, the control signals cont(0) to cont(2) input to the transmitter 411 are limited to combinations of the control signals cont(0) to cont(2) of the five consecutive signal numbers 0 to 4 among the signal numbers X of 0 to 7. As a result, the transmitter 411 outputs the normalized output voltages $V_0$ to $V_4$ with the five state numbers of 0 to 4 among the normalized output voltages $V_n$ with the state numbers n of 0 to 7. A reason why the signal number X is limited to the combinations of the control signals cont(0) to cont(2) of 0 to 4 like this is to cause the five levels of the normalized output voltage $V_n$ output as the output voltage $V_{OUT}$ to be at equal intervals, and to cause the output voltages $V_n$ of the five consecutive state numbers n to be output. In a case where the output voltage $V_0$ with the state number n of 0 is output, therefore, the output voltages $V_n$ with the state numbers n of 5 to 7 are not used. The output voltage $V_{OUT}$ output from the transmitter 411, therefore, is limited to a range of 4/7 between the low voltage $V_L$ and the high voltage $V_H$, and is accompanied by a voltage loss of approximately 42%.

On the other hand, in the second example of the configuration of the transmitter 11-3 described with reference to FIGS. 51 to 53, for example, in a case where the number of states N is set to 5, the output voltages $V_0$ to $V_4$ of the state numbers 0 to 4 that change in the entire range between the low voltage $V_L$ and the high voltage $V_H$ are output, so that the voltage range between the low voltage $V_L$ and the high voltage $V_H$ can be effectively used to the maximum.

Note that, in the first example and the second example of the configuration of the transmitter 11-3 described above, the unit driver D and the unit resistor $L \cdot R_{term}$ in the unit U are set as one combination circuit, and the state numbers of the plurality of combination circuits are configured to be changed by the multiplexers MUX in accordance with the number of states N. On the other hand, regardless of the number of states N, the number of drivers of each state number may be fixed to 1, the driver to which the plurality of unit resistors $L \cdot R_{term}$ is connected may be changed by a multiplexer or the like in accordance with the number of states N, and the state number of each unit resistor $L \cdot R_{term}$ may be changed (the resistance value of the output resistor of each control number may be changed).

<First Example of Transmitter 11-3>

FIG. 56 is a configuration diagram illustrating a first example of the transmitter 11-3 in FIG. 32. In FIG. 56, the transmitter 11-3 includes L units U. Each unit U is configured such that the multiplexer MUX, the unit driver D, and the output resistors $L{\cdot}R_{term2}$ illustrated in FIG. 32 are mounted on one IC chip or one substrate. Note that, in FIG. 56, the unit driver D in each unit U has a circuit configuration of a complementary MOS (CMOS) including a combination of a p-type MOSFET and an n-type MOSFET, but the circuit configuration of the driver D is an example and is not limited to this. The output resistor $L{\cdot}R_{term}$ in each unit U is not limited to a specific value. In FIG. 56, the multiplexer MUX has a circuit configuration including a plurality of transmission gates, each of which includes a combination of a p-type MOSFET and an n-type MOSFET, but the circuit configuration of the multiplexer MUX is an example and is not limited to this. The L units U are connected in parallel with one another. Connecting the units U in parallel with one another means that terminals of the same type (excluding some types) of the plurality of units U are connected to the same line. Each unit U includes input terminals to which control signals to the multiplexer MUX is input, a selection terminal to which a selection signal to the multiplexer MUX is input, an output terminal that outputs an output voltage from an output side of the output resistor $L{\cdot}R_{term2}$ (a side opposite a contact with the unit driver D), a high voltage terminal to which the high voltage $V_H$ is applied, and a low voltage terminal to which the low voltage $V_L$ is applied. Note that FIG. 56 illustrates a case where three control signals cont(0) to cont(2) are input to the input terminals of each unit U, but the number of control signals (control value M) is not limited to this.

The input terminals of the unit U are connected to output terminals (supply lines through which the control signals are transmitted) of a high speed control logic (logic circuit) 101 that outputs the control signals cont(0) to cont(2). Here, the configuration of the multiplexers MUX of the units L0 to L5 and the input terminals to which the control signals cont(0) to cont(2) are input need not be the same. In this case, wiring between the input terminals of each unit U to which the control signals are input and input terminals of the multiplexer MUX may be different depending on the unit U. The selection terminals of the units U are connected to an output terminal of a DC control logic (logic circuit) 102 that outputs the selection signals to the multiplexers MUX. Since the selection signal is different for each or some of the units U, the DC control logic 102 includes output terminals that output selection signals of a plurality of types, and the selection terminal(s) is connected to a different output terminal of the DC control logic 102 for each or some of the units U. The output terminal of the unit U is connected to an output terminal $V_{OUT}$ as the transmitter 11-3. The high voltage terminals of the units U are connected to a terminal that outputs the high voltage $V_H$ generated by the constant voltage generation circuit 103. The low voltage terminals of the units U are connected to the GND terminal.

<Second Example of Transmitter 11-3>

FIG. 57 is a configuration diagram illustrating a second example of the transmitter 11-3 in FIG. 32. Note that, in the figure, parts common to those in FIG. 56 are given the same reference numerals, and description thereof is omitted. The second example in FIG. 57 is different from the first example in FIG. 56 in that a constant voltage generation circuit 104 (described as a constant voltage generation circuit 2 in the figure) is included. Note that the constant voltage generation circuit 103 that generates and outputs the high voltage terminal is illustrated as a constant voltage generation circuit 1. The low voltage terminal of each unit U is connected to a terminal that outputs the low voltage $V_L$ generated by the constant voltage generation circuit 104. According to the second example of FIG. 57, as in FIG. 56, the low voltage $V_L$ generated by the constant voltage generation circuit 104 is applied to the unit driver D of each unit U as the low voltage $V_L$ instead of the GND potential (0 V).

<Third Example of Transmitter 11-1>

FIG. 58 is a configuration diagram illustrating a third example of the transmitter 11-3 in FIG. 32. Note that, in the figure, parts common to those in FIG. 56 are given the same reference numerals, and description thereof is omitted. The third example in FIG. 58 is different from the first example in FIG. 56 in that the constant voltage generation circuit 103 is not provided. A high voltage terminal of each unit U is connected to a power supply terminal. A high voltage $V_H$ from an external voltage source is supplied to the power supply terminal.

According to the third example in FIG. 58, it is possible to supply the high voltage $V_H$ from any external power supply without requiring the constant voltage generation circuit 103 that accompanies each unit U and that generates the high voltage $V_H$ as illustrated in FIG. 56.

<Example of Circuit Configuration of Multiplexer MUX of Each Unit U>

Figure 59:
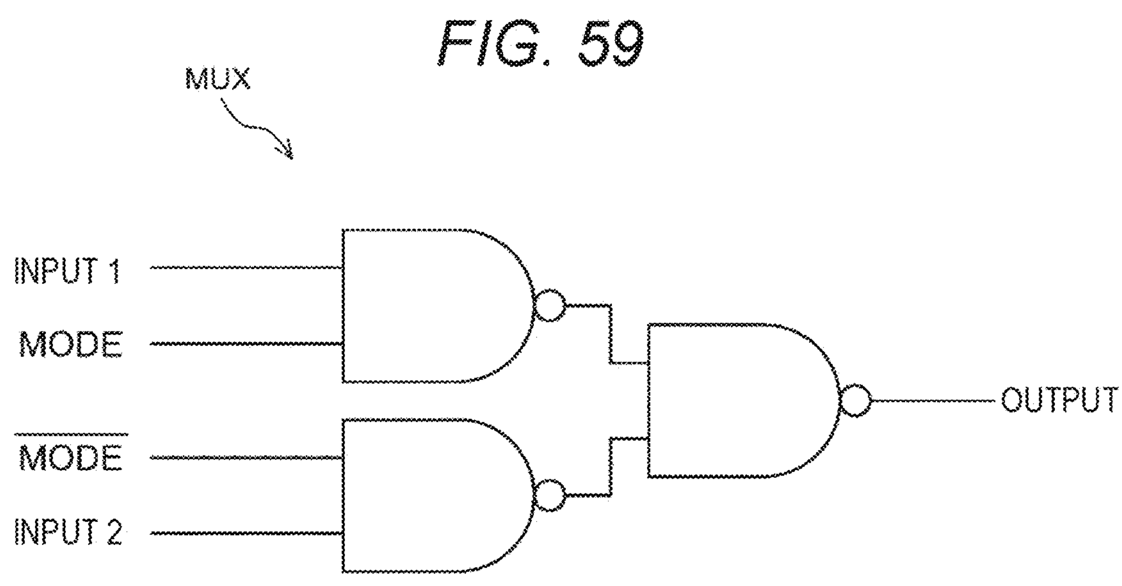
FIG. 59 is a diagram illustrating an example of circuit configuration of a multiplexer MUX.
Figure 60:
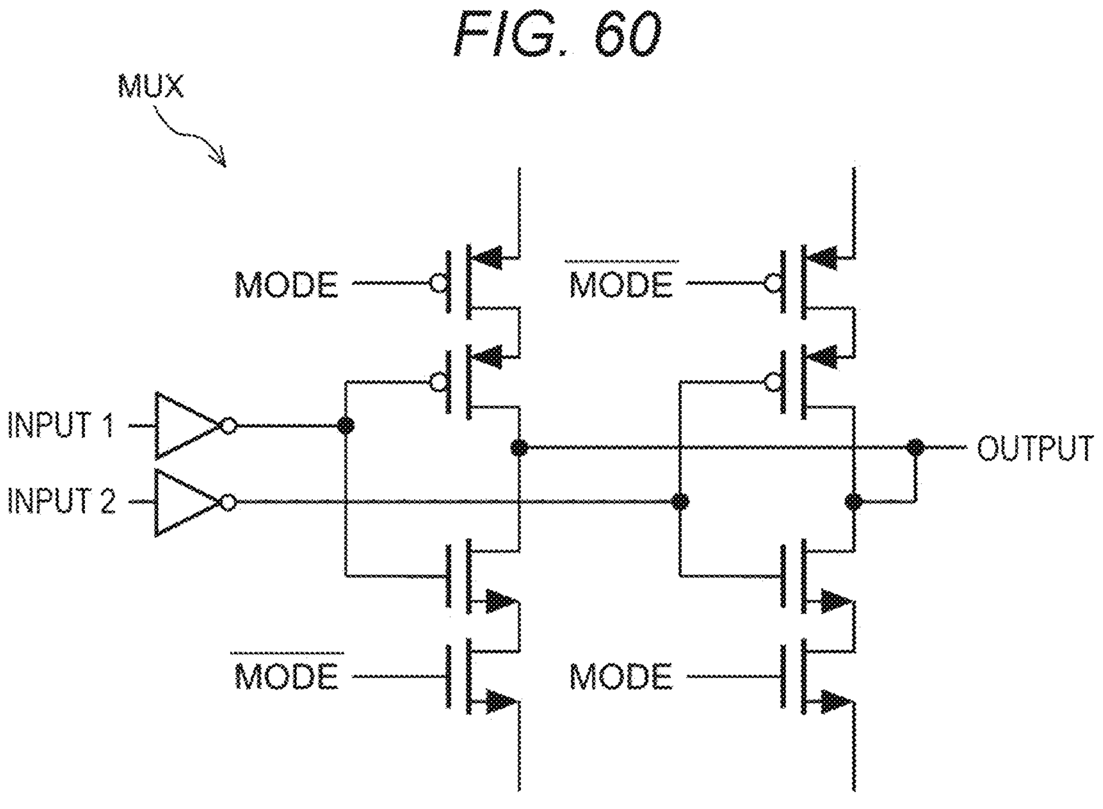
FIG. 60 is a diagram illustrating another example of the circuit configuration of the multiplexer MUX.

The circuit configuration of the multiplexer MUX of each unit U in the transmitter 11-3, which is the third mode of the transmitter 11, illustrated in FIG. 32 and the like is not limited to the configuration including transmission gates illustrated in FIG. 56 and the like. For example, the multiplexer MUX may have a NAND configuration as illustrated in FIG. 59 or may have a configuration of an inverter with a switch as illustrated in FIG. 60.

<Example of Application of Transmitter 11 to Which Present Technology Is Applied>

Figure 61:
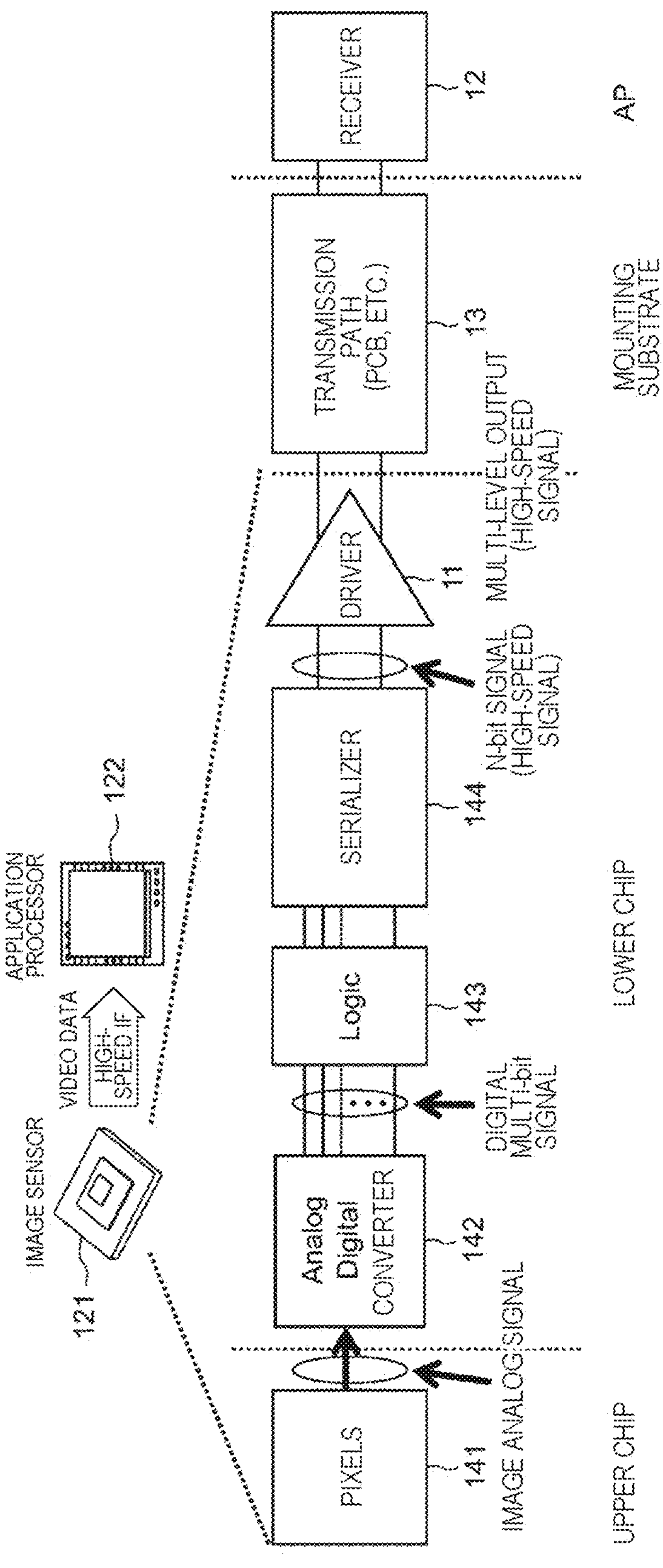
FIG. 61 is a diagram illustrating a first example of application of a transmitter to which the present technology is applied.

FIG. 61 is a diagram illustrating an example of application of the transmitter 11 to which the present technology is applied. FIG. 61 illustrates an internal configuration of an apparatus having a camera function, such as a smartphone, and the apparatus in FIG. 61 includes an image sensor 121 and an application processor 122. An image (video data) obtained by the image sensor 121 is transmitted at a high speed to the application processor 122 via a high-speed interface and used for processing in the application processor 122. The image sensor 121 is configured by stacking an upper chip and a lower chip, for example, and an image sensor unit 141 in which pixels including light receiving elements that perform photoelectric conversion are two-dimensionally arranged is formed on the upper chip. An image analog signal obtained by the image sensor unit 141 is transmitted to an analog digital (AD) converter 142 formed on the lower chip and converted into a digital signal of multiple bits (digital multi-bit signal). The digital multi-bit signal is transmitted from the AD converter 142 to a logic circuit 143 of the lower chip and subjected to predetermined processing, and then transmitted to a serializer 144 of the lower chip. In the serializer 144, the digital multi-bit signal is converted from a parallel signal into a serial signal and transmitted at high speed to the transmitter (driver) 11 of the lower chip to which the present technology is applied. Note that the transmitter 11 may be mounted on a substrate (a mounting substrate such as a PCB) on which the image sensor 121 is mounted, instead of being formed on the lower chip of the image sensor 121. The transmitter 11 generates a multi-level signal on the basis of the serial signal from the serializer 144 and transmits the multi-level signal to a receiver 12 of the application processor 12 on the mounting substrate via a transmission path 13 on the mounting substrate.

<Examples of Combinations of Configurations>

Note that the present technology can also have the following configurations.

(1)

A data processing device including:

a plurality of drivers that each includes a driver input terminal to which a control signal is input and a driver output terminal which outputs a voltage corresponding to the control signal input from the driver input terminal and that each outputs a high voltage or a low voltage in correspondence with the control signal in a case where the corresponding driver output terminal is in an open state, the plurality of drivers being first to M-th drivers, in which an integer larger than or equal to 3 and different from a power of 2 is a number of states N, a power of a smallest integer that is a power of 2 larger than or equal to N is a control value M, and the driver output terminals are connected in parallel to a transmission line through which a multi-level signal representing transmission data with voltage levels as many as the number of states N is transmitted as a signal to be transmitted, in which the first to M-th drivers include first to M-th output resistors, respectively, and in a case where any integer larger than or equal to 1 and smaller than or equal to M is denoted by m, a resistance value of an m-th output resistor in which m is smaller than or equal to M−1 is a value obtained by dividing a predetermined resistance value by 2 raised to a power of (m−1), and a resistance value of an M-th output resistor in which m is M is a value obtained by dividing the predetermined resistance value by a value obtained by subtracting 2 raised to a power of (M−1) from N.

(2)

The data processing device according to (1), further including:

a selection circuit that selects, from among a plurality of the control signals, a control signal to be input to the driver input terminal of each of the first to M-th drivers, in which the selection circuit changes a number of voltage levels of the multi-level signal to a value different from the number of states N by changing the control signal input to each of the first to M-th drivers.

(3)

The data processing device according to (1) or (2), in which the first to M-th drivers are unit drivers each including a unit resistor of a predetermined resistance value as an output resistor and are configured by connecting one or a plurality of unit drivers in parallel with one another, the m-th driver in which m is smaller than or equal to M−1 is configured by connecting the unit drivers as many as an m-th constituent value in parallel with one another, the m-th constituent value being a value obtained by multiplying 2 raised to a power of (m−1) by a natural number a, and the M-th driver in which m is M is configured by connecting the unit drivers as many as an M-th constituent value in parallel with one another, the M-th constituent value being a value obtained by multiplying a value obtained by subtracting 2 raised to a power of (M−1) from N by the natural number a.

(4)

The data processing device according to (3), in which assuming that the control signal input to the m-th driver is an m-th control signal, the m-th driver is configured by connecting the unit drivers as many as the m-th constituent value in parallel with one another between an m-th supply line through which the m-th control signal is supplied and the transmission line.

(5)

The data processing device according to (3) or (4), further including:

a selection circuit that selects the unit driver constituting each of the first to M-th drivers among a plurality of the unit drivers, wherein the selection circuit changes the number of voltage levels of the multi-level signal to a value different from the number of states N by changing the first to M-th constituent values of the unit drivers constituting the first to M-th drivers, respectively.

(6)

The data processing device according to (5), in which the selection circuit changes the number of voltage levels of the multi-level signal to the number of states as many as a value obtained by adding 1 to any divisor of N−1.

(7)

The data processing device according to (5), in which a value obtained by adding 1 to any divisor of N−1 is set as a number of states N1 and a power of a smallest integer that is a power of 2 larger than or equal to N1 is set as a control value M1, in a case where any integer larger than or equal to 1 and smaller than or equal to M1 is denoted by m1, a value obtained by multiplying 2 raised by a power of (m1−1) by (N−1)/(N1−1) is set as an m1-th constituent value for m1 smaller than or equal to M1−1, and a value obtained by multiplying a value obtained by subtracting 2 raised by a power of (M1−1) from N1 by (N−1)/(N1−1) is set as an M1 constituent value for m1 being M1, M1 supply lines among the first to M-th supply lines are set as first to M1-th supply lines, and the selection circuit changes the number of voltage levels of the multi-level signal from the number of states N to the number of states N1 by switching the unit drivers as many as the m1-th constituent value to be connected to an m1-th supply line.

(8)

The data processing device according to (7), in which in a case where a smaller one of a constituent value L(m) and a constituent value L1(m) in a same rank m (m is an integer larger than or equal to 1 and smaller than or equal to M) between constituent values L(1) to L(M) in which the first to M-th constituent values in a case where the number of voltage levels of the multi-level signal is set to the number of states N are arranged in descending order and constituent values L1(1) to L1(M) in which the first to M1-th constituent values in a case where the number of voltage levels of the multi-level signal is set to the number of states N1 are arranged in descending order and the M1-th and subsequent constituent values in a case where a control value M1 is smaller than a control value M are set to 0 is set as a constituent value Lmin(m), the selection circuit connects the unit drivers determined in advance as many as the constituent value Lmin(m) larger than or equal to 2 to a same supply line at all times regardless of whether the number of states N or the number of states N1 is set.

(9)

The data processing device according to (8), in which the selection circuit is provided for each of the unit drivers and includes input terminals to which the first to M-th control signals are input, respectively, a control signal output terminal connected to the driver input terminal of the unit driver, and a selection terminal to which a selection signal for selecting a control signal to be output from the control signal output terminal from among the first to M-th control signals input from the input terminals is input, and a same selection signal is input to the selection terminals of the selection circuits for the unit drivers determined in advance as many as the constituent value Lmin(m) larger than or equal to 2.

(10)

The data processing device according to any one of (3) to (9), in which each of the unit drivers is mounted on one IC chip or one substrate as one unit.

(11)

The data processing device according to any one of (5) to (10), in which each of the unit drivers and the selection circuit for the unit driver are mounted on one IC chip or one substrate as one unit.

(12)

The data processing device according to any one of (3) to (11), in which the predetermined resistance value of the unit resistor of the unit driver is N−1 times a resistance value in a case where all of the first to M-th output resistors are connected in parallel with one another.

(13)

A data processing device including:

a plurality of drivers that each includes a driver input terminal to which a control signal is input and a driver output terminal which outputs a voltage corresponding to the control signal input from the driver input terminal and that each outputs a high voltage or a low voltage in correspondence with the control signal in a case where the corresponding driver output terminal is in an open state, the plurality of drivers being first to M-th drivers, in which an integer larger than or equal to 3 is a number of states N, a power of a smallest integer that is a power of 2 larger than or equal to N is a control value M, and the driver output terminals are connected in parallel to a transmission line through which a multi-level signal representing transmission data with voltage levels as many as the number of states N is transmitted as a signal to be transmitted; and a selection circuit that selects, from among a plurality of the control signals, a control signal to be input to the driver input terminal of each of the first to M-th drivers, in which the selection circuit changes a number of voltage levels of the multi-level signal to a value different from the number of states N by changing the control signal input to each of the first to M-th drivers.

(14)

A data processing method used by a data processing device including:

a plurality of drivers that each includes a driver input terminal to which a control signal is input and a driver output terminal which outputs a voltage corresponding to the control signal input from the driver input terminal and that each outputs a high voltage or a low voltage in correspondence with the control signal in a case where the corresponding driver output terminal is in an open state, the plurality of drivers being first to M-th drivers, in which an integer larger than or equal to 3 is a number of states N, a power of a smallest integer that is a power of 2 larger than or equal to N is a control value M, and the driver output terminals are connected in parallel to a transmission line through which a multi-level signal representing transmission data with voltage levels as many as the number of states N is transmitted as a signal to be transmitted; and a selection circuit that selects, from among a plurality of the control signals, a control signal to be input to the driver input terminal of each of the first to M-th drivers, the data processing method including:

changing, using the selection circuit, a number of voltage levels of the multi-level signal to a value different from the number of states N by changing the control signal input to each of the first to M-th drivers.

(15)

The data processing method according to (14), in which the first to M-th drivers include first to M-th output resistors, respectively, and in a case where any integer larger than or equal to 1 and smaller than or equal to M is denoted by m, a resistance value of an m-th output resistor in which m is smaller than or equal to M−1 is a value obtained by dividing a predetermined resistance value by 2 raised to a power of (m−1), and a resistance value of an M-th output resistor in which m is M is a value obtained by dividing the predetermined resistance value by a value obtained by subtracting 2 raised to a power of (M−1) from N.

REFERENCE SIGNS LIST

1 Data transmission system
11, 11-1, 11-2, 11-3 Transmitter
12 Receiver
13 Transmission path
41 Unit
D Unit driver
$D_0$ to $D_{M-1}$ Driver
M Control value
MUX Multiplexer
N Number of states
$R_0$ to $R_{M-1}$, $R_m$ Output resistor

The invention claimed is:

1. A data processing device comprising:

a plurality of drivers that each includes a driver input terminal to which a control signal is input and a driver output terminal which outputs a voltage corresponding to the control signal input from the driver input terminal and that each outputs a high voltage or a low voltage in correspondence with the control signal in a case where the corresponding driver output terminal is in an open state, wherein the plurality of drivers being first to M-th drivers, in which an integer larger than or equal to 3 and different from a power of 2 is a number of states N, a power of a smallest integer that is a power of 2 larger than or equal to N is a control value M, driver output terminals are connected in parallel to a transmission line through which a multi-level signal representing transmission data with voltage levels as many as the number of states N is transmitted as a signal to be transmitted, the first to M-th drivers include first to M-th output resistors, respectively, and in a case where any integer larger than or equal to 1 and smaller than or equal to M is denoted by m, a resistance value of an m-th output resistor in which m is smaller than or equal to M−1 is a value obtained by dividing a predetermined resistance value by 2 raised to a power of (m−1), and a resistance value of an M-th output resistor of the first to M-th output resistors in which m is M is a value obtained by dividing the predetermined resistance value by a value obtained by subtracting 2 raised to a power of (M−1) from N.

2. The data processing device according to claim 1, further comprising:

a selection circuit that selects, from among a plurality of control signals, the control signal to be input to the driver input terminal of each of the first to M-th drivers, wherein the selection circuit changes a number of voltage levels of the multi-level signal to a value different from the number of states N by changing the control signal input to each of the first to M-th drivers.

3. The data processing device according to claim 1, wherein the first to M-th drivers are unit drivers each including a unit resistor of predetermined resistance value as an output resistor and are configured by connecting one or a plurality of unit drivers in parallel with one another, a m-th driver in which m is smaller than or equal to M−1 is configured by connecting the unit drivers as many as an m-th constituent value in parallel with one another, the m-th constituent value being a value obtained by multiplying 2 raised to a power of (m−1) by a natural number a, the M-th driver in which m is M is configured by connecting the unit drivers as many as an M-th constituent value in parallel with one another, and the M-th constituent value being a value obtained by multiplying a value obtained by subtracting 2 raised to a power of (M−1) from N by the natural number a.

4. The data processing device according to claim 3, wherein assuming that the control signal input to the m-th driver is an m-th control signal, the m-th driver is configured by connecting the unit drivers as many as the m-th constituent value in parallel with one another between an m-th supply line through which the m-th control signal is supplied and the transmission line.

5. The data processing device according to claim 3, further comprising:

a selection circuit that selects a unit driver of the unit drivers constituting each of the first to M-th drivers among a plurality of the unit drivers, wherein the selection circuit changes the number of voltage levels of the multi-level signal to a value different from the number of states N by changing first to M-th constituent values of the unit drivers constituting the first to M-th drivers, respectively.

6. The data processing device according to claim 5, wherein the selection circuit changes the number of voltage levels of the multi-level signal to the number of states as many as a value obtained by adding 1 to any divisor of N−1.

7. The data processing device according to claim 5, wherein a value obtained by adding 1 to any divisor of N−1 is set as a number of states N1 and a power of a smallest integer that is a power of 2 larger than or equal to N1 is set as a control value M1, in a case where any integer larger than or equal to 1 and smaller than or equal to M1 is denoted by m1, a value obtained by multiplying 2 raised by a power of (m1−1) by (N−1)/(N1−1) is set as an m1-th constituent value for m1 smaller than or equal to M1−1, and a value obtained by multiplying a value obtained by subtracting 2 raised by a power of (M1−1) from N1 by (N−1)/(N1−1) is set as an M1 constituent value for m1 being M1, M1 supply lines among the first to M-th supply lines are set a first to M1-th supply lines, and the selection circuit changes the number of voltage levels of the multi-level signal from the number of states N to the number of states N1 by switching the unit drivers as many as the m1-th constituent value to be connected to an m1-th supply line.

8. The data processing device according to claim 7, wherein in a case where a smaller one of a constituent value L(m) and a constituent value L1(m) in a same rank m (m is an integer larger than or equal to 1 and smaller than or equal to M) between constituent values L(1) to L(M) in which the first to M-th constituent values in a case where the number of voltage levels of the multi-level signal is set to the number of states N are arranged in descending order and constituent values L1(1) to L1(M) in which the first to M1-th constituent values in a case where the number of voltage levels of the multi-level signal is set to the number of states N1 are arranged in descending order and a M1-th constituent value and subsequent constituent values in a case where the control value M1 is smaller than a control value M are set to 0 is set as a constituent value Lmin(m), the selection circuit connects the unit drivers determined in advance as many as the constituent value Lmin(m) larger than or equal to 2 to a same supply line at all times regardless of whether the number of states N or the number of states N1 is set.

9. The data processing device according to claim 8, wherein the selection circuit is provided for each of the unit drivers and includes input terminals to which first to M-th control signals are input, respectively, a control signal output terminal connected to the driver input terminal of the unit driver, and a selection terminal to which a selection signal for selecting the control signal to be output from the control signal output terminal from among first to M-th control signals input from the input terminals is input, and a same selection signal is input to selection terminals of selection circuits for the unit drivers determined in advance as many as the constituent value Lmin(m) larger than or equal to 2.

10. The data processing device according to claim 3, wherein each of the unit drivers is mounted on one IC chip or one substrate as one unit.

11. The data processing device according to claim 5, wherein each of the unit drivers and the selection circuit for the unit driver are mounted on one IC chip or one substrate as one unit.

12. The data processing device according to claim 3, wherein the predetermined resistance value of the unit resistor of a unit driver of the unit drivers is N−1 times a resistance value in a case where all of the first to M-th output resistors are connected in parallel with one another.

13. A data processing device comprising:

a plurality of drivers that each includes a driver input terminal to which a control signal is input and a driver output terminal which outputs a voltage corresponding to the control signal input from the driver input terminal and that each outputs a high voltage or a low voltage in correspondence with the control signal in a case where the corresponding driver output terminal is in an open state, the plurality of drivers being first to M-th drivers, in which an integer larger than or equal to 3 is a number of states N, a power of a smallest integer that is a power of 2 larger than or equal to N is a control value M, and driver output terminals are connected in parallel to a transmission line through which a multi-level signal representing transmission data with voltage levels as many as the number of states N is transmitted as a signal to be transmitted; and a selection circuit that selects, from among a plurality of control signals, a control signal to be input to the driver input terminal of each of the first to M-th drivers, wherein the selection circuit changes a number of voltage levels of the multi-level signal to a value different from the number of states N by changing the control signal input to each of the first to M-th drivers.

14. A data processing method used by a data processing device including:

a plurality of drivers that each includes a driver input terminal to which a control signal is input and a driver output terminal which outputs a voltage corresponding to the control signal input from the driver input terminal and that each outputs a high voltage or a low voltage in correspondence with the control signal in a case where the corresponding driver output terminal is in an open state, the plurality of drivers being first to M-th drivers, in which an integer larger than or equal to 3 is a number of states N, a power of a smallest integer that is a power of 2 larger than or equal to N is a control value M, and the driver output terminals are connected in parallel to a transmission line through which a multi-level signal representing transmission data with voltage levels as many as the number of states N is transmitted as a signal to be transmitted; and a selection circuit that selects, from among a plurality of control signals, a control signal to be input to the driver input terminal of each of the first to M-th drivers, the data processing method comprising:

changing, using the selection circuit, a number of voltage levels of the multi-level signal to a value different from the number of states N by changing the control signal input to each of the first to M-th drivers.

15. The data processing method according to claim 14, wherein the first to M-th drivers include first to M-th output resistors, respectively, and in a case where any integer larger than or equal to 1 and smaller than or equal to M is denoted by m, a resistance value of an m-th output resistor in which m is smaller than or equal to M−1 is a value obtained by dividing a predetermined resistance value by 2 raised to a power of (m−1), and a resistance value of an M-th output resistor in which m is M is a value obtained by dividing the predetermined resistance value by a value obtained by subtracting 2 raised to a power of (M−1) from N.

* * * * *